(12) United States Patent
Yoneda et al.

(10) Patent No.: US 9,231,159 B2
(45) Date of Patent: Jan. 5, 2016

(54) METHOD OF MANUFACTURING NITRIDE SEMICONDUCTOR LIGHT EMITTING ELEMENT HAVING THICK METAL BUMP

(75) Inventors: Akinori Yoneda, Anan (JP); Hirofumi Kawaguchi, Tokushima (JP); Kouichiroh Deguchi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 305 days.

(21) Appl. No.: 13/457,307

(22) Filed: Apr. 26, 2012

(65) Prior Publication Data

US 2012/0273823 A1    Nov. 1, 2012

(30) Foreign Application Priority Data

Apr. 27, 2011  (JP) ................................. 2011-098851
May 17, 2011  (JP) ................................. 2011-110838

(51) Int. Cl.
*H01L 33/00* (2010.01)
*H01L 33/38* (2010.01)
*H01L 33/44* (2010.01)
*H01L 33/40* (2010.01)

(52) U.S. Cl.
CPC .............. *H01L 33/38* (2013.01); *H01L 33/405* (2013.01); *H01L 33/382* (2013.01); *H01L 33/44* (2013.01); *H01L 2933/0016* (2013.01)

(58) Field of Classification Search
CPC ...... H01L 33/0075; H01L 33/38; H01L 33/44
USPC ........................................ 438/46, 38; 257/99
See application file for complete search history.

(56) References Cited

U.S. PATENT DOCUMENTS

| 3,952,404 | A   | * | 4/1976  | Matunami ..................... 438/461 |
| 7,858,418 | B2  |   | 12/2010 | Watanabe et al. |
| 8,217,407 | B2  |   | 7/2012  | Watanabe et al. |
| 2003/0207480 | A1 | * | 11/2003 | Kobayashi et al. ............. 438/22 |
| 2004/0028096 | A1 |   | 2/2004  | Senda et al. |

(Continued)

FOREIGN PATENT DOCUMENTS

| CN | 1784790 A   | 6/2006 |
| CN | 101789478 A | 7/2010 |

(Continued)

OTHER PUBLICATIONS

European Search Report dated Oct. 28, 2015 issued in EP12165914.

*Primary Examiner* — Kevin Parendo
(74) *Attorney, Agent, or Firm* — Foley & Lardner LLP

(57) ABSTRACT

A method of manufacturing a flip-chip nitride semiconductor light emitting element includes steps of providing a nitride semiconductor light emitting element structure; forming an insulating protective layer on the nitride semiconductor light emitting element structure; forming a resist pattern having openings above an n-side electrode connecting surface and a p-side electrode connecting surface; etching the protective layer to expose the n-side electrode connecting surface and the p-side electrode connecting surface using the resist pattern as a mask; forming a first metal layer that becomes an n-side electrode and a p-side electrode, the first metal layer being formed as a continuous layer disposed on the n-side electrode connecting surface, the p-side electrode connecting surface and the resist pattern; forming a second metal layer that becomes metal bumps by electrolytic plating using the first metal layer as an electrode for the electrolytic plating; and removing the resist pattern.

27 Claims, 28 Drawing Sheets

(56) References Cited

U.S. PATENT DOCUMENTS

| | | |
|---|---|---|
| 2006/0273324 A1 | 12/2006 | Asai et al. |
| 2007/0147473 A1* | 6/2007 | Wolkin et al. ............... 374/208 |
| 2008/0105981 A1 | 5/2008 | Kaneko |
| 2008/0128721 A1* | 6/2008 | Watanabe et al. ............ 257/96 |
| 2010/0046566 A1* | 2/2010 | Kudo ....................... 372/45.01 |
| 2011/0068363 A1 | 3/2011 | Watanabe et al. |
| 2013/0065331 A1 | 3/2013 | Koyama et al. |

FOREIGN PATENT DOCUMENTS

| | | |
|---|---|---|
| JP | 04-167569 | 6/1992 |
| JP | 05-007019 | 1/1993 |
| JP | 3068914 | 3/2000 |
| JP | 2000-174345 | 6/2000 |
| JP | 2000-307184 | 11/2000 |
| JP | 2000-315819 | 11/2000 |
| JP | 2004-153110 | 5/2004 |
| JP | 2005-079551 | 3/2005 |
| JP | 2005-079551 A | 3/2005 |
| JP | 2007-324586 A | 12/2007 |
| JP | 2008-103499 | 5/2008 |
| JP | 2012-015187 A | 1/2012 |
| JP | 2012-049296 A | 3/2012 |

* cited by examiner

Fig.1A
Fig.1B
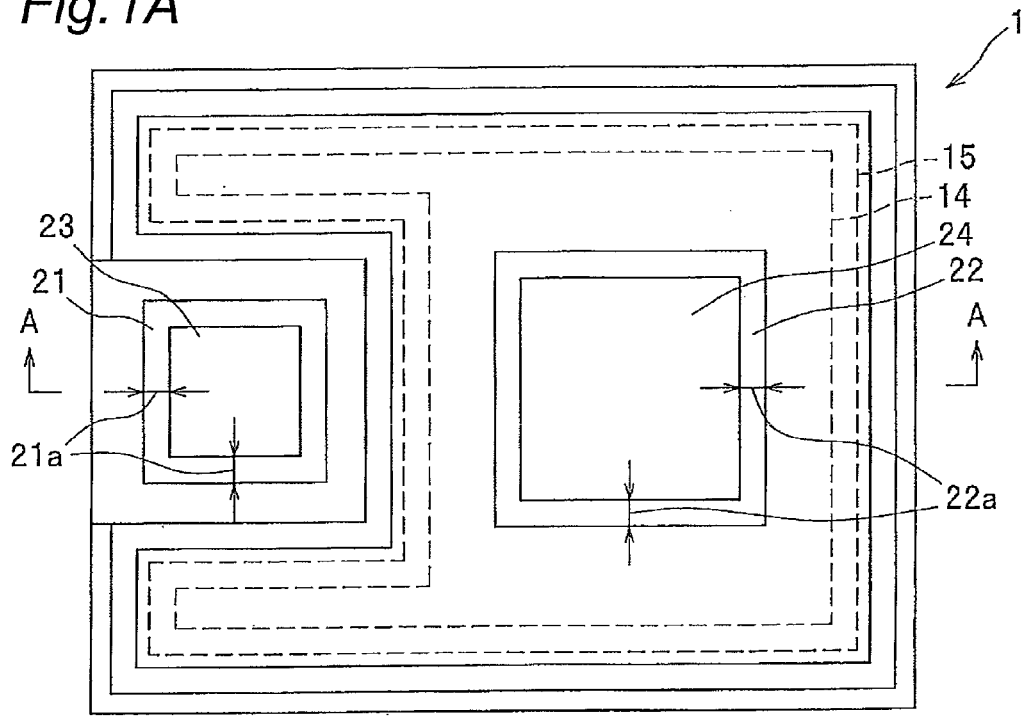
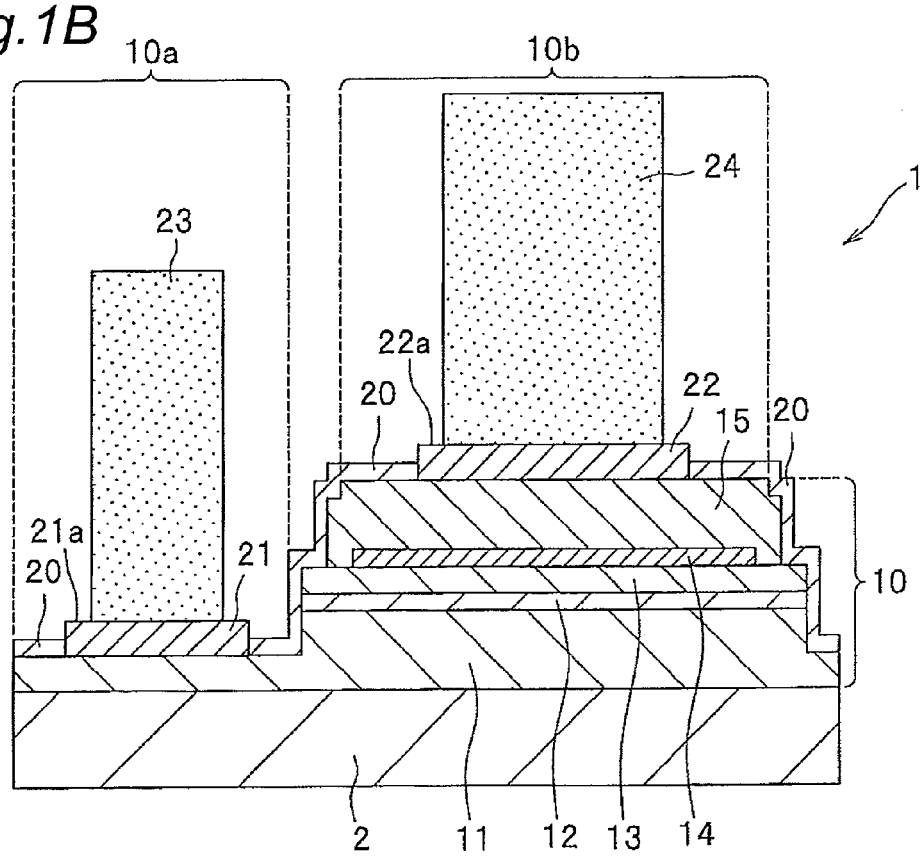

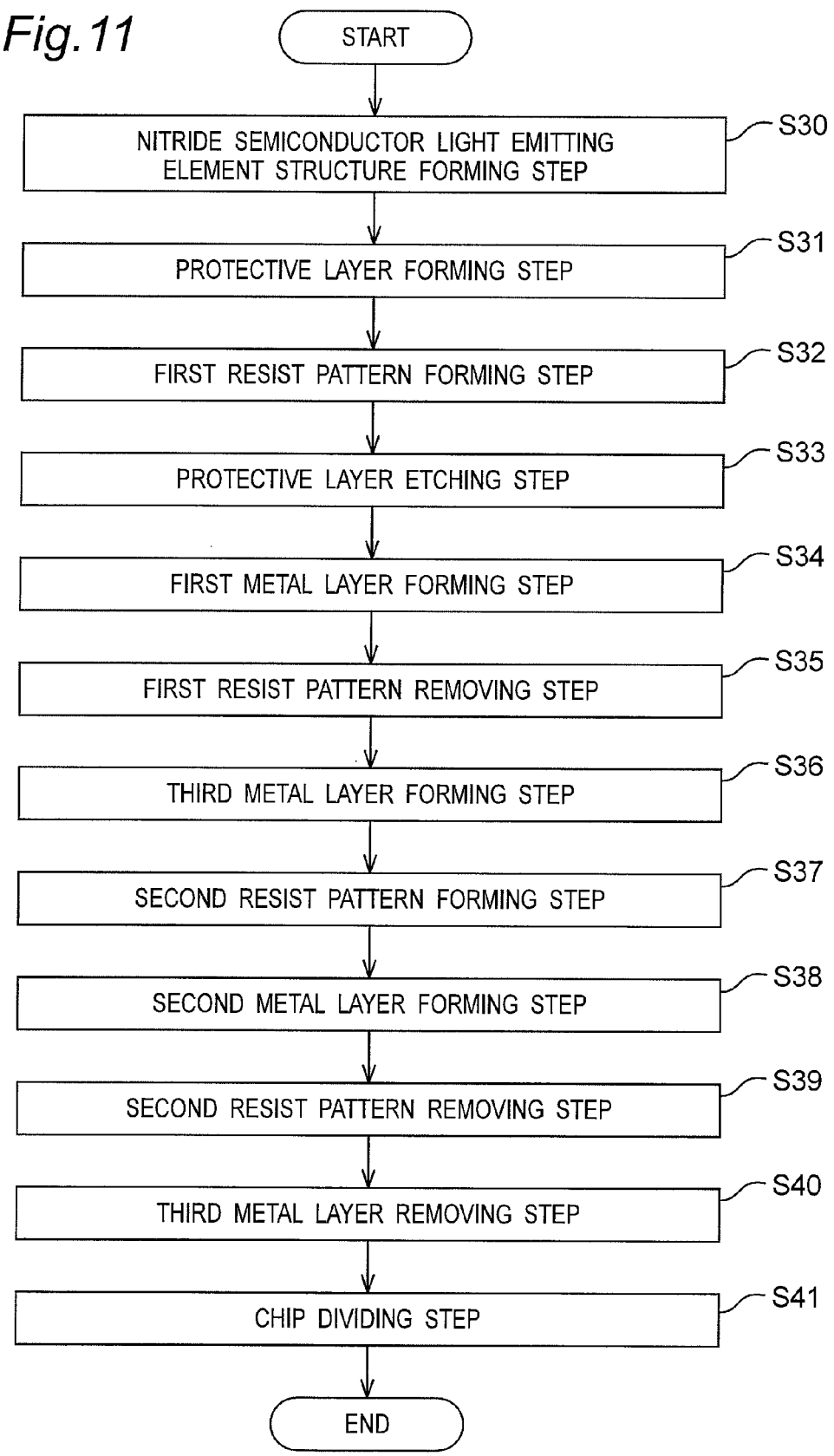

METHOD OF MANUFACTURING NITRIDE SEMICONDUCTOR LIGHT EMITTING ELEMENT HAVING THICK METAL BUMP

BACKGROUND OF THE INVENTION

1. Field of the Invention

The present invention relates to a nitride semiconductor light emitting element mounted on a mounting substrate via a metal bump and a manufacturing technique of the nitride semiconductor light emitting element.

2. Description of the Related Art

Nitride semiconductors are generally used for light emitting elements such as light emitting diodes (LED) and laser diodes (LD), light receiving elements such as solar cells and light sensors, and electronic devices such as transistors and power devices. Especially, the light emitting diode (nitride semiconductor light emitting element) using the nitride semiconductor has been widely employed in various light sources for backlight, illumination, traffic signals, large displays and the like.

Examples of a method of mounting such nitride semiconductor light emitting element on the mounting substrate include a flip-chip mounting method in which a semiconductor layer of the light emitting element is oriented downward and a p-side electrode and an n-side electrode of the light emitting element are opposed to each other and connected to wiring electrodes on the mounting substrate.

The nitride semiconductor light emitting element used in the flip-chip mounting method includes an n-type nitride semiconductor layer and a p-type nitride semiconductor layer, each containing an active layer, that are formed on a sapphire substrate or the like, and a p-side electrode and an n-side electrode that are connected to the n-type nitride semiconductor layer and the p-type nitride semiconductor layer, respectively, and are formed on a same plane side as the substrate. The nitride semiconductor light emitting element can be mounted on the mounting substrate by orienting the p-type nitride semiconductor layer and the n-type nitride semiconductor layer downward to allow the p-side electrode and the n-side electrode to be opposed to the wiring electrodes on the mounting substrate and connecting the electrodes to the wiring electrodes through metal bumps by pressing contact.

The method disclosed in JP-A-2004-153110 discloses, as a method of forming metal bumps in the nitride semiconductor light emitting element, a method in which a resist pattern that masks a p-side electrode and an n-side electrode as pad electrodes made of a metal film, except for upper surfaces of both the electrodes, is formed and a metal bump layer is laminated by electroless plating and then the resist pattern is released.

According to another method disclosed in JP-A-2005-79551, a p-side electrode and an n-side electrode each are formed of a metal film, a metal layer is laminated on the entire surface of a light emitting element and a resist pattern having openings above both the electrodes is formed. Using the above-mentioned metal layer as a seed electrode, a metal bump layer is formed by electrolytic plating and then releasing a resist pattern and removing the metal layer except for the electrode surface on which the metal bump layer is laminated.

A method of manufacturing the nitride semiconductor light emitting element having metal bumps according to the prior art (for example, JP-A-2005-79551) will be described with reference to FIG. 15. FIG. 15 are schematic sectional views for describing a manufacturing process of the semiconductor light emitting element having the metal bumps according to the prior art. As shown in FIG. 15, the process includes the following steps of (a) forming electrodes on a GaN-based light emitting element wafer, (b) forming insulating films, (c) forming a metal layer on an entire surface, (d) resist patterning, (e) forming bumps by electroplating, (f) removing resists, (g) removing the metal layer, (h) bonding to a submount member-side wafer and (i) separating into light emitting element units.

First, a plurality of light emitting element units 121 each including an n-side electrode 103 and a p-side electrode 104 are formed on a substantial entire surface of a wafer 120 formed by growing a GaN-based compound semiconductor on a surface of a sapphire substrate (not shown) in a matrix (FIG. 15A), and insulating films 122 formed of SiO2 films are formed on portions other than portions where the bumps for the n-side electrode 103 and the p-side electrode 104 are formed (FIG. 15B).

Next, a flat metal layer 105 that is made of an Au/Ti alloy and is electrically connected to the n-side electrode 103 and the p-side electrode 104 is formed on the entire surface of the wafer 120 (FIG. 15C). The metal layer 105 is formed so as to have a thickness of 0.5 to 3 μm by vapor deposition, sputtering or the like.

By forming resists 123 on the metal layer 105 (FIG. 15D) and applying electroplating thereto, bumps 106, 107 are formed on the metal layer 105 (FIG. 15E).

By removing the resists 123 (FIG. 15F) and further removing exposed portions of the metal layer 105, there is obtained a light emitting element-side wafer in which the light emitting element units 121 each having the bump 106 in electrical connection with the n-side electrode 103 and the bump 107 in electrical connection with the p-side electrode 104 are formed in a matrix (FIG. 15G).

Patent document 1: JP-A-2004-153110
Patent document 2: JP-A-2005-79551

However, according to the method of forming the metal bumps using electroless plating as described in Patent document 1 (JP-A-2004-153110), it is difficult to stably form a thick metal bump. According to the method of forming the metal layer 105 by vapor deposition, sputtering or the like as described in Patent document 2 (JP-A-2005-79551), it was difficult to form the flat metal layer 105. In addition, in the step of removing the exposed portions of the metal layer 105, there was a possibility that the metal layer 105 cannot be sufficiently removed to case leakage between the electrodes.

SUMMARY OF THE INVENTION

The present invention has been made in light of such problems and an object of the present invention is to provide a reliable nitride semiconductor light emitting element having a thick metal bump and a method of manufacturing the nitride semiconductor light emitting element with an improved productivity.

In order to achieve the above object, a manufacturing method of a nitride semiconductor light emitting element according to the present invention is a manufacturing method of a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, the n-side electrode being connected to the n-side electrode connecting surface and the p-side electrode being connected to the p-side electrode connecting surface; and metal bumps formed on the n-side electrode and the p-side electrode, wherein a protective layer forming step, a first resist pattern forming step, a protective layer etching step, a first metal layer forming step, a second resist pattern forming step, a second metal layer forming step and a resist pattern removing step are sequentially performed.

According to such procedure, first, in the protective layer forming step, an insulating protective layer is formed on the nitride semiconductor light emitting element structure. Next, in the first resist pattern forming step, a first resist pattern having openings on the n-side electrode connecting surface and the p-side electrode connecting surface is formed. Next, in the protective layer etching step, the protective layer is etched using the first resist pattern as a mask to expose the n-side electrode connecting surface and the p-side electrode connecting surface. Next, in the first metal layer forming step, the first metal layer that becomes the n-side electrode and the p-side electrode is formed on the n-side electrode connecting surface, the p-side electrode connecting surface and the first resist pattern without removing the first resist pattern. Thus, the first metal layer is not formed directly on the protective layer except for regions where the n-side electrode and the p-side electrode are formed. Next, in the second resist pattern forming step, a second resist pattern having openings above the openings of the first resist pattern is formed. Thus, exposed surfaces where a second metal layer is not formed are formed in outer edges of upper surfaces of the n-side electrode and the p-side electrode. Next, in the second metal layer forming step, using the first metal layer as an electrode for electrolytic plating, the second metal layer that becomes the metal bumps is formed by electrolytic plating. Thereby, the n-side electrode and the p-side electrode are directly bonded to the second metal layer that becomes the metal bumps formed on the electrodes. Then, in the resist pattern removing step, the first resist pattern and the second resist pattern are removed. In such a manner, the nitride semiconductor light emitting element is manufactured in the small number of steps.

According to the manufacturing method of the present invention, the number of manufacturing steps can be reduced, the first metal layer that becomes the n-side electrode and the p-side electrode as the pad electrodes is not formed directly on the protective layer and the metal bumps are formed using the first metal layer as an electrode for electrolytic plating by electrolytic plating. As a result, the productivity of the nitride semiconductor light emitting element that has the thick metal bumps, is unlikely to cause leak and is highly reliable can be improved.

A manufacturing method of a nitride semiconductor light emitting element according to the present invention is a manufacturing method of a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, the n-side electrode being connected to the n-side electrode connecting surface and the p-side electrode being connected to the p-side electrode connecting surface; and metal bumps formed on the n-side electrode and the p-side electrode, wherein a protective layer forming step, a resist pattern forming step, a protective layer etching step, a first metal layer forming step, a second metal layer forming step and a resist pattern removing step are sequentially performed.

According to such procedure, first, in the protective layer forming step, an insulating protective layer is formed on the nitride semiconductor light emitting element structure. Next, in the resist pattern forming step, a resist pattern having openings is formed on the n-side electrode connecting surface and the p-side electrode connecting surface. Next, in the protective layer etching step, using the resist pattern as a mask, a protective layer is etched to expose the n-side electrode connecting surface and the p-side electrode connecting surface. Next, in the first metal layer forming step, a first metal layer that becomes the n-side electrode and the p-side electrode is formed on the n-side electrode connecting surface, the p-side electrode connecting surface and the resist pattern without removing the resist pattern. Thus, the first metal layer is not formed directly on the protective layer except for regions where the n-side electrode and the p-side electrode are formed. Next, in the second metal layer forming step, using the first metal layer as an electrode for electrolytic plating, a second metal layer that becomes the metal bumps is formed by electrolytic plating. Thereby, the n-side electrode and the p-side electrode are directly bonded to the second metal layer that becomes the metal bumps formed on the respective electrodes, and a side surface of the second metal layer that becomes the metal bumps is covered with the first metal layer. Then, in the resist pattern removing step, the resist pattern is removed. In such a manner, the nitride semiconductor light emitting element is manufactured in the small number of steps.

According to the manufacturing method of the present invention, the number of manufacturing steps can be reduced, the first metal layer that becomes the n-side electrode and the p-side electrode as the pad electrodes is not formed directly on the protective layer and the metal bumps are formed using the first metal layer as the electrode for electrolytic plating by electrolytic plating. As a result, the productivity of the nitride semiconductor light emitting element that has the thick metal bumps, is unlikely to cause leak and is highly reliable can be improved. Further, since a part or all of the side surfaces of the metal bumps are covered with the first metal layer, when metal having a high reflectance is used for the first metal layer, the nitride semiconductor light emitting element having a high light extraction efficiency can be manufactured.

A manufacturing method of a second nitride semiconductor light emitting element according to the present invention is a manufacturing method of a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, the n-side electrode being connected to the n-side electrode connecting surface and the p-side electrode being connected to the p-side electrode connecting surface; and metal bumps formed on the n-side electrode and the p-side electrode, wherein a protective layer forming step, a first resist pattern forming step, a protective layer etching step, a first metal layer forming step, a first resist pattern removing step, a third metal layer forming step, a second resist pattern forming step, a second metal layer forming step, a second resist pattern removing step and a third metal layer removing step are sequentially performed.

According to such procedure, first, in the protective layer forming step, an insulating protective layer is formed on the nitride semiconductor light emitting element structure. Next, first in the resist pattern forming step, a first resist pattern having openings is formed on the n-side electrode connecting surface and the p-side electrode connecting surface. Next, in the protective layer etching step, using the first resist pattern as a mask, a protective layer is etched to expose the n-side electrode connecting surface and the p-side electrode connecting surface. Next, in the first metal layer forming step, a first metal layer that becomes the n-side electrode and the p-side electrode is formed on the n-side electrode connecting surface, the p-side electrode connecting surface and the first resist pattern without removing the first resist pattern. Next, in the first resist pattern removing step, a first resist pattern is removed. Next, in the third metal layer forming step, a third metal layer is formed on the first metal layer and the protective layer. Thereby, the second metal layer that becomes the metal bumps can be easily formed by electrolytic plating. Next, in the second resist pattern forming step, a second resist pattern having openings on the n-side electrode connecting surface and the p-side electrode connecting surface, on which the third metal layer is formed, is formed. Next, in the second metal layer forming step, using the third metal layer as an electrode for the electrolytic plating, a second metal layer that becomes the metal bumps is formed by electrolytic plating. Thereby, the second metal layer can be formed only on the third metal layer. Next, in the second resist pattern removing step, the second resist pattern is removed. Since the second metal layer is not formed on the second resist pattern, the second resist pattern removing step can be easily performed. Next, in the third metal layer removing step, the third metal layer is removed. In such a manner, the nitride semiconductor light emitting element is manufactured in the small number of steps. Further, since the third metal layer for electrolytic plating is used, the metal bumps having a high reliability can be formed. Furthermore, since the first metal layer is formed after a part of the protective layer is removed, separation of the first metal layer from the protective layer can be reduced.

According to the manufacturing method of the present invention, the number of manufacturing steps can be reduced. Further, since the first metal layer is formed after removing a part of the protective layer, separation of the first metal layer from the protective layer can be reduced.

A nitride semiconductor light emitting element according to the present invention is a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, the n-side electrode being connected to the n-side electrode connecting surface and the p-side electrode being connected to the p-side electrode connecting surface; and metal bumps formed on the n-side electrode and the p-side electrode, the nitride semiconductor light emitting element further including an insulating protective layer that covers a surface of the nitride semiconductor light emitting element, wherein the metal bump on the n-side electrode and the metal bump on the p-side electrode have the same thickness, at least one electrode of the n-side electrode and the p-side electrode is larger than the metal bump on said one electrode in a plan view to expose a portion of an upper surface of said one electrode, and wherein the protective layer does not cover exposed upper surfaces of the n-side electrode and the p-side electrode.

With such configuration, when the nitride semiconductor light emitting element is pressed in contact with the wiring electrodes on the mounting substrate via the metal bumps of the nitride semiconductor light emitting element in bonding, the metal bumps are squeezed and horizontally extended. At this time, since at least either the n-side electrode and the p-side electrode, on which the metal bump is provided, is larger than the metal bump in a plan view, the metal bump extends on the larger n-side electrode or the p-side electrode in a plan view. Since the exposed upper surfaces of the n-side electrode and the p-side electrode, on which the metal bumps are not provided, are not covered with the protective layer, the upper surfaces of the electrodes are in electrical connect with the horizontally extended metal bumps, the bonding area between the n-side electrode and the p-side electrode, and the metal bumps increases, and the contact resistance between the n-side electrode and the p-side electrode, and the metal bumps decreases. Further, since the lower metal bump provided on the n-side electrode and the higher metal bump provided on the p-side electrode when viewed from the surface of the substrate have the same thickness, the upper surface of the metal bump on the n-side electrode is located lower that the upper surface of the metal bump on the p-side electrode. Therefore, the metal bump on the n-side electrode receives a smaller pressing force when being pressed in the wiring electrode on the mounting substrate, and is squeezed and horizontally extended less.

In the nitride semiconductor light emitting element of the present invention, in mounting to the mounting substrate via the metal bumps, the squeezed and horizontally extended metal bumps are in contact with the exposed upper surfaces of the n-side electrode and the p-side electrode as pad electrodes and therefore, highly-reliable mounting that is unlikely to cause peeling and has a low contact resistance can be achieved. Moreover, since the metal bump on the n-side electrode is less squeezed and horizontally extended less, the area of the n-side electrode in a plan view can be reduced. Therefore, the p-side semiconductor layer can be widened, thereby increasing the amount of light emitted from the nitride semiconductor light emitting element.

A nitride semiconductor light emitting element according to the present invention is a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, a first metal layer that constitute an n-side electrode connected on the n-side electrode connecting surface and a p-side electrode connected on the p-side electrode connecting surface, second metal layers provided on the first metal layer in contact with the first metal layer to constitute metal bumps on the n-side electrode and the p-side electrode, and an insulating protective layer that covers an upper surface and a side surface except for a region where the first metal layer of the nitride semiconductor light emitting element structure, wherein at least a part or all of the side surface of the second metal layer is covered with the first metal layer.

With such configuration, in the nitride semiconductor light emitting element, the side surface of the first metal layer that covers a part or all of the side surface of the second metal layer that becomes the metal bumps reflect light leaking from the nitride semiconductor light emitting element structure and returns the light to the nitride semiconductor light emitting element structure.

In the nitride semiconductor light emitting element of the present invention, by selection of the first metal layer, the nitride semiconductor light emitting element having a high light extraction efficiency can be achieved.

A nitride semiconductor light emitting element according to the present invention is configured so that the reflectance of the surface of the first metal layer that covers the side surface of the second metal layer with respect to wavelength of light emitted from the nitride semiconductor light emitting element is higher than that of the side surface of the second metal layer.

With such configuration, in the nitride semiconductor light emitting element, the side surface of the first metal layer that covers a part or all of the side surface of the second metal layer that becomes the metal bumps efficiently reflects light leaking from the nitride semiconductor light emitting element structure and returns the light to the nitride semiconductor light emitting element structure.

A nitride semiconductor light emitting element according to the present invention is a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, first metal layers that constitute an n-side electrode being connected to the n-side electrode connecting surface and a p-side electrode being connected to the p-side electrode connecting surface third metal layers provided on the first metal layers in contact with the first metal layers, and second metal layers that constitute metal bumps provided on the third metal layers in contact with the third metal layers.

With such configuration, in the nitride semiconductor light emitting element, various metals can be used irrespective of the type of the metal bumps. Further, since the third metal layer functions as a buffer layer for the second metal layer that becomes the metal bumps, pressure in mounting the nitride semiconductor light emitting element to the mounting substrate can be reduced.

In the nitride semiconductor light emitting element of the present invention, since the third metal layers functions as buffer layers for the second metal layers that constitute the metal bumps, the pressure in mounting the nitride semiconductor light emitting element to the mounting substrate can be reduced.

According to a manufacturing method of a nitride semiconductor light emitting element according to the present invention, in the manufacturing method of the nitride semiconductor light emitting element, the second metal layer height adjusting step is performed after the second metal layer forming step.

According to such procedure, in the second metal layer forming step, the second metal layer having the same thickness, which becomes the metal bumps, is formed on the n-side electrode and the p-side electrode. Therefore, the second metal layer formed on the highly-provided p-side electrode is located at a higher position than the second metal layer formed on the n-side electrode. Thus, in the second metal layer height adjusting step, a height from the upper surface of the substrate to the upper surface of the second metal layer that becomes the metal bump formed on the n-side electrode is adjusted to be same as a height from the upper surface of the substrate to the upper surface of the second metal layer that becomes the metal bump formed on the p-side electrode, for example, by polishing, cutting or the like. Thereby, it is possible to manufacture the nitride semiconductor light emitting element in which the height from the upper surface of the substrate to the upper surface of the metal bump on the n-side electrode is the same as the height from the upper surface of the substrate to the upper surface of the metal bump on the p-side electrode.

According to the manufacturing method of the present invention, since the height from the upper surface of the substrate to the upper surface of the metal bump on the n-side electrode is the same as the height from the upper surface of the substrate to the upper surface of the metal bump on the p-side electrode, in flip-chip mounting, a pressing force is equally applied to both the electrodes from the substrate and therefore, it is possible to manufacture the nitride semiconductor light emitting element that enables excellent connection without applying the pressing force than required.

According to a manufacturing method of the nitride semiconductor light emitting element according to the present invention, in the manufacturing method of the nitride semiconductor light emitting element, the second metal layer height adjusting step is performed after the second metal layer forming step.

According to such procedure, in the second metal layer forming step, the second metal layer having the same thickness, which becomes the metal bumps, is formed on the n-side electrode and the p-side electrode. Therefore, the second metal layer formed on the highly-provided p-side electrode is located at a higher position than the second metal layer formed on the n-side electrode. Thus, in the second metal layer height adjusting step, a height from the upper surface of the substrate to the upper surface of the second metal layer that becomes the metal bump formed on the n-side electrode is adjusted to be same as a height from the upper surface of the substrate to the upper surface of the second metal layer that becomes the metal bump formed on the p-side electrode, for example, by polishing, cutting or the like. Thereby, it is possible to manufacture the nitride semiconductor light emitting element in which the height from the upper surface of the substrate to the upper surface of the metal bump on the n-side electrode is the same as the height from the upper surface of the substrate to the upper surface of the metal bump on the p-side electrode. Further, in the case where an outer edge of the upper surface of the second metal layer formed in the second metal layer forming step is rounded, roundness of the outer edge of the upper surface of the metal bump on the n-side electrode is maintained.

According to the manufacturing method of the present invention, since the height from the upper surface of the substrate to the upper surface of the metal bump on the n-side electrode is the same as the height from the upper surface of the substrate to the upper surface of the metal bump on the p-side electrode, in flip-chip mounting, a pressing force is equally applied to both the electrodes from the substrate and therefore, it is possible to manufacture the nitride semiconductor light emitting element that enables excellent connection without applying the pressing force than required. Since an upper portion of the second metal layer that becomes the metal bump on the n-side electrode is removed, excessive material can be reduced.

A nitride semiconductor light emitting element according to the present invention is a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface for connecting an n-side electrode to the n-type nitride semiconductor layer and a p-side electrode connecting surface for connecting a p-side electrode to the p-type nitride semiconductor layer on the same plane side of the substrate, the n-side electrode being connected to the n-side electrode connecting surface and the p-side electrode being connected to the p-side electrode connecting surface; and metal bumps formed on the n-side electrode and the p-side electrode, the nitride semiconductor light emitting element further including an insulating protective layer that covers the surface of the nitride semiconductor light emitting element, wherein at least one electrode of the n-side electrode and the p-side electrode is larger than the metal bump on said one electrode in a plan view to expose a portion of an upper surface of said one electrode, the protective layer does not cover the portion of the upper surface of said one electrode and a surface of the metal bumps, and a height from an upper surface of the substrate to an upper surface of the metal bump on the n-side electrode is the same as a height from the upper surface of the substrate to an upper surface of the metal bump on the p-side electrode.

With such configuration, when the nitride semiconductor light emitting element is pressed in contact with the wiring electrodes on the mounting substrate via the metal bumps of the nitride semiconductor light emitting element in bonding, the metal bumps are squeezed and horizontally extended. At this time, since at least either the n-side electrode and the p-side electrode, on which the metal bump is provided, is larger than the metal bump in a plan view, the metal bump extends on the larger n-side electrode or the p-side electrode in a plan view. Since the exposed upper surfaces of the n-side electrode and the p-side electrode, on which the metal bumps are not provided, are not covered with the protective layer, the upper surfaces of the electrodes are in electrical connect with the horizontally extended metal bumps, the bonding area between the n-side electrode and the p-side electrode, and the metal bumps increases, and the contact resistance between the n-side electrode and the p-side electrode, and the metal bumps decreases. Further, since the height from the upper surface of the substrate to the upper surface of the metal bump on the n-side electrode is the same as a height from the upper surface of the substrate to the upper surface of the metal bump on the p-side electrode, in flip-chip mounting, a pressing force is equally applied to these metal bumps from the side of the substrate.

In the nitride semiconductor light emitting element of the present invention, since the height from the upper surface of the substrate to the upper surface of the metal bump on the n-side electrode is the same as the height from the upper surface of the substrate to the upper surface of the metal bump on the p-side electrode, in flip-chip mounting, a pressing force is equally applied to both the electrodes from the substrate and therefore, satisfactory connection can be achieved without applying the pressing force than required to the nitride semiconductor light emitting element.

In a nitride semiconductor light emitting element according to the present invention, in the nitride semiconductor light emitting element, a height from an upper surface of the substrate to an upper surface of the metal bump on the n-side electrode is the same as a height from the upper surface of the substrate to an upper surface of the metal bump on the p-side electrode.

With such configuration, in the nitride semiconductor light emitting element, since the height from the upper surface of the substrate to the upper surface of the metal bump on the n-side electrode is the same as a height from the upper surface of the substrate to the upper surface of the metal bump on the p-side electrode, in flip-chip mounting, a pressing force is equally applied to these metal bumps from the side of the substrate.

In the nitride semiconductor light emitting element of the present invention, since the height from the upper surface of the substrate to the upper surface of the metal bump on the n-side electrode is the same as the height from the upper surface of the substrate to the upper surface of the metal bump on the p-side electrode, in flip-chip mounting, a pressing force is equally applied to both the electrodes from the substrate and therefore, satisfactory connection can be achieved without applying the pressing force than required to the nitride semiconductor light emitting element.

In a nitride semiconductor light emitting element according to the present invention, in the nitride semiconductor light emitting element, an outer edge of an upper surface of the metal bump on the n-side electrode is rounded.

With such configuration, since the outer edge of the upper surface of the metal bump on the n-side electrode in the nitride semiconductor light emitting element is rounded, the area of the upper surface is small. Therefore, in flip-chip mounting, the small upper surface of the metal bump on the n-side electrode contacts the wiring electrode on the mounting substrate and receives a pressing force from the side of the substrate.

In the nitride semiconductor light emitting element of the present invention, since the outer edge of the upper surface of the metal bump on the n-side electrode is rounded and the area of the upper surface is small, in flip-chip mounting, when the metal bumps receives the pressing force and are squeezed, the upper ends of the metal bump can be prevented from being horizontally extended than required.

The manufacturing method of the present invention can provide a method of manufacturing the nitride semiconductor light emitting element with an improved productivity.

The nitride semiconductor light emitting element of the present invention can provide a reliable nitride semiconductor light emitting element.

BRIEF DESCRIPTION OF THE DRAWINGS

FIGS. 1A and 1B are schematic views showing a structure of a nitride semiconductor light emitting element in the first embodiment of the present invention, in which FIG. 1A is a plan view and FIG. 1B is a sectional view taken along lines A-A in FIG. 1A.

FIGS. 3A-3C are schematic sectional views for describing a manufacturing process of the nitride semiconductor light emitting element in the first embodiment of the present invention, in which FIG. 3A shows a state where a nitride semiconductor light emitting element structure is formed, FIG. 3B shows a state where a protective layer is formed and FIG. 3C shows a state where a first resist pattern is formed.

FIGS. 4A-4C are schematic sectional views for describing the manufacturing process of the nitride semiconductor light emitting element in the first embodiment of the present invention, in which FIG. 4A shows a state where the protective layer of an electrode forming part is removed, FIG. 4B shows a case where an electrode layer is formed and FIG. 4C shows a state where a second resist pattern for forming the metal bump is formed.

FIGS. 5A-5C are schematic sectional views for describing the manufacturing process of the nitride semiconductor light emitting element in the first embodiment of the present invention, in which FIG. 5A shows a state where a metal bump layer is formed, FIG. 5B shows a state where the first resist pattern is removed and FIG. 5C shows a state where the second resist pattern is removed.

FIGS. 8A-8D are schematic sectional views for describing a manufacturing process of the nitride semiconductor light emitting element in the second embodiment of the present invention, in which FIG. 8A shows a nitride semiconductor light emitting element structure, FIG. 8B shows a state where the protective layer is formed, FIG. 8C shows a state where a resist pattern for forming the electrode is formed and FIG. 8D shows a state where the protective layer of the electrode forming part is removed.

FIGS. 9A-9C are schematic sectional views for describing a manufacturing process of a nitride semiconductor light emitting element in the second embodiment of the present invention, in which FIG. 9A shows a state where the electrode layer is formed, FIG. 9B shows a state where the metal bump layer is formed and FIG. 9C shows a state where the resist pattern is removed.

FIG. 11 is a flow chart showing a flow of a manufacturing method of the nitride semiconductor light emitting element in the third embodiment of the present invention.

FIGS. 12A-12D are schematic sectional views for describing a manufacturing process of the nitride semiconductor light emitting element in the third embodiment of the present invention, in which FIG. 12A shows a nitride semiconductor light emitting element structure, FIG. 12B shows a state where the protective layer is formed, FIG. 12C shows a state where the resist pattern for forming the electrode is formed and FIG. 12D shows a state where the protective layer of the electrode forming part is removed.

FIGS. 13A-13D are schematic sectional views for describing a manufacturing process of the nitride semiconductor light emitting element in the third embodiment of the present invention, in which FIG. 13A shows a state where the electrode layer is formed, FIG. 13B shows a state where the resist pattern and an electrode layer on a resist are removed, FIG. 13C shows a state where a seed electrode layer for electrolytic plating is formed and FIG. 13D shows a state where the resist pattern for forming the metal bump is formed.

FIGS. 14A-14C are schematic sectional views for describing a manufacturing process of the nitride semiconductor light emitting element in the third embodiment of the present invention, in which FIG. 14A shows a state where the metal bump layer is formed, FIG. 14B shows a state where the resist pattern is removed, FIG. 14C shows a state where an unnecessary seed electrode layer is removed.

FIG. 15B shows formation of insulating films, FIG. 15C shows formation of a flat metal layer, FIG. 15D shows formation of resists on the metal layer, FIG. 15E shows application of electroplating, FIG. 15F shows removal of the resists, and FIG. 15G shows removal of exposed portions of the metal layer.

FIGS. 16A and 16B are schematic views showing a structure of the nitride semiconductor light emitting element in the fourth embodiment of the present invention, in which FIG. 16A is a plan view and FIG. 16B is a sectional view taken along lines A-A in FIG. 16A.

FIGS. 18A-18C are schematic sectional views for describing a part of a manufacturing process of the nitride semiconductor light emitting element in the fourth embodiment of the present invention, in which FIG. 18A shows a state where height adjustment of the metal bump layer is performed, FIG. 18B shows a state where the first resist pattern is removed and FIG. 18C shows a state where the second resist pattern is removed.

FIGS. 25A and 25B are schematic sectional views for describing a manufacturing process of the nitride semiconductor light emitting element in the fifth embodiment of the present invention, in which FIG. 25A shows a state where height adjustment of the metal bump layer is performed and FIG. 25B shows a state where the resist pattern is removed.

FIGS. 28A-28C are schematic sectional views for describing a manufacturing process of the nitride semiconductor light emitting element in the sixth embodiment of the present invention, in which FIG. 28A shows a state where height adjustment of the metal bump layer is performed, FIG. 28B shows a state where the resist pattern is removed and FIG. 28C shows a state where the unnecessary seed electrode layer is removed.

DETAILED DESCRIPTION OF THE INVENTION

Figure 2:
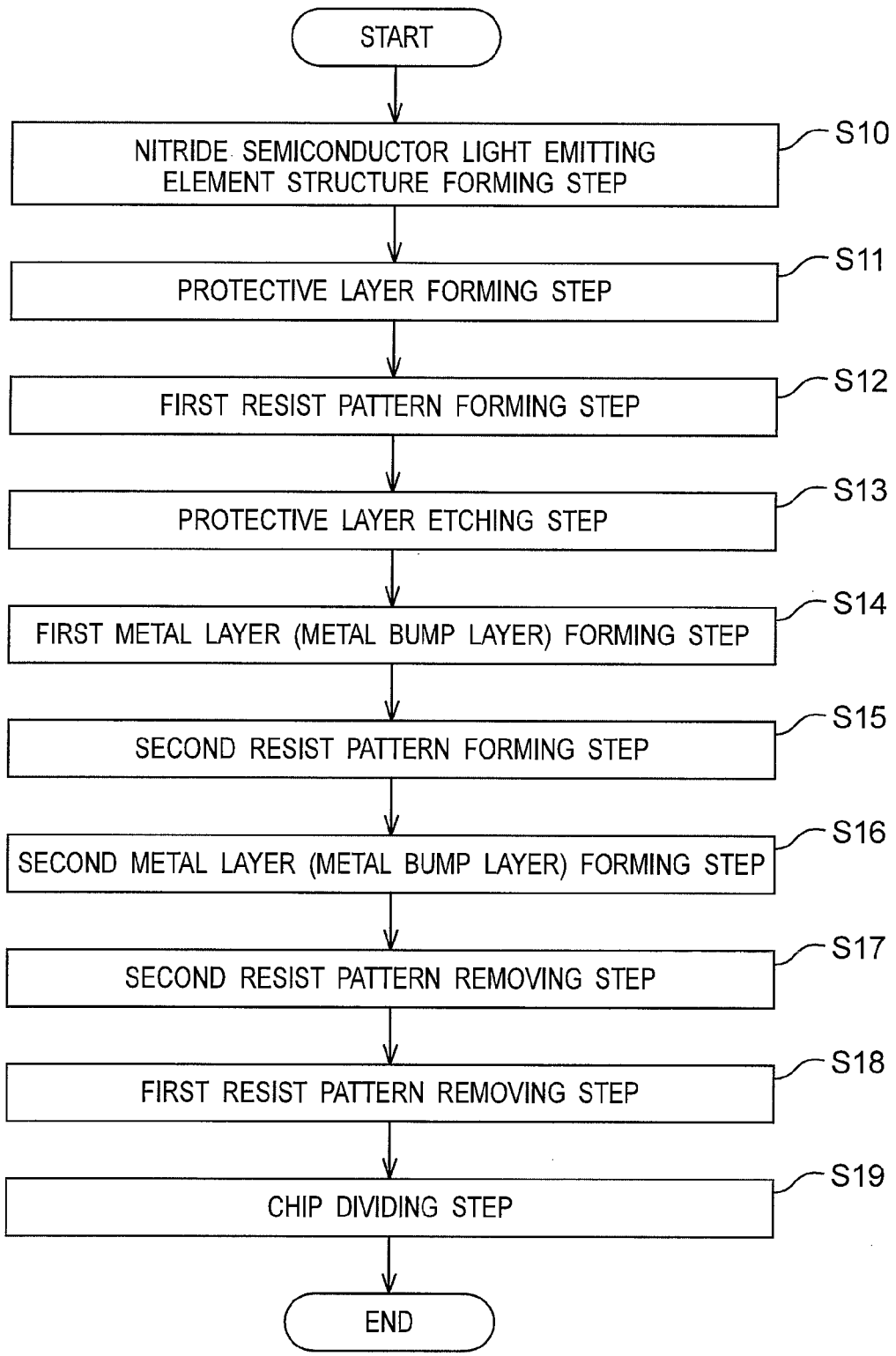
FIG. 2 is a flow chart showing a flow of a manufacturing method of the nitride semiconductor light emitting element in the first embodiment of the present invention.

A nitride semiconductor light emitting element and a manufacturing method of the nitride semiconductor light emitting element according to the present invention will be described below.

<First Embodiment>
[Nitride Semiconductor Light Emitting Element]

A structure of a nitride semiconductor light emitting element in the first embodiment of the present invention will be described with reference to FIG. 1. The nitride semiconductor light emitting element 1 in the present embodiment of the present invention is a flip-chip mounted LED. As shown in FIGS. 1A and B, the nitride semiconductor light emitting element 1 in the first embodiment includes a substrate 2, a nitride semiconductor light emitting element structure 10 laminated on the substrate 2, a protective layer 20, an n-side electrode 21, a p-side electrode 22, a metal bump 23 and a metal bump 24.

In the present specification, the "nitride semiconductor light emitting element structure" means a laminated structure in which an active layer 12, an n-type nitride semiconductor layer 11 and a p-type nitride semiconductor layer 13 are laminated, and the structure also includes when an full surface electrode 14 as a current diffusion layer or a reflective layer and a cover electrode 15 for preventing migration of a material for the full surface electrode 14, if provided. The nitride semiconductor light emitting element structure 10 includes an n-side electrode connection surface 10a for electrically connecting the n-side electrode 21 to the n-type nitride semiconductor layer 11 and a p-side electrode connection surface 10b for electrically connecting p-side electrode 22 to the p-type nitride semiconductor layer 13 on the same plane side of the substrate 2, and has a structure suitable for manufacturing the flip-chip nitride semiconductor light emitting element 1. Further, in the present specification, "upside" refers to a direction perpendicular to the plane of the nitride semiconductor light emitting element structure 10 laminated on the substrate 2, that is, the direction in which the nitride semiconductor light emitting element structure 10 is laminated. For example, the direction is the upward direction in FIG. 1B.

(Substrate)

The substrate 2 may be made of any material that can epitaxially grow the nitride semiconductor, and there is no particular limitation on its dimension and thickness. Examples of such substrate include an sapphire or spinel ($MgAl_2O_4$) insulating substrate including a C surface, an R surface or an A surface as a principal surface, and oxide substrates such as lithium niobate and neodymium gallate lattice-bonded to silicon carbide (SiC), silicon, ZnS, ZnO, Si, GaAs, diamond, and nitride semiconductor. For flip-chip mounting, in the nitride semiconductor light emitting element 1 in the present embodiment, a back surface of the substrate 2 serves as a light extraction surface. Accordingly, since light from the nitride semiconductor light emitting element 1 passes through the substrate 2 and is emitted from the light extraction surface, it is preferred that the substrate 2 is transparent with respect to at least a wavelength of this light.

(Nitride Semiconductor Light Emitting Element Structure)

The nitride semiconductor light emitting element structure 10 refers to a laminated structure in which the active layer 12, the n-type nitride semiconductor layer 11 and the p-type nitride semiconductor layer 13 are laminated as described above. In the present embodiment, in the nitride semiconductor light emitting element structure 10, the full surface electrode 14 and the cover electrode 15 are laminated on the p-type nitride semiconductor layer 1, and the n-side electrode connection surface 10a as an upper surface of the n-type nitride semiconductor layer 11 for electrically connecting the n-side electrode 21 to the n-type nitride semiconductor layer 11 and the p-side electrode connection surface 10b as an upper surface of the cover electrode 15 for electrically connecting the p-side electrode 22 to the p-type nitride semiconductor layer 13 are provided on the same plane side of the substrate 2.

(N-type Nitride Semiconductor Layer, Active Layer, and p-Type Nitride Semiconductor Layer)

The n-type nitride semiconductor layer 11, the active layer 12 and the p-type nitride semiconductor layer 13 are not specifically limited, but for example, a gallium nitride-based compound semiconductor such as $In_XAl_YGa_{1-X-Y}N$ ($0 \leq X$, $0 \leq Y$, $X+Y<1$) is preferably used. The n-type nitride semiconductor layer 11, the active layer 12 and the p-type nitride semiconductor layer 13 (collectively referred to as nitride semiconductor layers 11, 12 and 13, as appropriate) may each have a mono-layered structure, or may have a laminated structure having different layers in composition and thickness or a superlattice structure. It is preferred that especially the active layer 12 as a light emitting layer has a single quantum well or multiple quantum well structure in which thin films generating the quantum effect are laminated, and a well layer is a nitride semiconductor containing In. The n-type nitride semiconductor layer 11 may be formed above the substrate 2 through a base layer (not shown) such as a buffer layer for mitigating mismatch between the n-type nitride semiconductor layer 11 and the substrate 2 in lattice constant.

Such nitride semiconductor layers each may have a homostructure, a heterostructure or a double-heterostructure with MIS bonding, PIN bonding or PN bonding. There is no particular limitation on its thickness, and the thickness may vary. Examples of the laminated structure of the nitride semiconductor layers include a buffer layer made of AlGaN, an undoped GaN layer, a n-side contact layer made of Si-doped n-type GaN, a superlattice layer in which a GaN layer and an InGaN layer are alternately laminated, an active layer having a multiple quantum well structure in which a GaN layer and an InGaN layer are alternately laminated, a superlattice layer in which an Mg-doped AlGaN layer and an Mg-doped InGaN layer are alternately laminated, and a p-side contact layer made of Mg-doped GaN.

According to the present invention, a method of forming the nitride semiconductor layers is not specifically limited, and publicly-known methods of growing the nitride semiconductor, including MOVPE (Metalorganic Vapor Phase Epitaxy), MOCVD (Metal Organic Chemical Vapor Deposition), HVPE (Hydride Vapor Phase Epitaxy) and MBE (Molecular Beam Epitaxy), can be preferably employed. Especially, MOCVD is preferable as it can grow the semiconductor with a good crystallinity. Further, it is preferred that the growing methods of the nitride semiconductors 11, 12 and 13 are individually selected according to intended uses of the semiconductors.

(Full Surface Electrode and Cover Electrode)

The full surface electrode 14 is an electrode that is provided on the p-type nitride semiconductor layer 13 so as to cover the substantially entire surface of the p-type nitride semiconductor layer 13 and serves to uniformly diffuse a current supplied via the p-side electrode 22 and the cover electrode 15 to the entire surface of the p-type nitride semiconductor layer 13. In the flip-chip mounted nitride semiconductor light emitting element 1 in the present embodiment, the full surface electrode 14 also functions as a reflective layer for reflecting light emitted from the active layer 12 toward the back surface of the substrate 2 as the light extraction surface.

Preferably, the full surface electrode 14 is an ohmic electrode that can be electrically connected to the p-type nitride semiconductor layer 13 well, and has a good reflectance with respect to at least wavelength of light emitted from the active layer 12. Accordingly, an Ag mono-layered film having a high optical reflectance or an Ag (lowermost layer)/Ni/Ti multi-layered film can be preferably used as the full surface electrode 14. More preferably, an Ag/Ni/Ti/Pt multi-layered film including the Ag lowermost layer (the side of the p-type nitride semiconductor layer 13) can be used, and the thicknesses of the layers in this multi-layered film each can be set to about 1000 nm, for example. The full surface electrode 14 can be formed by sequentially laminating these materials, for example, by sputtering or vapor deposition.

The cover electrode 15 functions as a barrier layer that covers an upper surface and a side surface of the full surface electrode 14 and shields the p-side electrode 22 against the full surface electrode 14 to prevent migration of the materials for the full surface electrode 14, in particular, Ag.

A mono-layered film or a multi-layered film of metals such as Ti, Au, W can be used as the cover electrode 15. Preferably, a Ti (lowermost layer)/Au/W/Ti multi-layered film including the Ti lowermost layer (the side of the full surface electrode 14) can be used, and the thicknesses of the layers in this multi-layered film are, for example, 2 nm, 1700 nm, 120 nm and 3 nm from the bottom.

Although the full surface electrode 14 and the cover electrode 15 are provided only above the p-type nitride semiconductor layer 13 in the present embodiment, the full surface electrode and the cover electrode may be provided above the n-type nitride semiconductor layer 11. In this case, the n-side electrode connection surface 10a is not the upper surface of the n-type nitride semiconductor layer 11, but an upper surface of the cover electrode.

(N-side Electrode and P-Side Electrode)

The n-side electrode 21 and the p-side electrode 22 are a pad electrode electrically connected to the n-type nitride semiconductor layer 11 and a pad electrode electrically connected to the p-type nitride semiconductor layer 13 through the cover electrode 15 and the full surface electrode 14, respectively, to supply a current to the nitride semiconductor light emitting element 1 from the outside. The n-side electrode 21 is provided in the n-side electrode connection surface 10a as the upper surface of the n-type nitride semiconductor layer 11 of the nitride semiconductor light emitting element structure 10. The p-side electrode 22 is provided in the p-side electrode connection surface 10b as the upper surface of the cover electrode 15 of the nitride semiconductor light emitting element structure 10.

The n-side electrode 21 and the p-side electrode 22 are preferably made of a material having a low electrical resistance, and may be formed of a mono-layered or multi-layered film of metals such as Au, Cu, Ni, Al, Pt and alloys of these metals. For example, the n-side electrode 21 and the p-side electrode 22 each may be formed as a Cu mono-layered film or a multi-layered film including a Cu/Ni laminated film as a lower layer and an Au or AuSn alloy as an upper layer.

Moreover, in order to obtain good electrical contact between the n-side electrode 21 and the n-type nitride semiconductor layer 11, Ti, Al, AlCuSi alloy, or the like, is preferably used as the lowermost layer of the n-side electrode 21. A multilayer film, such as Ti/Au, Al/Ti/Au, Al/Ti/Pt/Au, Ti/Pt/Au, AlCuSi/Ti/Pt/Au, or the like, the leftmost being the lowermost layer, can be employed. In cases where an AlCuSi/Ti/Pt/Au multilayer film is used, the thicknesses of individual layers can be 500 nm, 150 nm, 50 nm, and 700 nm, respectively, for example.

(Metal Bump)

The metal bump 23 and the metal bump 24 are provided on upper surfaces of the n-side electrode 21 and the p-side electrode 22, respectively, in contact with the respective electrodes, except for an outer edge 21a and an outer edge 22a of the n-side electrode 21 and the p-side electrode 22. That is, as shown in FIG. 1A, in a plan view (top view), the n-side electrode 21 and the p-side electrode 22 are wider that the metal bump 23 and the metal bump 24 provided thereon, respectively. The metal bump 23 and the metal bump 24 are electrode connection layers for connecting the n-side electrode 21 and the p-side electrode 22 of the nitride semiconductor light emitting element 1 to wiring electrodes (not shown) on the mounting substrate, respectively. That is, in performing flip-chip mounting of the nitride semiconductor light emitting element 1 to the mounting substrate (not shown), the n-side electrode 21 and the p-side electrode 22 are placed as opposed to the wiring electrodes (not shown) on the mounting substrate, and the metal bump 23 and the metal bump 24 are pressed in contact with the wiring electrodes to electrically connect the n-side electrode 21 and the p-side electrode 22 to the wiring electrodes (not shown) on the mounting substrate.

As described above, the n-side electrode 21 and the A-side electrode 22 as the pad electrodes are configured to be wider than the metal bump 23 and the metal bump 24, respectively, in a plan view. Therefore, when the nitride semiconductor light emitting element 1 is bonded to the wiring electrodes on the mounting substrate by pressing the metal bumps 23, 24 in contact with the wiring electrodes, the metal bumps 23, 24 can be prevented from being squeezed and horizontally extended to protrude to the outside of the n-side electrode 21 and the p-side electrode 22 as the pad electrodes. That is, the bonding strength can be prevented from decreasing due to protruding of the squeezed metal bumps 23, 24 from the n-side electrode 21 and the p-side electrode 22.

The metal bump 23 on the n-side electrode 21 and the metal bump 23 on the p-side electrode 22 have the same thickness. Since the n-side electrode 21 and the p-side electrode 22 also have the same thickness, an upper surface of the metal bump 23 provided on the n-side electrode 21 located at a lower position when viewed from an upper surface of the substrate 2 is located at a lower position than an upper surface of the metal bump 24. Accordingly, in mounting, the metal bump 23 on the n-side electrode 21 is squeezed less than the metal bump 24 and thus, does not horizontally extended so much. Therefore, the size of the outer edge 21a that acts as a margin of the n-side electrode 21 to be provided in order to prevent the decrease in the bonding strength can be smaller than that of the outer edge 22a of the p-side electrode 22. Thereby, the area of the n-side electrode connection surface 10a, in which the n-side electrode 21 is provided, can be reduced. That is, the area of the active layer 12 and the p-type nitride semiconductor layer 13 that contribute to light emission can be increased. As a result, more light can be extracted from the nitride semiconductor light emitting element 1.

The outer edge 21a of the n-side electrode 21 and the outer edge 22a of the p-side electrode 22 are not coated with the protective layer 20 and are exposed. Thus, in bonding the nitride semiconductor light emitting element 1 to the wiring electrodes on the mounting substrate by pressing the metal bumps 23, 24 in contact with the wiring electrodes, when the metal bump 23 and the metal bump 24 are squeezed and horizontally extended, the horizontally extended metal bumps 23, 24 electrically contact the outer edge 21a of the n-side electrode 21 as the pad electrode and the outer edge 22a of the p-side electrode 22 as the pad electrode, respectively. Therefore, electrical contact areas between the n-side electrode 21 and the metal bump 23 and between the p-side electrode 22 and the metal bump 24 increase, enabling a decrease in contact resistance therebetween.

In the example shown in FIG. 1, all of the n-side electrode 21, the p-side electrode 22, the metal bump 23 and the metal bump 24 are shaped like a rectangular column and are rectangular in a plan view. However, they are not limited to this shape and may have any shape such as circle, ellipse and polygon. Although the n-side electrode 21 and the p-side electrode 22 are configured to be wider than the metal bump 23 and the metal bump 24 provided thereon, respectively, in a plan view, either the n-side electrode 21 or the p-side electrode 22 may be configured to be wider than the metal bump 23 or 24 provided thereon.

The metal bumps 23, 24 in the present embodiment are formed by electrolytic plating using the n-side electrode 21 and the p-side electrode 22 as seed electrodes. There is no particular limitation on the metal bumps 23, 24, as long as they have a low electric resistance and can be formed by electrolytic plating, and a mono-layered or multi-layered film of Au, Cu, Ni can be used as the metal bumps 23, 24. Au having a low electric resistance and a low contact resistance is preferable, but an AuSn alloy as an alloy of Au and inexpensive Sn can be also used. The composition of the AuSn alloy is, for example, Au 80% and Sn 20%.

Uppermost layers of the metal bumps 23, 24 can be selected according to the bonding property to the material for wiring electrodes on the mounting substrate. At this time, in the case where both the uppermost layers of the metal bumps 23, 24 and uppermost layers of wiring electrodes on the mounting substrate are made of Au, in order to obtain a good bonding property, it is desired to polish and flatten the upper surfaces of the metal bump 23, 24 by CMP (Chemical Mechanical Polishing) or the like to reduce gaps between bonding surfaces of the metal bumps and the wiring electrodes as much as possible. When the uppermost layers of the metal bumps 23, 24 are made of the above-mentioned AuSn alloy, as compared to the case where the uppermost layers are made of Au, a flatness condition necessary for ensuring the bonding property can be relaxed.

In flip-chip mounting, in order to achieve highly-reliable mounting with less faulty connection, it is preferred that the metal bumps 23, 24 each have a thickness of 10 μm or more.
(Protective Layer)

The protective layer 20 is an insulating coating film that coats exposed surfaces (upper surface and side surfaces) of the nitride semiconductor light emitting element structure 10, and functions as a protective film and an antistatic film in the nitride semiconductor light emitting element 1. The protective layer 20 can be made of an insulating oxide of Si, Ti, Ta and the like, and be formed by publicly known methods such as vapor deposition and sputtering. It is preferred that the protective layer 20 has a thickness of 100 nm or more and for example, may be made of $SiO_2$ having a thickness of about 350 nm. It is noted that the protective layer 20 does not coat the outer edge 21a and the outer edge 22a as the exposed upper surfaces of the n-side electrode 21 and the p-side electrode 22, and the upper surfaces and the side surfaces of the metal bump 23 and the metal bump 24.
[Operation of Nitride Semiconductor Light Emitting Element]

In the nitride semiconductor light emitting element 1 in the first embodiment of the present invention as shown in FIG. 1, when a current is supplied to the n-side electrode 21 and the p-side electrode 22 through the wiring electrodes (not shown) on the mounting substrate connected thereto via the metal bump 23 and the metal bump 24, respectively, the active layer 12 of the nitride semiconductor light emitting element structure 10 emits light. The light emitted from the active layer 12 is extracted from the side of the back surface of the substrate 2. Light advancing toward the front surface of the substrate 2 in the light emitted from the active layer 12 is reflected on the full surface electrode 14 that functions as the reflective layer and is extracted from the side of the back surface of the substrate 2 as the light extraction surface.
[Manufacturing Method of Nitride Semiconductor Light Emitting Element]

A manufacturing method of the nitride semiconductor light emitting element in the first embodiment of the present invention will be described with reference to the accompanying drawings.

As shown in FIG. 2, the manufacturing method of the nitride semiconductor light emitting element in the first embodiment includes a nitride semiconductor light emitting element structure forming step (S10), a protective layer forming step (S11), a first resist pattern forming step (S12), a protective layer etching step (S13), a first metal layer forming step (S14), a second resist pattern forming step (S15), a second metal layer forming step (S16), a second resist pattern removing step (S17), a first resist pattern removing step (S18) and a chip dividing step (S19).

Each of the steps will be described in detail with reference to FIG. 3 to FIG. 5 (refer to FIG. 1 and FIG. 2 as appropriate).
(Nitride Semiconductor Light Emitting Element Structure Forming Step: S10)

Figure 3A:
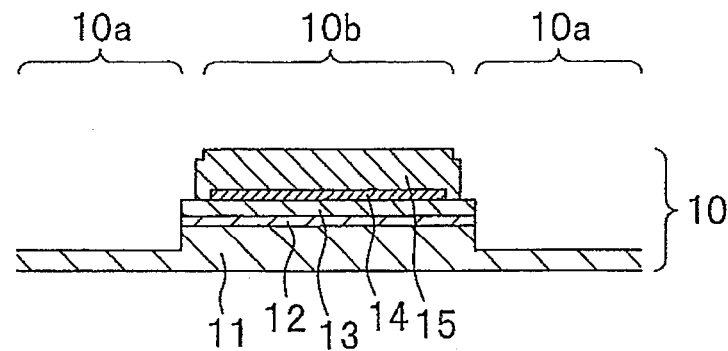

First, the nitride semiconductor light emitting element structure 10 shown in FIG. 3A is formed on the transparent substrate 2 such as a sapphire substrate according to a publicly known manufacturing method. In FIG. 3 to FIG. 5, the substrate 2 is not shown.

Briefly describing the step of forming the nitride semiconductor light emitting element structure 10 (S10), first, a nitride semiconductor constituting each of the n-type nitride semiconductor layer 11, the active layer 12 and the p-type nitride semiconductor layer 13 is grown on the sapphire substrate 2 according to an MOVPE method. After that, it is preferred that the substrate 2 (hereinafter referred to as wafer) on which each nitride semiconductor layer is grown is subjected to annealing under 600 to 700° C. in an atmosphere of nitrogen to make the resistance of the p-type nitride semiconductor layer 13 lower.

Next, a part of the n-type nitride semiconductor layer 11 is exposed as the n-side electrode connection surface 10a for connecting the n-side electrode 21. A mask of predetermined shape is formed on the annealed wafer, and the p-type nitride semiconductor layer 13, the active layer 12 and a part of the n-type nitride semiconductor layer 11 are removed by reactive ion etching (RIE) to expose the n-type nitride semiconductor layer 11. After etching, a resist is removed. In the present embodiment, the exposed surface of the n-type nitride semiconductor layer 11 becomes the n-side electrode connection surface 10a.

Next, for example, a multi-layered film formed by sequentially laminating Ag/Ni/Ti/Pt as the full surface electrode 14 is formed on the entire surface of the wafer by sputtering. Then, the full surface electrode 14 of predetermined shape is formed by photolithography. After that, for example, a multi-layered film formed by sequentially laminating Ti/Au/W/Ti as the cover electrode 15 is formed by sputtering. Then, the cover electrode 15 of predetermined shape, which shields the full surface electrode 14, is formed by photolithography. In the present embodiment, the upper surface of the cover electrode 15 becomes the p-side electrode connection surface 10*b*. The nitride semiconductor light emitting element structure 10 is formed in this manner.

The plurality of nitride semiconductor light emitting element structures 10 are arranged on the substrate 2 in a matrix, and are divided into chips after the nitride semiconductor light emitting elements 1 are completed on the substrate 2. In the example in FIG. 3A, the two n-side electrode connection surfaces 10*a* are shown. One of them belongs to the adjacent nitride semiconductor light emitting element structure 10.

(Protective Layer Forming Step: S11)

Figure 3B:
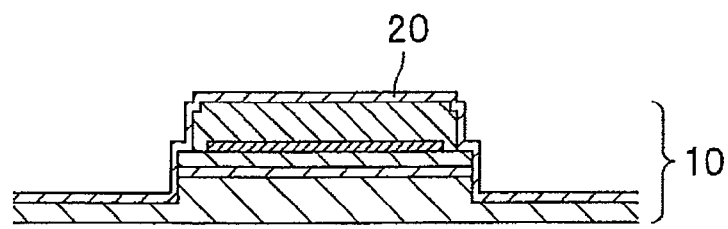

Next, as shown in FIG. 3B, insulating $SiO_2$ is laminated on the entire surface of the nitride semiconductor light emitting element structure 10, for example, by sputtering, to form the protective layer 20.

(First Resist Pattern Forming Step: S12)

Figure 3C:
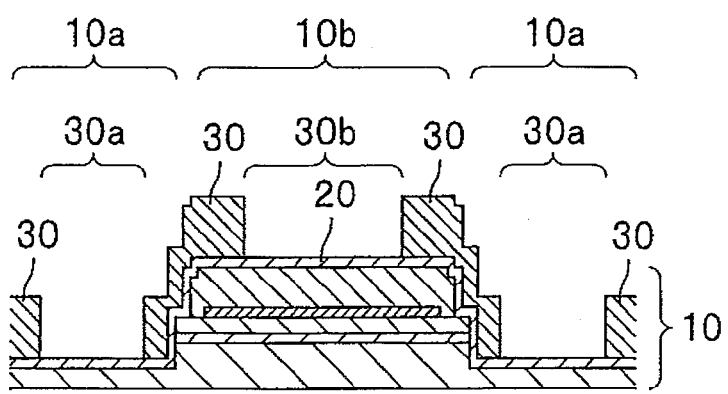

Next, as shown in FIG. 3C, a first resist pattern 30 having an opening 30*a* in a region where the n-side electrode 21 is to be formed and an opening 30*b* in a region where the p-side electrode 22 is to be formed is formed by photolithography.

(Protective Layer Etching Step: S13)

Figure 4A:
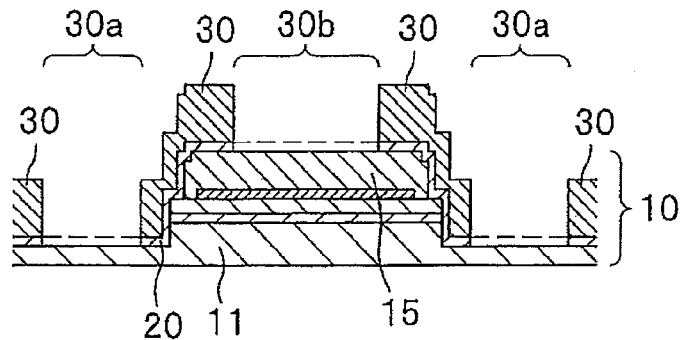

Then, as shown in FIG. 4A, using the first resist pattern 30 as a mask, portions of the protective layer 20 on the opening 30*a* and the opening 30*b* are removed by etching to expose the n-type nitride semiconductor layer 11 and the cover electrode 15, respectively.

(First Metal Layer (Pad Electrode Layer) Forming Step: S14)

Figure 4B:
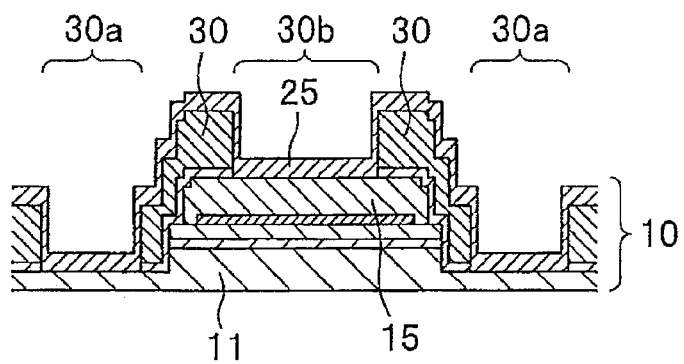

Next, as shown in FIG. 4B, a mono-layered film of Au, Cu or the like or a multi-layered film of AlCuSi/Ti/Pt/Au or the like is formed by sputtering or the like as a first metal layer (pad electrode layer) 25 that becomes the n-side electrode 21 and the p-side electrode 22 as the pad electrodes. The first metal layer 25 is also formed on the first resist pattern 30 as well as in the regions where the n-side electrode 21 and the p-side electrode 22 are to be formed, and the entire surface of the first metal layer 25 is electrically conducting. In the present embodiment, since the first metal layer 25 that becomes the n-side electrode 21 and the p-side electrode 22 as the pad electrodes is formed after formation of the protective layer 20, the upper surfaces of the n-side electrode 21 and the p-side electrode 22 are not coated with the protective layer 20. The first metal layer 25 is formed in regions other than the regions where the n-side electrode 21 and the p-side electrode 22 are formed through the first resist pattern 30, and the first metal layer 25 is not formed immediately on the protective layer 20. Therefore, after the first resist pattern 30 is removed in a downstream step, there is no possibility that a metal film remains to cause leakage.

(Second Resist Pattern Forming Step: S15)

Figure 4C:
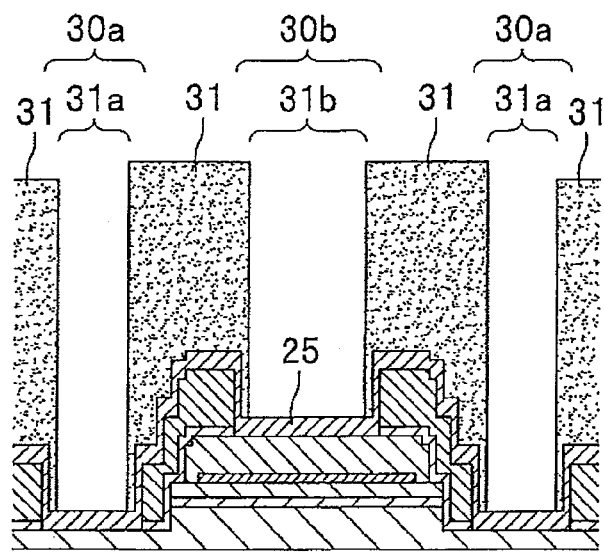

Next, without removing the first resist pattern 30, as shown in FIG. 4C, a second resist pattern 31 having an opening 31*a* in an inner region of the opening 30*a* as the region where the n-side electrode 21 is to be formed and an opening 31*b* in an inner region of the opening 30*b* as the region where the p-side electrode 22 is to be formed is formed by photolithography. Since the second resist pattern 31 is used to form the metal bumps 23, 24 by electrolytic plating, the thickness of the second resist pattern 31 is set to be larger than that the thicknesses of the metal bump 23, 24.

Herein, the openings 31*a*, 31*b* of the second resist pattern 31 are narrow openings opened on the inner side of the openings 30*a*, 30*b* of the first resist pattern 30, respectively. Thereby, a second metal layer 26*a* and a second metal layer 26*b* are formed in regions where the second resist pattern 31 is formed on the opening 30*a* and the opening 30*b* of the first metal layers 25 in the following second metal layer forming step (S16). The regions become the outer edge 21*a* of the n-side electrode 21 and the outer edge 22*a* of the p-side electrode 22 as shown in FIG. 1.

Alternatively, the openings 31*a*, 31*b* of the second resist pattern 31 may be equal to or larger than the openings 30*a*, 30*b* of the first resist pattern 30. Thereby, the first metal layer 25 is formed only on the side surfaces of the lower portions of the second metal layer 26*a* and the second metal layer 26*b* in the following second metal layer forming step (S16). In this case, as compared to the case where the first metal layer 25 is not formed on the second metal layer 26*a* and the second metal layer 26*b*, the electrical resistance at power-on of the nitride semiconductor light emitting element can be reduced. A height of the first metal layer 25 formed only on the side surfaces of the lower portions of the second metal layer 26*a* and the second metal layer 26*b* can be adjusted by adjusting the thickness of the first resist pattern 30.

According to the manufacturing method in the first embodiment, the first resist pattern 30 is not removed before forming the second resist pattern 31. As a result, the first metal layer 25 is left while the entire surface including the first metal layer 25 that becomes the n-side electrode 21 and the first metal layer 25 that becomes the p-side electrode 22 are electrically conducting. Thus, the first metal layer 25 can be used as the seed electrodes for electrolytic plating of forming the second metal layers 26*a*, 26*b* that become the metal bumps 23, 24 in the second metal layer forming step (S16). That is, the manufacturing method in the first embodiment of the present invention does not require formation of the third metal layer 29 (refer to FIG. 13C) that becomes the seed electrodes as in a below-mentioned manufacturing method in the third embodiment, which can shorten the manufacturing process.

(Second Metal Layer (Metal Bump Layer) Forming Step: S16)

Figure 5A:
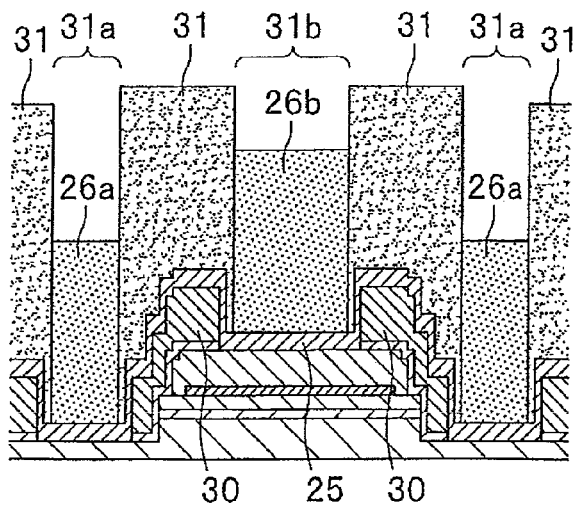

Next, as shown in FIG. 5A, by performing electrolytic plating using the first metal layer 25 as the seed electrodes to laminate a multi-layered film of Cu/Ni/Au or the like, the second metal layer (metal bump layer) 26*a* that becomes the metal bump 23 and the second metal layer (metal bump layer) 26*b* that becomes the metal bump 24 are formed on the first metal layer 25 in the opening 31*a* of the second resist pattern 31 and the first metal layer 25 in the opening 31*b* of the second resist pattern 31, respectively. The electrolytic plating is performed by immersing the wafer subjected to the second resist pattern forming step (S15) in FIG. 4C into a plating solution, setting the first metal layer 25 to a negative electrode and passing a current between the negative electrode and a positive electrode (not shown) immersed in the plating solution.

According to the manufacturing method in the first embodiment, since the second metal layers 26*a*, 26*b* that become the metal bumps 23, 24 are formed by electrolytic plating using the first metal layer 25 that becomes the n-side electrode 21 and the p-side electrode 22 as the seed electrodes, in the nitride semiconductor light emitting element 1 manufactured according to the manufacturing method in the first embodiment, the n-side electrode 21 and the p-side electrode 22 can be directly bonded to the metal bump 23 and the metal bump 24, respectively, without interposing any excessive metal layer therebetween. Therefore, as distinct from the case where a metal layer having a relatively large resistance is used as the seed electrode, there is no possibility that the electrical resistance between the n-side electrode 21 and the a metal bump 23 and between the p-side electrode 22 and the metal bump 24 becomes high due to interposition of the metal layer.

(Second Resist Pattern Removing Step (Resist Pattern Removing Step): S17)

Figure 5B:
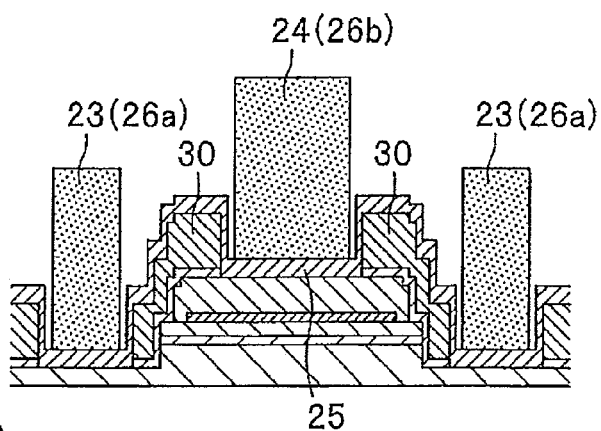

Next, as shown in FIG. 5B, when the second resist pattern 31 is removed, the second metal layer 26a and the second metal layer 26b appears as the metal bump 23 and the metal bump 24, respectively.

(First Resist Pattern Removing Step (Resist Pattern Removing Step): S18)

Figure 5C:
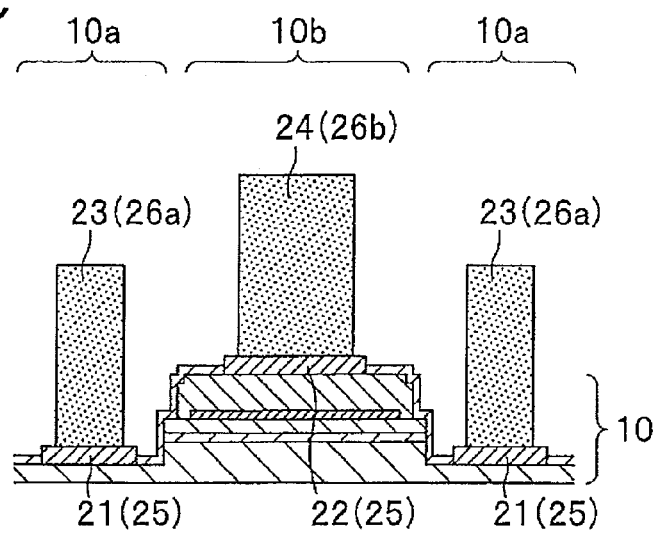

Subsequently, as shown in FIG. 5C, when the first resist pattern 30 is removed, the first resist pattern 30 and the first metal layer 25 formed on the first resist pattern 30 are removed (lift-off). Thereby, the plurality of nitride semiconductor light emitting element 1 arranged in a matrix are formed on the substrate 2.

Although the step of removing the second resist pattern 31 and the step of removing the first resist pattern 30 are sequentially performed in the present embodiment, the present invention is not limited thereto. Preferably, by using a same material or at least a material that can be removed by a same solution for a photoresist for forming the first resist pattern 30 and a photoresist for forming the second resist pattern 31, the second resist pattern removing step (S17) and the first resist pattern removing step (S18) can be performed in one step. This can further shorten the manufacturing process.

According to the manufacturing method in the first embodiment, the first metal layer 25 used as the seed electrodes for electrolytic plating is not formed directly on the protective layer 20 and thus, is completely removed with removal of the first resist pattern 30. Therefore, in the nitride semiconductor light emitting element 1 manufactured according to the manufacturing method in the first embodiment, there is no possibility that a current leaks between the n-side electrode 21 and the p-side electrode 22, and between the electrodes and the wiring on the mounting substrate, achieving the highly-reliable nitride semiconductor light emitting element 1.

(Chip Dividing Step: S19)

Further, by dividing the plurality of nitride semiconductor light emitting elements 1 arranged on the substrate 2 in a matrix into chips by scribing, dicing or the like, the nitride semiconductor light emitting elements 1 in units of chips are completed. Before dividing the elements into the chips, the substrate 2 may be polished (back grind) from the back surface of the substrate 2 so as to have a desired thickness.

As described above, according to the manufacturing method of the nitride semiconductor light emitting element in the first embodiment of the present invention, the manufacturing process can be shortened. The highly-reliable nitride semiconductor light emitting element without leak between the electrodes can be manufactured by the method for manufacturing the nitride semiconductor light emitting element in the first embodiment.

<Second Embodiment>

[Nitride Semiconductor Light Emitting Element]

Figure 6:
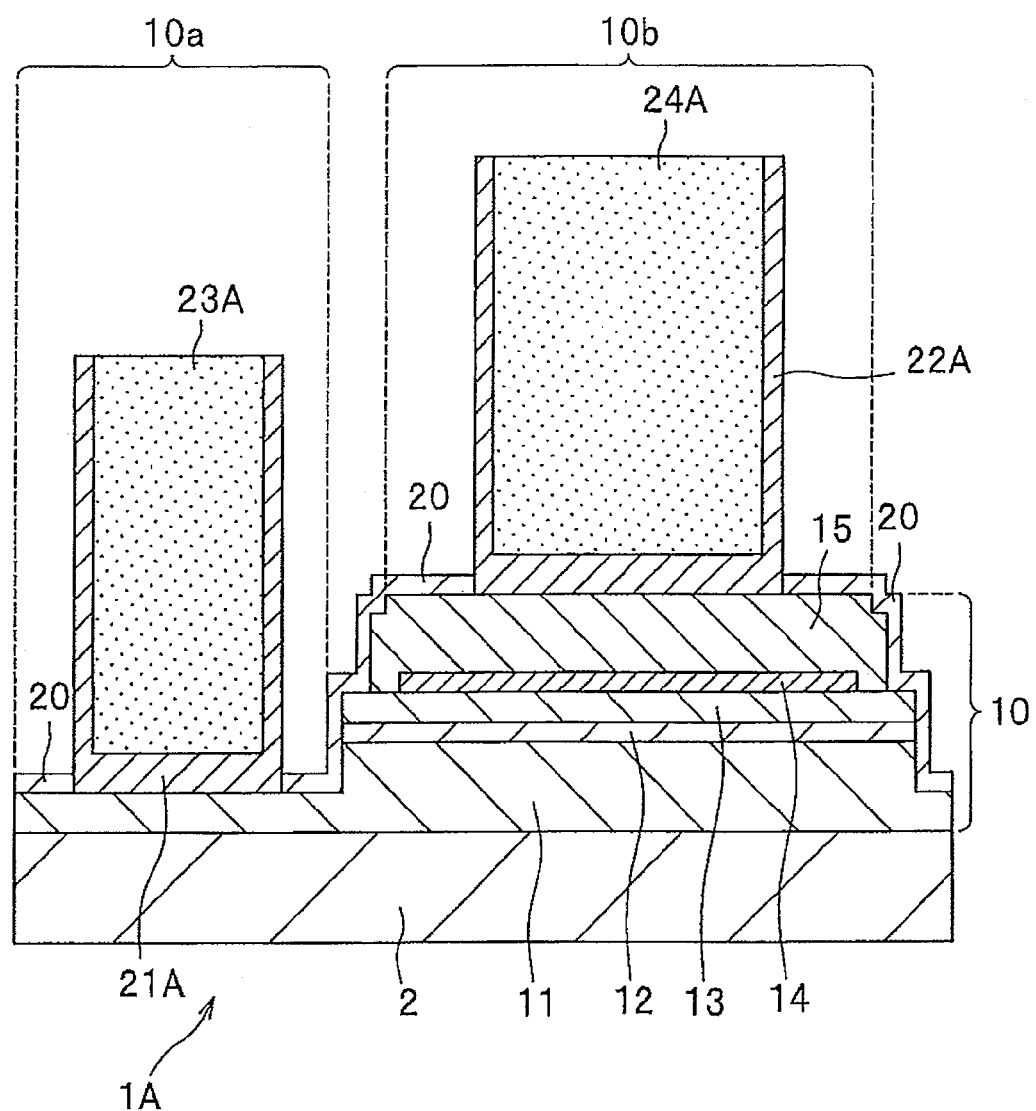
FIG. 6 is a schematic sectional view showing a structure of a nitride semiconductor light emitting element in the second embodiment of the present invention.

A structure of a nitride semiconductor light emitting element in the second embodiment of the present invention will be described with reference to FIG. 6. The nitride semiconductor light emitting element 1A in the present embodiment of the present invention is a flip-chip mounted LED. As shown in FIG. 6, the nitride semiconductor light emitting element 1A in the second embodiment includes the substrate 2, and the nitride semiconductor light emitting element structure 10, the protective layer 20, an n-side electrode 21A, a p-side electrode 22A, a metal bump 23A and a metal bump 24A, which are laminated on the substrate 2. The nitride semiconductor light emitting element 1A in the second embodiment is different from the nitride semiconductor light emitting element 1 in the first embodiment as shown in FIG. 1 in that the n-side electrode 21A, the p-side electrode 22A, the metal bump 23A and the metal bump 24A are provided in place of the n-side electrode 21, the p-side electrode 22, the metal bump 23 and the metal bump 24. The same constituents as those in the nitride semiconductor light emitting element 1 in the first embodiment are given the same reference numerals and description thereof is omitted as appropriate.

The substrate 2, the nitride semiconductor light emitting element structure 10, and the n-type nitride semiconductor layer 11, the active layer 12, the p-type nitride semiconductor layer 13, the full surface electrode 14, the cover electrode 15 and the protective layer 20 as constituents of the nitride semiconductor light emitting element structure 10 are the same as those in nitride semiconductor light emitting element 1 in the first embodiment and thus, description thereof is omitted.

(N-side Electrode, P-Side Electrode)

As shown in FIG. 6, in the nitride semiconductor light emitting element 1A in the second embodiment, the n-side electrode 21A and the p-side electrode 22A are pad electrodes that are connected to the n-type nitride semiconductor layer 11 and to the p-type nitride semiconductor layer 13 via the cover electrode 15 and the full surface electrode 14, respectively, to supply a current to the nitride semiconductor light emitting element 1 from the outside. The n-side electrode 21A is provided in the n-side electrode connection surface 10a as the upper surface of the n-type nitride semiconductor layer 11 of the nitride semiconductor light emitting element structure 10. The p-side electrode 22A is provided in the p-side electrode connection surface 10b as the upper surface of the cover electrode 15 of the nitride semiconductor light emitting element structure 10. The metal bump 23A and the metal bump 24A are provided on upper surfaces of the n-side electrode 21A and the p-side electrode 22A, respectively. Further, the n-side electrode 21A and the p-side electrode 22A coat side surfaces of the metal bump 23A and the metal bump 24A, respectively.

As in the first embodiment, materials for the n-side electrode 21A and the p-side electrode 22A are preferably, materials having a low electrical resistance, and a monolayer or multi-layered film of metal such as Au, Cu, Ni, Al, Pt and alloys thereof can be used. The n-side electrode 21A and the p-side electrode 22A each may be, for example, a multi-layered film having a Cu monolayer or a Cu/Ni laminated film as a lower layer and an Au or AuSn alloy as an upper layer.

In order to obtain good electrical contact between the n-side electrode 21A and the n-type nitride semiconductor layer 11, it is preferable to use Ti, Al, AlCuSi alloy, or the like, as the lowermost layer of the n-side electrode 21A. A multi-layer film, such as Ti/Au, Al/Ti/Au, Al/Ti/Pt/Au, Ti/Pt/Au, AlCuSi/Ti/Pt/Au, or the like, the leftmost being the lowermost layer, can be employed. In cases where an AlCuSi/Ti/Pt/Au multilayer film, the AlCuSi alloy being the lowermost layer, is used, the thicknesses of individual layers can be 500 nm, 150 nm, 50 nm, and 700 nm, respectively, for example.

The side surfaces of the metal bumps 23A, 24A reflect light leaked from the upper surface and the side surface of the nitride semiconductor light emitting element structure 10, of light emitted from the active layer 12, returns at least of a part of the light to the nitride semiconductor light emitting element structure 10 and allows the light to be emitted from the light extraction surface. Accordingly, it is preferred that the surfaces of the n-side electrode 21A and the p-side electrode 22A, which coat the side surfaces of the metal bump 23A and the metal bump 24A, are made of a material having a higher reflectance with respect to the wavelength of light emitted from the active layer 12 than the material for the metal bump 23A, 24A. Thus, since the n-side electrode 21A and the p-side electrode 22A that coat the side surfaces of the metal bumps 23A, 24A efficiently reflect light, the amount of light emitted from the light extraction surface can be increased, and thus contributing to an improvement in light extraction efficiency.

Examples of such metal having a high reflectance include Al. Accordingly, it is preferred that metal having a high reflectance such as Al is used in at least lowermost layers of the n-side electrode 21A and the p-side electrode 22A, that is, outermost layers on side surfaces of the metal bumps 23A, 24A. In the case where the metal bump 23A, 24A are multi-layered films, it is preferred that the n-side electrode 21A and the p-side electrode 22A are made of a material having a higher reflectance than the other layers in the multi-layered films, but may be made of a material having a higher reflectance than the reflectance of metal in the layers that contribute to the reflectance of the side surfaces of the metal bumps 23A, 24A most, that is, the thickest layers.

(Metal Bump)

The metal bump 23A and the metal bump 24A are provided on upper surfaces of the n-side electrode 21A and the p-side electrode 22A, respectively, in contact with the respective electrodes. Further, the side surfaces of the metal bump 23A and the metal bump 24A are coated with the n-side electrode 21A and the p-side electrode 22A, respectively.

The metal bump 23A and the metal bump 24A are electrode connection layers for electrically connecting the n-side electrode 21A and the p-side electrode 22A of the nitride semiconductor light emitting element 1A to the wiring electrodes on the mounting substrate (not shown). That is, in flip-chip mounting the nitride semiconductor light emitting element 1A to the mounting substrate (not shown), the n-side electrode 21A and the p-side electrode 22A are placed as opposed to the wiring electrodes (not shown) on the mounting substrate, and the metal bump 23A and the metal bump 24A are pressed in contact with the wiring electrodes to electrically connect the n-side electrode 21A and the p-side electrode 22A to the wiring electrodes on the mounting substrate (not shown).

The metal bumps 23A, 24A are formed by electrolytic plating using the n-side electrode 21A and the p-side electrode 22A as seed electrodes. The same materials for the metal bumps 23A, 24A as those in the first embodiment can be used, and in flip-chip mounting, in order to achieve highly-reliable mounting with less faulty connection, it is preferred that the metal bumps 23A, 24A each have a thickness of 10 µm or more.

[Operation of Nitride Semiconductor Light Emitting Element]

In the nitride semiconductor light emitting element 1A in the second embodiment of the present invention as shown in FIG. 6, when a current is supplied to the n-side electrode 21A and the p-side electrode 22A via the wiring electrodes (not shown) on the mounting substrate connected thereto via the metal bump 23A and the metal bump 24A, respectively, the active layer 12 of the nitride semiconductor light emitting element structure 10 emits light. The light emitted from the active layer 12 is extracted from the side of the back surface of the substrate 2. Among the light emitted from the active layer 12, light advancing to the front surface of the substrate 2 is reflected on the full surface electrode 14 that functions as the reflective layer, and is extracted from the side of the back surface of the substrate 2 as the light extraction surface. Among the light emitted from the active layer 12, a part of light leaking from the upper surface and the side surface of the nitride semiconductor light emitting element structure 10 is reflected on the n-side electrode 21A and the p-side electrode 22A that coat side surfaces of the metal bump 23A and the metal bump 24A, respectively, returns to the nitride semiconductor light emitting element structure 10 and is extracted from the light extraction surface.

[Manufacturing Method of Nitride Semiconductor Light Emitting Element]

A manufacturing method of the nitride semiconductor light emitting element in the second embodiment of the present invention will be described with reference to the accompanying drawings.

Figure 7:
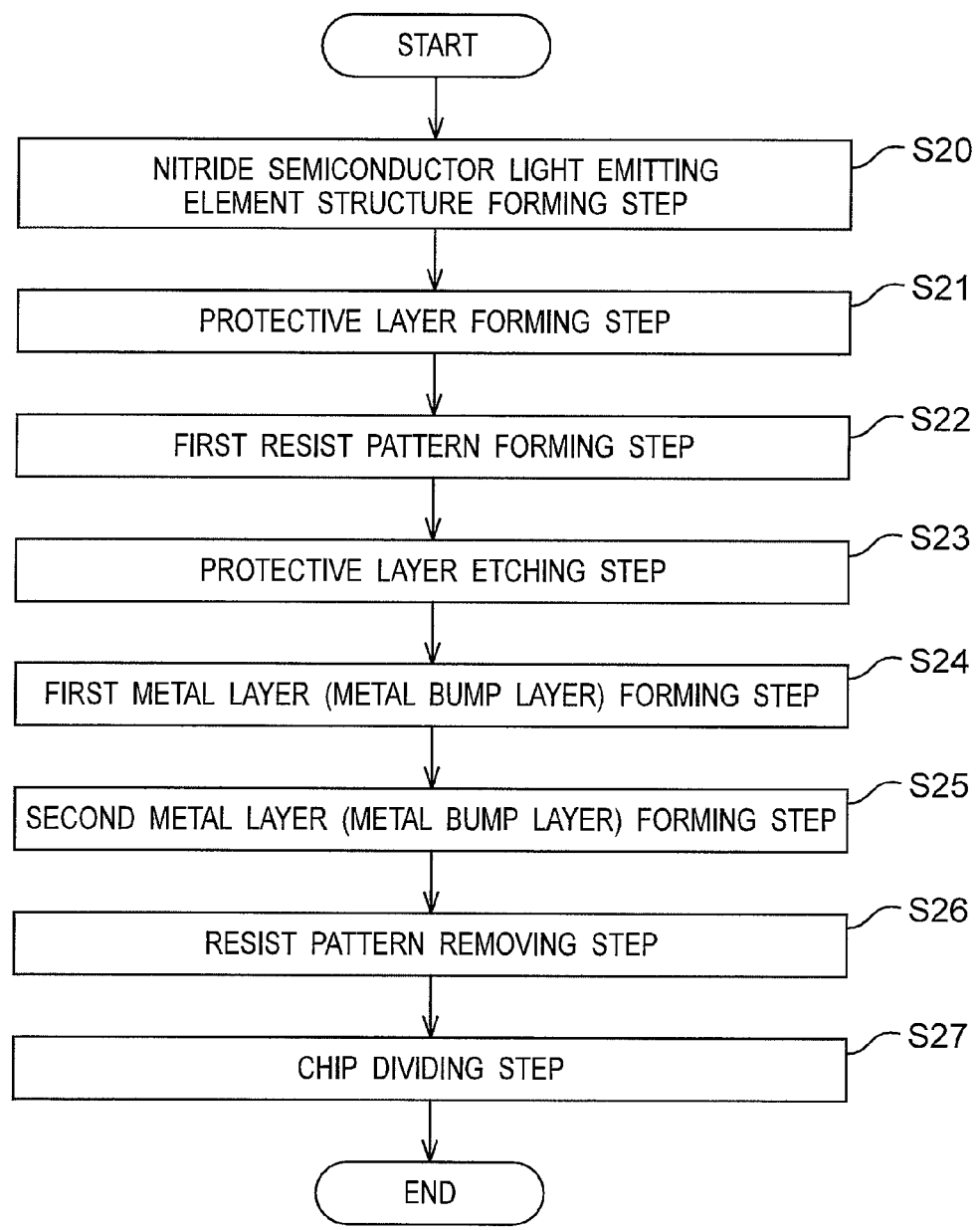
FIG. 7 is a flow chart showing a flow of a manufacturing method of the nitride semiconductor light emitting element in the second embodiment of the present invention.

As shown in FIG. 7, the manufacturing method of the nitride semiconductor light emitting element in the second embodiment includes a nitride semiconductor light emitting element structure forming step (S20), a protective layer forming step (S21), a resist pattern forming step (S22), a protective layer etching step (S23), a first metal layer forming step (S24), a second metal layer forming step (S25), a resist pattern removing step (S26) and a chip dividing step (S27).

Each of the steps will be described in detail with reference to FIG. 8 and FIG. 9 (refer to FIG. 6 and FIG. 7 as appropriate).

(Nitride Semiconductor Light Emitting Element Structure Forming Step: S20)

Figure 8A:
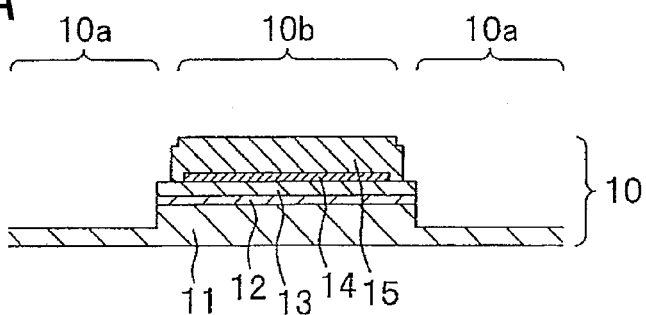

The nitride semiconductor light emitting element structure forming step (S20) in the second embodiment as shown in FIG. 8A is the same as the nitride semiconductor light emitting element structure forming step (S10: refer to FIG. 2 and FIG. 3A) in the first embodiment as shown in FIG. 3A and thus, description thereof is omitted.

(Protective Layer Forming Step: S21)

Figure 8B:
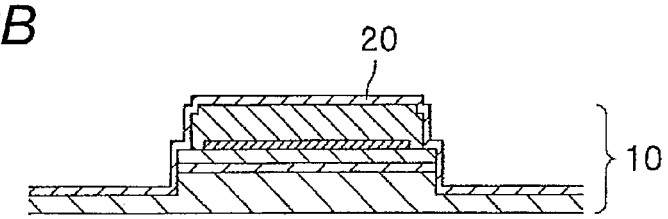

Next, as shown in FIG. 8B, for example, insulating $SiO_2$ is laminated on the entire surface of the nitride semiconductor light emitting element structure 10 by sputtering to form the protective layer 20. This step is the same as the protective layer forming step (S11, refer to FIG. 2 and FIG. 3B) in the first embodiment.

(Resist Pattern Forming Step: S22)

Figure 8C:
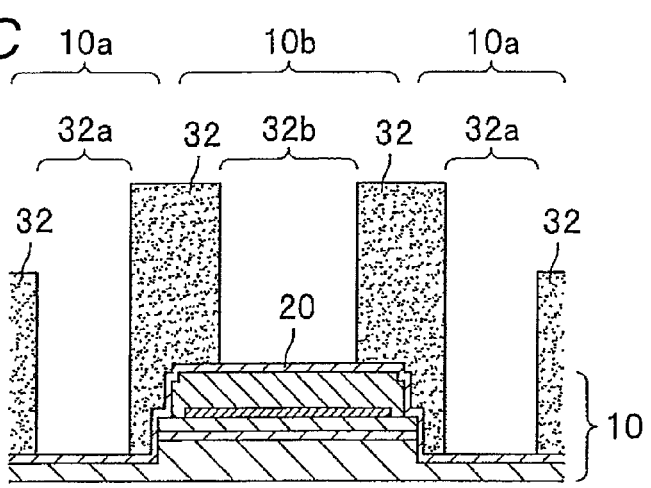

Next, as shown in FIG. 8C, a resist pattern 32 having an opening 32a in a region where the n-side electrode 21A and an opening 32b in a region where the p-side electrode 22A is formed is formed by photolithography. Since the resist pattern 32 is used to form the n-side electrode 21A and the p-side electrode 22A as well as to form the metal bumps 23A, 24A by electrolytic plating, a thickness of the resist pattern 32 is larger than a thickness of each of the metal bumps 23A, 24A.

(Protective Layer Etching Step: S23)

Figure 8D:
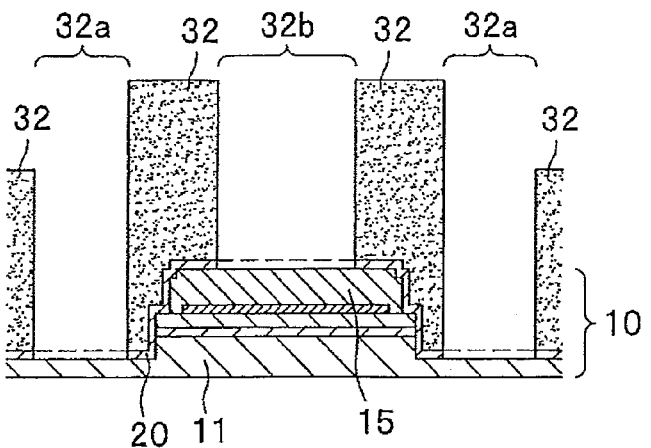

As shown in FIG. 8D, using the resist pattern 32 as a mask, the protective layer 20 in the opening 32a and the opening 32b is etched to expose the n-type nitride semiconductor layer 11 and the cover electrode 15.

(First Metal Layer (Pad Electrode Layer) Forming Step: S24)

Figure 9A:
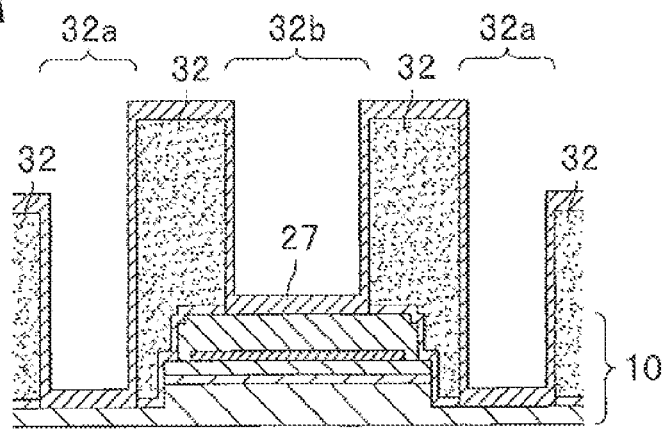

As shown in FIG. 9A, a mono-layered film of Au, Cu or the like or a multi-layered film of AlCuSi/Ti/Pt/Au or the like is formed by sputtering as a first metal layer (pad electrode layer) 27 that becomes the n-side electrode 21A and the p-side electrode 22A as the pad electrodes. At this time, it is preferred to form a multi-layered film or a mono-layered film that includes an Al lowermost layer having a high reflectance with respect to the wavelength of light emitted from the active layer 12. The first metal layer 27 is formed in the regions where the n-side electrode 21A and the p-side electrode 22A are formed as well as on the resist pattern 32, so that the entire surface of the first metal layer 27 is electrically conducting.

According to the manufacturing method in the second embodiment, the resist pattern 32 is not removed and is also used in the following second metal layer forming step (S25). Thereby, the first metal layer 27 remains while the entire surface including the first metal layer 27 that becomes the n-side electrode 21A and the first metal layer 27 that becomes the p-side electrode 22A is electrically conducting. Therefore, the first metal layer 27 can be used as seed electrodes for electrolytic plating for forming second metal layers 28a, 28b that become the metal bumps 23A, 24A, respectively, in the second metal layer forming step (S25). That is, according to the manufacturing method in the second embodiment of the present invention, as distinct from a below-mentioned manufacturing method in the third embodiment, it is no needed to form the third metal layer 29 (refer to FIG. 13C) as the seed electrodes and therefore, the manufacturing process can be shortened. Further, the first metal layer 27 is formed in regions other than regions where the n-side electrode 21A and the p-side electrode 22A are formed via the resist pattern 32, and the first metal layer 27 is not formed directly on the protective layer 20. Therefore, after removing the resist pattern 32 in a downstream process, there is no possibility that a metal film remains on the protective layer 20 to cause leakage.

(Second Metal Layer (Metal Bump Layer) Forming Step: S25)

Figure 9B:
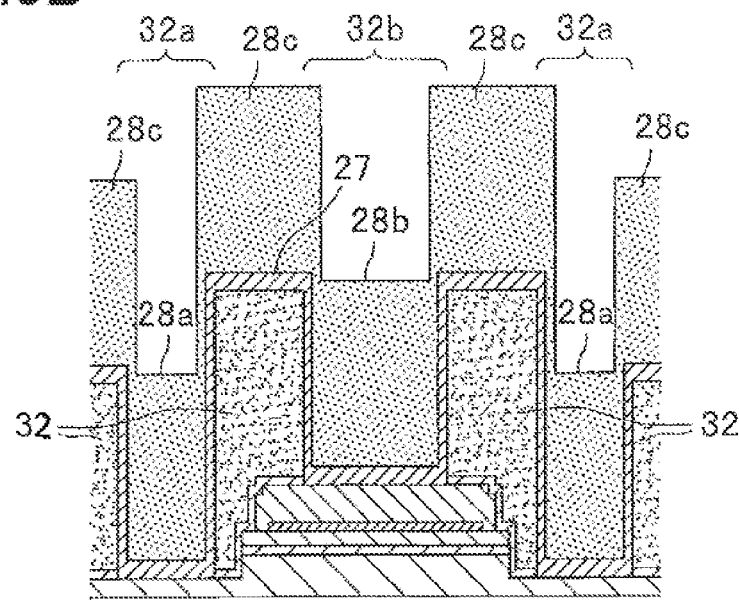

As shown in FIG. 9B, by performing electrolytic plating using the first metal layer 27 as the seed electrodes and stacking a mono-layered film of Cu, Au or the like or a multi-layered film of Cu/Ni/Au or the like, the second metal layer 28a that becomes the metal bump 23A and the second metal layer 28b that becomes the metal bump 24A are formed on the first metal layer 27 in the opening 32a and the opening 32b of the resist pattern 32. Further, a second metal layer 28c is further formed on the first metal layer 27 on the resist pattern 32. Electrolytic plating is performed by immersing the wafer subjected to the first metal layer forming step (S24) shown in FIG. 9A in a plating solution, using the first metal layer 27 as a negative electrode and passing a current between the negative electrode and a positive electrode (not shown) immersed in the plating solution.

According to the manufacturing method in the second embodiment, the second metal layers 28a, 28b that become metal bumps 23A, 24A are formed by electrolytic plating using the first metal layer 27 that becomes the n-side electrode 21A and the p-side electrode 22A as seed electrodes. Thus, in the nitride semiconductor light emitting element 1A manufactured according to the manufacturing method in the second embodiment, the n-side electrode 21A and the p-side electrode 22A are directly bonded to the metal bump 23A and the metal bump 24A, respectively, without interposing any excessive metal layer. Therefore, as distinct from the case where metal layers having a relatively high resistance are used as seed electrodes, there is no possibility that electrical resistances between the n-side electrode 21A and the metal bump 23A and between the p-side electrode 22A and the metal bump 24A become high due to the interposed metal layers.

(Resist Pattern Removing Step: S26)

Figure 9C:
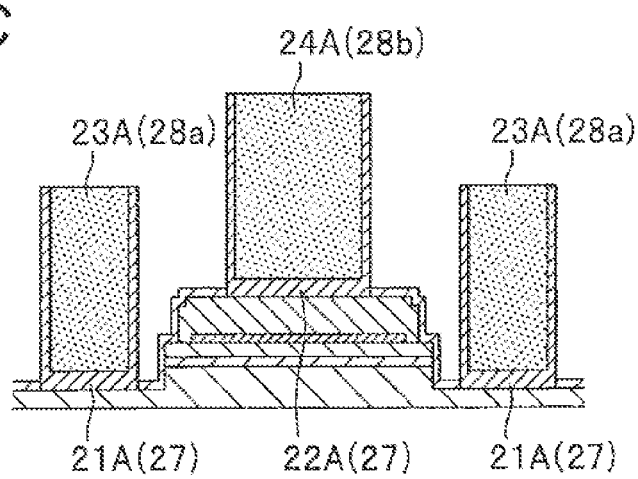

As shown in FIG. 9C, when the resist pattern 32 is removed, together with the resist pattern 32, the first metal layer 27 and the second metal layer 28c, which are formed on the resist pattern 32, are removed (lift-off). The n-side electrode 21A, the p-side electrode 22A, the metal bump 23A and the metal bump 24A are formed so as to have predetermined shape. At this time, the side surfaces of the metal bump 23A, 24A are coated with the first metal layers 27 formed on the side surface of the resist pattern 32 in the first metal layer forming step (S24). According to the above-mentioned steps, the plurality of nitride semiconductor light emitting elements 1A arranged in a matrix are formed on the substrate 2.

According to the manufacturing method in the second embodiment, since the first metal layer 27 that becomes the seed electrode for electrolytic plating are not formed directly on the protective layer 20, the first metal layers 27 can be completely removed with removal of the resist pattern 32. Therefore, in the nitride semiconductor light emitting element 1A manufactured by the manufacturing method in the second embodiment, there is no possibility that a current leaks between the n-side electrode 21A and the p-side electrode 22A, and between the electrodes and the wiring on the mounting substrate, achieving the highly-reliable nitride semiconductor light emitting element 1A.

The side surfaces of the metal bumps 23A, 24A are coated with the first metal layer 27, that is, the n-side electrode 21A and the p-side electrode 22A, respectively. Therefore, when at least the lowermost layer of the first metal layer 27, that is, the outermost layer of the first metal layer 27, which coats the side surfaces of the metal bumps 23A, 24A, is made of a material having a higher reflectance with respect to the wavelength of light emitted from the active layer 12 than the material for the side surfaces of the metal bumps 23A, 24A, light leaking from the nitride semiconductor light emitting element structure 10 is efficiently reflected and returned to the nitride semiconductor light emitting element structure 10 and therefore, the light extraction efficiency of the nitride semiconductor light emitting element 1A can be improved.

(Chip Dividing Step: S27)

As in the chip dividing step (S19, refer to FIG. 2) in the first embodiment, by dividing the plurality of nitride semiconductor light emitting elements 1A arranged on the substrate 2 into chips by scribing or dicing, the nitride semiconductor light emitting elements 1A in units of chips are completed.

As described above, according to the manufacturing method of the nitride semiconductor light emitting element in the second embodiment of the present invention, the manufacturing process can be shortened. Moreover, in the nitride semiconductor light emitting element 1A manufactured by the manufacturing method in the second embodiment, there is no possibility that a current leaks between the electrodes, achieving the highly-reliable nitride semiconductor light emitting element. Further, when at least the lowermost layers of the n-side electrode 21A and the p-side electrode 22A are made of a material having a higher reflectance with respect to the wavelength of light emitted from the active layer 12 than a reflectance of the side surfaces of the metal bumps 23A, 24A, the light extraction efficiency of the nitride semiconductor light emitting element 1A can be improved.

<Modification of Second Embodiment>

Although all of the side surfaces of the metal bumps 23A, 24A are coated with the first metal layer 27 in the second embodiment, the present invention is not limited thereto, a part of the side surfaces of the metal bumps 23A, 24A may be coated with the first metal layer 27. Thereby, the part coated with the first metal layer 27 having a higher reflectance with respect to the wavelength of light emitted from the active layer 12 than the reflectance of metal constituting the side surfaces of the metal bumps 23A, 24A efficiently reflects light leaking from the nitride semiconductor light emitting element structure 10, which contributes to improvement of the light extraction efficiency.

Such nitride semiconductor light emitting element having the structure in which a part of the side surfaces of the metal bumps 23A, 24A is coated with the first metal layer 27 can be manufactured by modifying the manufacturing method in the first embodiment. This will be described in detail below. In the second resist pattern forming step (S15, refer to FIG. 2) shown in FIG. 4C of the manufacturing method in the first embodiment, the openings 31a, 31b of the second resist pattern 31 are formed so as to be equal to or larger than openings formed in consideration of thickness of the first metal layer 25 formed on the side surface of the first resist pattern 30. Thereby, the first metal layer 25 formed on the side surface of the first resist pattern 30 remains exposed without being coated with the second resist pattern 31. Accordingly, when the second metal layers 26a, 26b that become the metal bumps 23, 24, respectively, in the second metal layer forming step (S16, refer to FIG. 2) in FIG. 5A, the first metal layer 25 formed on the side surface of the first resist pattern 30 is bonded to side surfaces of lower parts of the second metal layers 26a, 26b. After the second resist pattern removing step (S17, refer to FIG. 2) and the first resist pattern removing step (S18, refer to FIG. 2) shown in FIGS. 5B and 5C, side surfaces of the lower parts of the metal bumps 23, 24 are coated with the first metal layers 25.

The operation of the nitride semiconductor light emitting element in the present modification of the second embodiment is the same as that of the nitride semiconductor light emitting element 1A in the second embodiment (refer to FIG. 6), and thus description thereof is omitted.

Although the embodiments of the nitride semiconductor light emitting element and the manufacturing method thereof according to present invention have been described, the present invention is not limited to these embodiments, and various changes and modifications on the basis of the description fall within the scope of the present invention.

<Third Embodiment>

[Nitride Semiconductor Light Emitting Element]

Figure 10:
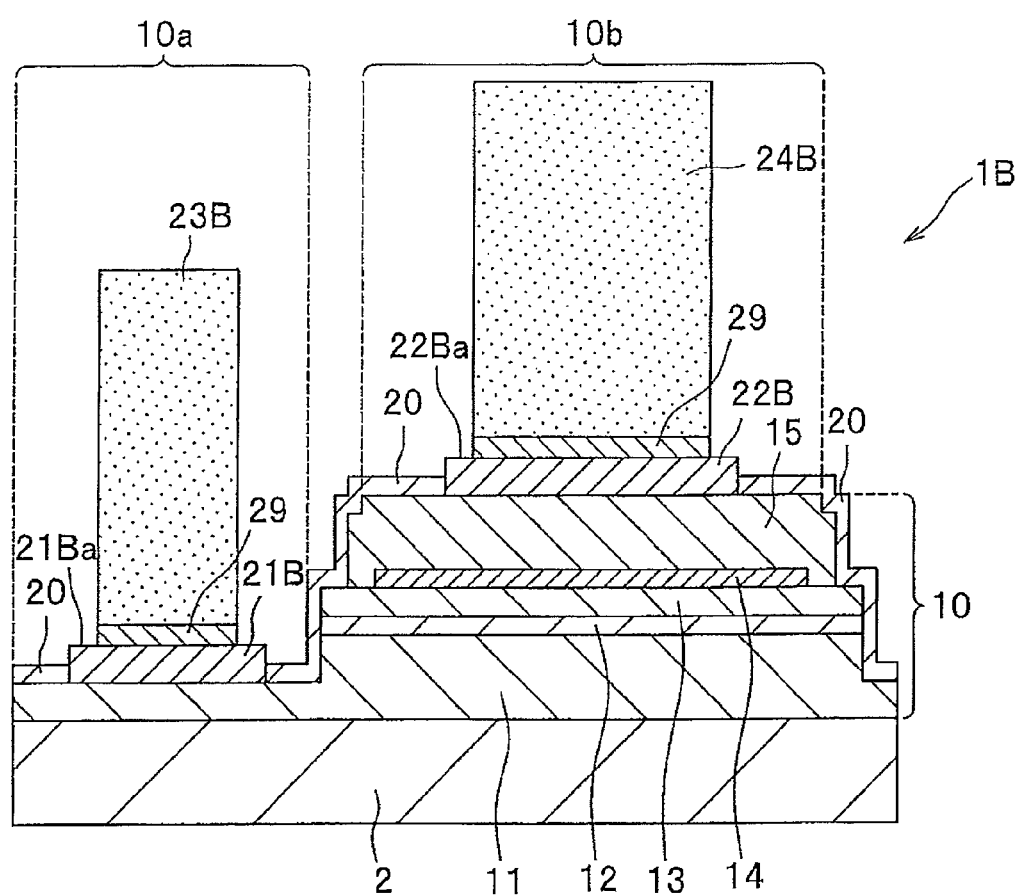
FIG. 10 is a schematic sectional view showing a structure of a nitride semiconductor light emitting element in the third embodiment of the present invention.

A structure of a nitride semiconductor light emitting element in the third embodiment of the present invention will be described in detail below with reference to FIG. 10. The nitride semiconductor light emitting element 1B in the present embodiment of the present invention is a flip-chip mounted LED. As shown in FIG. 10, the nitride semiconductor light emitting element 1B in the third embodiment includes the substrate 2, and the nitride semiconductor light emitting element structure 10, the protective layer 20, an n-side electrode 21B, a p-side electrode 22B, a metal bump 23B and a metal bump 24B, which are laminated on the substrate 2. The nitride semiconductor light emitting element 1B in the third embodiment is different from the nitride semiconductor light emitting element 1 in the first embodiment as shown in FIG. 1 in that the n-side electrode 21B, the p-side electrode 22B, the metal bump 23B, metal bump 24B and third metal layers 29 are provided in place of the n-side electrode 21, the p-side electrode 22, the metal bump 23 and the metal bump 24. The same constituents as those in the nitride semiconductor light emitting element 1 in the first embodiment are given the same reference numerals and description thereof is omitted as appropriate.

The substrate 2, the nitride semiconductor light emitting element structure 10, and the n-type nitride semiconductor layer 11, the active layer 12, the p-type nitride semiconductor layer 13, the full surface electrode 14, the cover electrode 15 and the protective layer 20 as constituents of the nitride semiconductor light emitting element structure 10 are the same as those in nitride semiconductor light emitting element 1 in the first embodiment and thus, description thereof is omitted.

(N-side Electrode and P-Side Electrode)

As shown in FIG. 10, in the nitride semiconductor light emitting element 1B in the third embodiment, the n-side electrode 21B and the p-side electrode 22B are pad electrodes that are electrically connected to the n-type nitride semiconductor layer 11 and to the p-type nitride semiconductor layer 13 via the cover electrode 15 and the full surface electrode 14, respectively, and supply a current to the nitride semiconductor light emitting element 1B from the outside. The n-side electrode 21B is provided in the n-side electrode connection surface 10a as the upper surface of the n-type nitride semiconductor layer 11 of the nitride semiconductor light emitting element structure 10. The A-side electrode 22B is provided in the p-side electrode connection surface 10b as the upper surface of the cover electrode 15 of the nitride semiconductor light emitting element structure 10. The metal bump 23B and the metal bump 24B are provided in the upper surfaces of the n-side electrode 21B and the p-side electrode 22B, respectively, via the third metal layers 29.

As in the first embodiment, materials for the n-side electrode 21B and the p-side electrode 22B are preferably, materials having a low electrical resistance, and a monolayer or multi-layered film of metal such as Au, Cu, Ni, Al, Pt and alloys thereof can be used. The n-side electrode 21B and the p-side electrode 22B each may be, for example, a multi-layered film having a Cu monolayer or a Cu/Ni laminated film as a lower layer and an Au or AuSn alloy as an upper layer.

In order to obtain good electrical contact between the n-side electrode 21B and the n-type nitride semiconductor layer 11, it is preferable to use Ti, Al, AlCuSi alloy, or the like, as the lowermost layer of the n-side electrode 21B. A multi-layer film, such as Ti/Au, Al/Ti/Au, Al/Ti/Pt/Au, Ti/Pt/Au, AlCuSi/Ti/Pt/Au, or the like, the leftmost being the lowermost layer, can be employed. In cases where an AlCuSi/Ti/Pt/Au multilayer film, the AlCuSi alloy being the lowermost layer, is used, the thicknesses of individual layers can be 500 nm, 150 nm, 50 nm, and 700 nm, respectively, for example.

(Metal Bump)

The metal bump 23B and the metal bump 24B are provided in the upper surfaces of the n-side electrode 21B and the A-side electrode 22B, respectively, via the third metal layers 29.

The metal bump 23B and the metal bump 24B are electrode connection layers for electrically connecting the n-side electrode 21B and the p-side electrode 22B of the nitride semiconductor light emitting element 1B to the wiring electrodes on the mounting substrate (not shown), respectively. That is, in flip-chip mounting the nitride semiconductor light emitting element 1B to the mounting substrate (not shown), the n-side electrode 21B and the A-side electrode 22B are placed as opposed to the wiring electrodes (not shown) on the mounting substrate, and the metal bump 23B and the metal bump 24B are pressed in contact with the wiring electrodes to electrically connect the n-side electrode 21B and the p-side electrode 22B to the wiring electrodes on the mounting substrate (not shown).

The metal bumps 23B, 24B are formed by electrolytic plating using the third metal layers 29 as seed electrodes. The thickness of the third metal layers 29 is not specifically limited. The same materials for the metal bumps 23B, 24B as those in the first embodiment can be used, and in flip-chip mounting, in order to achieve highly-reliable mounting with less faulty connection, it is preferred that the metal bumps 23B, 24B each have a thickness of 10 μm or more.

[Operation of Nitride Semiconductor Light Emitting Element]

In the nitride semiconductor light emitting element 1B in the third embodiment of the present invention as shown in FIG. 10, when a current is supplied to the n-side electrode 21B and the p-side electrode 22B via the third metal layers 29 and the wiring electrodes (not shown) on the mounting substrate connected thereto via the metal bump 23B and the metal bump 24B, the active layer 12 of the nitride semiconductor light emitting element structure 10 emits light. The light emitted from the active layer 12 is extracted from the side of the back surface of the substrate 2. Among the light emitted from the active layer 12, light advancing to the front surface of the substrate 2 is reflected on the full surface electrode 14 that functions as a reflective layer and is extracted from the side of the back surface of the substrate 2 as the light extraction surface.

[Manufacturing Method of Nitride Semiconductor Light Emitting Element]

A manufacturing method of the nitride semiconductor light emitting element in the third embodiment of the present invention will be described in detail with reference to the accompanying drawings.

As shown in FIG. 11, the manufacturing method of the nitride semiconductor light emitting element in the third embodiment includes a nitride semiconductor light emitting element structure forming step (S30), a protective layer forming step (S31), a first resist pattern forming step (S32), a protective layer etching step (S33), a first metal layer forming step (S34), a first resist pattern removing step (S35), a third metal layer forming step (S36), a second resist pattern forming step (S37), a second metal layer forming step (S38), a second resist pattern removing step (S39), a third metal layer removing step (S40) and a chip dividing step (S41).

Figure 12A:
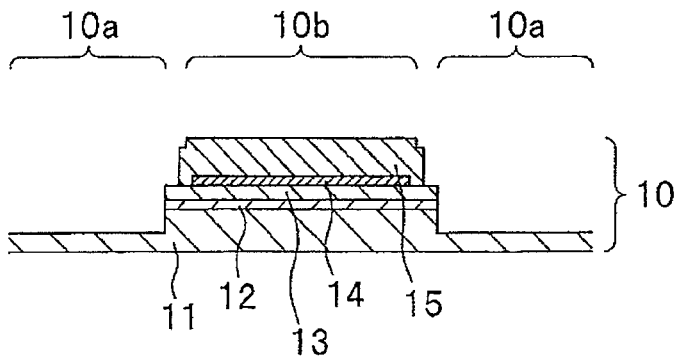
Figure 12B:
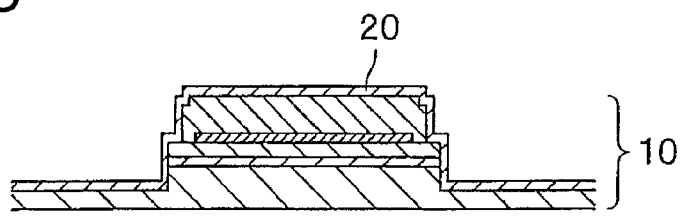
Figure 12C:
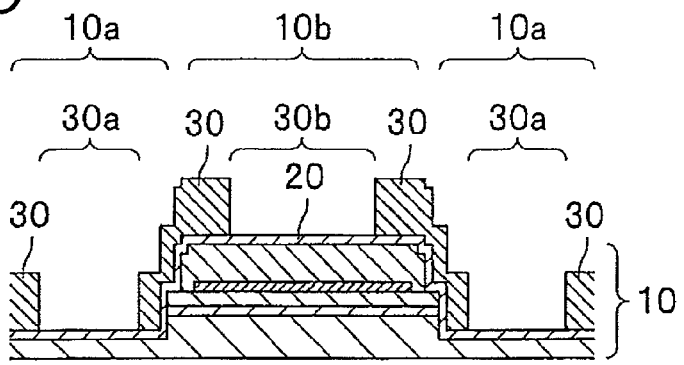
Figure 12D:
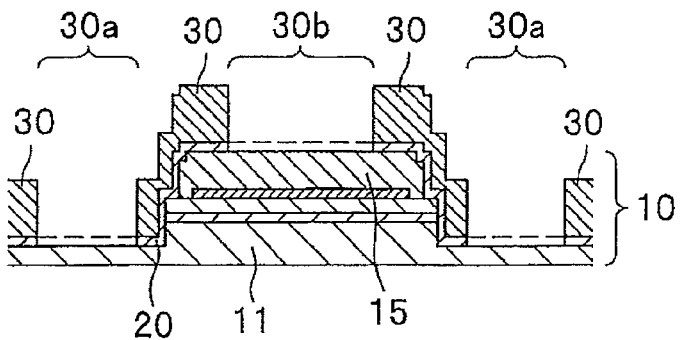
Figure 13A:
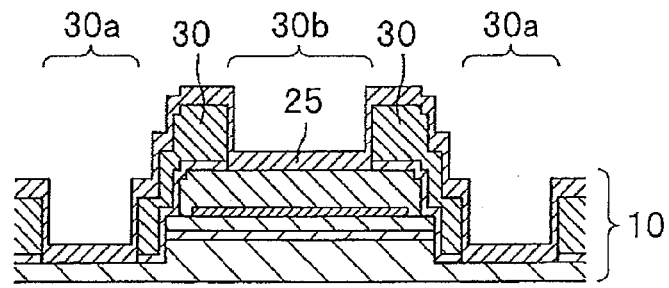
Figure 13B:
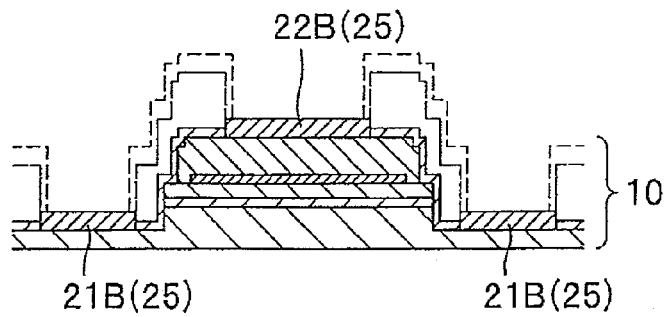
Figure 13C:
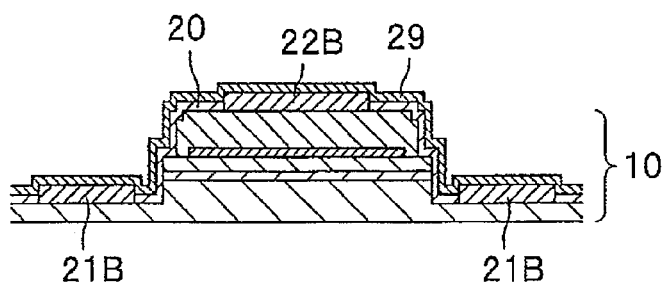
Figure 13D:
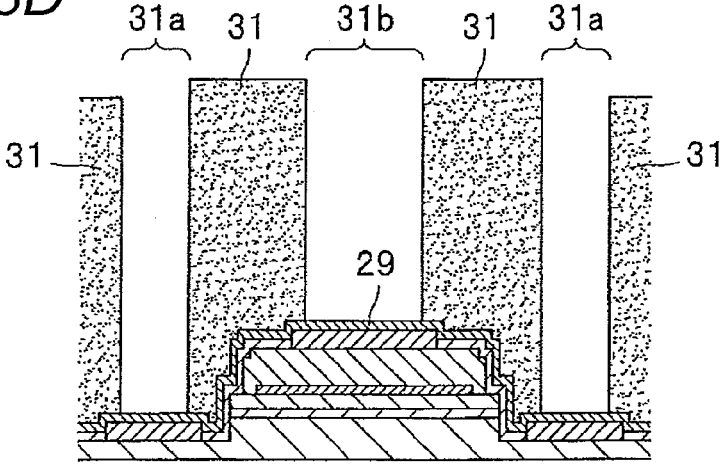
Figure 14A:
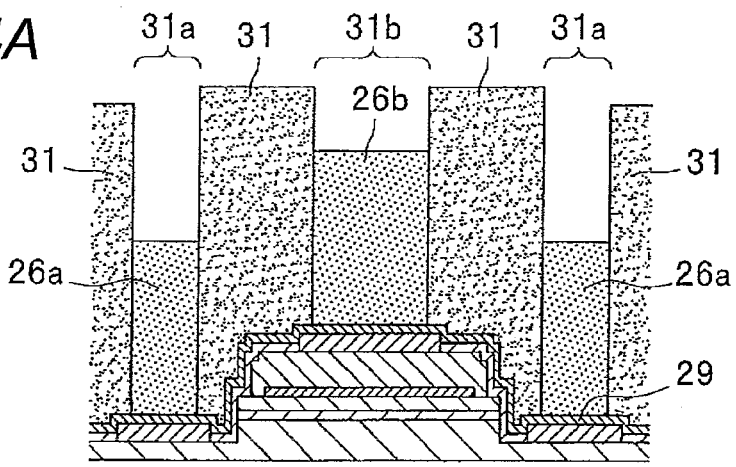
Figure 14B:
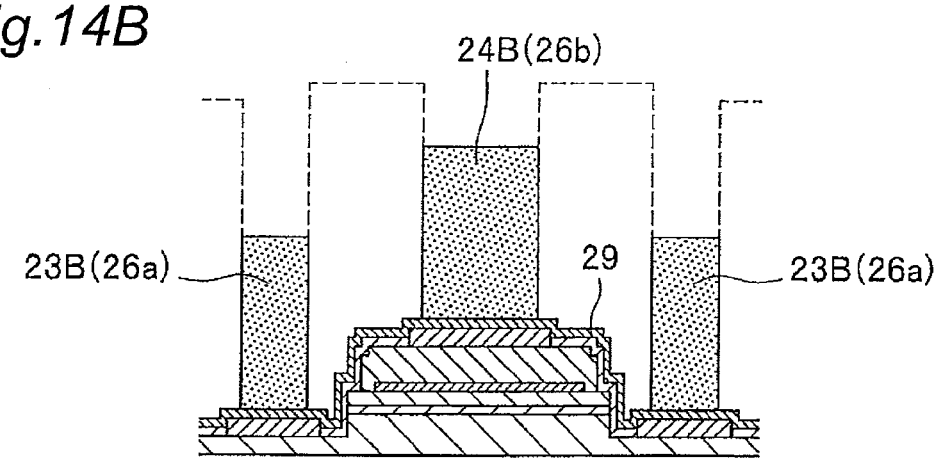
Figure 14C:
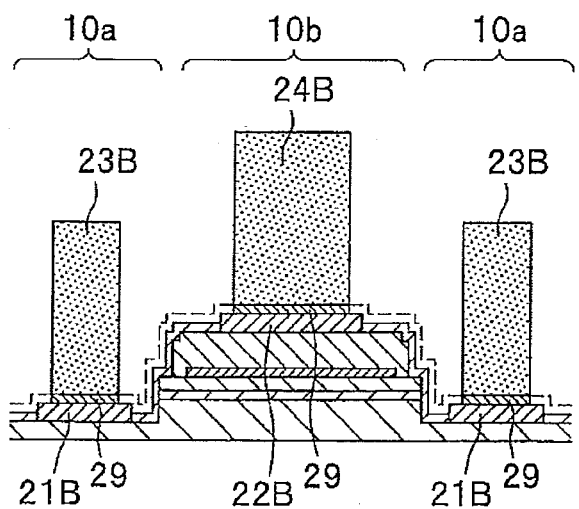
Figures 15A, 15B, 15C, 15D, 15E, 15F, 15G:
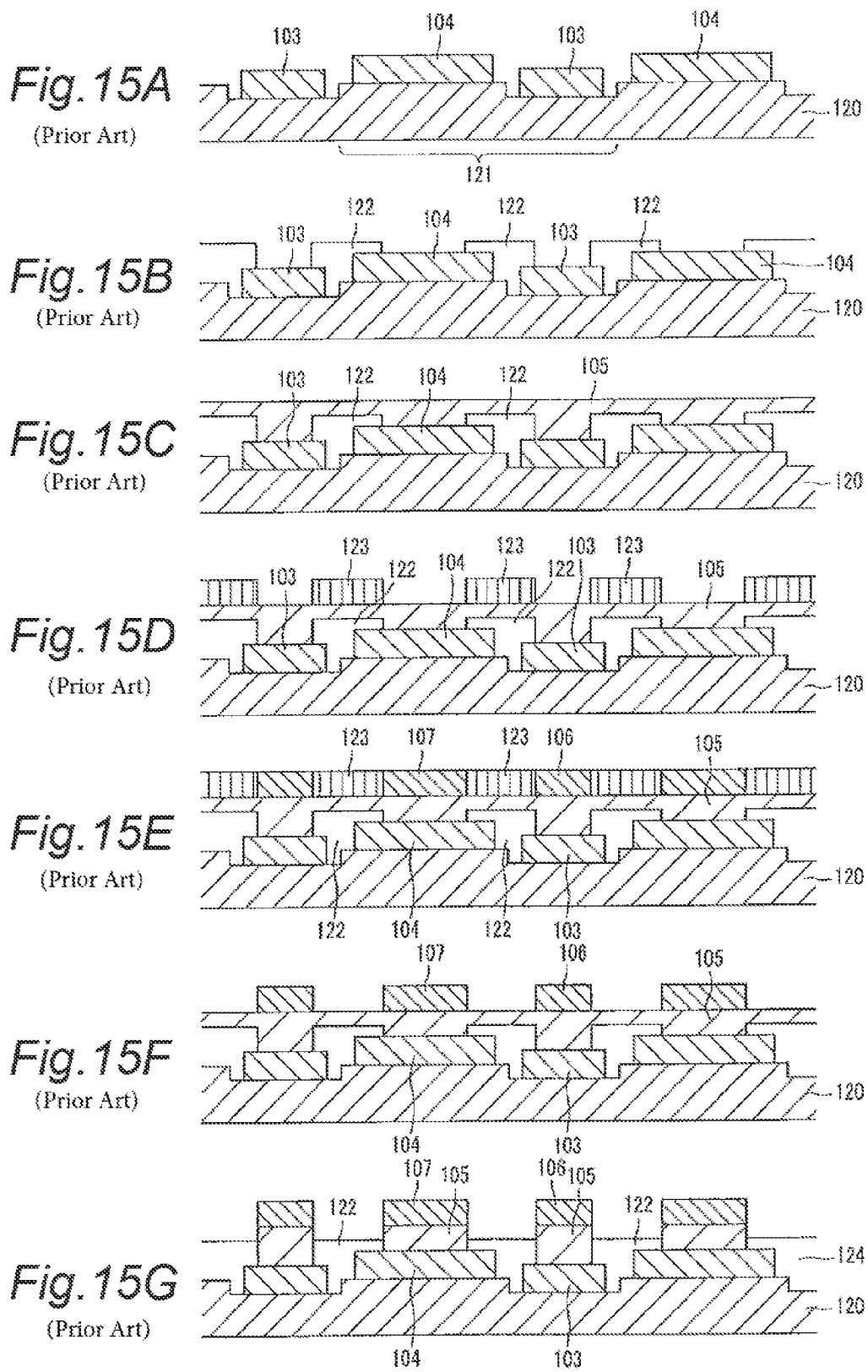
FIGS. 15A-15G are schematic sectional views for describing a manufacturing process of a semiconductor light emitting element having a metal bump according to the prior art, in which FIG. 15A show n-side and p-side electrodes formed on a wafer.

Each of the steps will be described in detail with reference to FIG. 12 to FIG. 14 (refer to FIG. 10 and FIG. 11, as appropriate). FIG. 12 to FIG. 14 are schematic sectional views for describing a manufacturing process of the semiconductor light emitting element having metal bumps in the third embodiment, FIG. 12A shows the nitride semiconductor light emitting element structure, FIG. 12B shows a state where the protective layer is formed, FIG. 12C shows a state where the first resist pattern forming the electrode is formed, FIG. 12D shows a state where the protective layer of the electrode forming part is removed, FIG. 13A shows a state where a first electrode layer is formed, FIG. 13B shows a state where the first resist pattern and the electrode layer on the first resist are removed, FIG. 13C shows a state where the third metal layer (Seed electrode layers) for electrolytic plating is formed, FIG. 13D shows a state where the second resist pattern for forming the metal bump is formed, FIG. 14A shows a state where second metal layer (metal bump layer) is formed, FIG. 14B shows a state where a second resist pattern is removed and FIG. 14C shows a state where the unnecessary third metal layer (Seed electrode layers) is removed.

The manufacturing method of the nitride semiconductor light emitting element in the third embodiment will be described starting from the nitride semiconductor light emitting element structure 10 shown in FIG. 12A. The nitride semiconductor light emitting element structure 10 has a laminated structure in which the n-type nitride semiconductor layer 11, the active layer 12 and the p-type nitride semiconductor layer 13 are laminated on the sapphire substrate (not shown). In the nitride semiconductor light emitting element structure 10, the n-side electrode connection surface 10a as a surface in which the n-type nitride semiconductor layer 11 is exposed for connecting the n-side electrode is partially formed (at both of right and left ends in FIG. 12A), and the full surface electrode 14 and the cover electrode 15 that coat the substantially whole of the upper surface of the p-type nitride semiconductor layer 13 are sequentially laminated on the p-type nitride semiconductor layer 13. In FIG. 12 to FIG. 14, the substrate is hot shown.

In the present example, the upper surface of the cover electrode 15 is the p-side electrode connection surface 10b for connecting the p-side electrode and the p-side electrode 22B (refer to FIG. 13B) is formed on a part of the surface 10b.

The plurality of nitride semiconductor light emitting elements arranged in a matrix are formed on the substrate (not shown), and the completed nitride semiconductor light emitting elements are divided into chips on the substrate (not shown). Although the two n-side electrode connection surfaces 10a are shown in FIG. 12A, one of them belongs to the adjacent nitride semiconductor light emitting element.

(Nitride Semiconductor Light Emitting Element Structure Forming Step: S30)

The nitride semiconductor light emitting element structure forming step (S30) in the third embodiment as shown in FIG. 12A is the same as the nitride semiconductor light emitting element structure forming step (S10: FIG. 2 and refer to FIG. 3A) in the first embodiment as shown in FIG. 3A, and thus description thereof is omitted.

(Protective Layer Forming Step: S31)

As shown in FIG. 12B, for example, insulating $SiO_2$ is laminated on the entire surface of the nitride semiconductor light emitting element structure 10 by sputtering or the like to form the protective layer 20. This step is the same as the protective layer forming step (S11, refer to FIG. 2 and FIG. 3B) in the first embodiment.

(First Resist Pattern Forming Step: S32)

Next, as shown in FIG. 12C, the first resist pattern 30 having the opening 30a in the region where the n-side electrode is formed and the opening 30b in the region where the p-side electrode is formed by photolithography.

(Protective Layer Etching Step: S33)

As shown in FIG. 12D, using the first resist pattern 30 as a mask, the protective layer 20 in the opening 30a and the opening 30b is removed to expose the n-type nitride semiconductor layer 11 and the cover electrode 15.

(First Metal Layer (Pad Electrode Layer) Forming Step: S34)

As shown in FIG. 13A, a mono-layered film of Au, Cu or the like or a multi-layered film of AlCuSi/Ti/Pt/Au or the like is formed by sputtering as the first metal layers (pad electrode layers) 25 that become the n-side electrode 21B and the p-side electrode 22B as the pad electrodes. At this time, it is preferred to form a multi-layered film or a mono-layered film that includes an Al lowermost layer having a high reflectance with respect to the wavelength of light emitted from the active layer 12. The first metal layer 25 is formed in the regions where the n-side electrode 21B and the p-side electrode 22B are formed as well as on the resist pattern 30.

(First Resist Pattern Removing Step: S35)

As shown in FIG. 13B, by removing the first resist pattern 30, the unnecessary first metal layer 25 formed on the first resist pattern 30 is removed (lift-off). As a result, the remaining first metal layer 25 becomes the n-side electrode 21B and the p-side electrode 22B.

(Third Metal Layer (Metal Seed Layer) Forming Step: S36)

As shown in FIG. 13C, the third metal layer 29 that becomes the seed electrodes for forming the metal bumps is formed by sputtering or the like.

(Second Resist Pattern Forming Step: S37)

As shown in FIG. 13D, the second resist pattern 31 having the opening 31a and the opening 31b in regions where the metal bumps are formed is formed by photolithography.

(Second Metal Layer (Metal Bump Layer) Forming Step: S38)

As shown in FIG. 14A, by performing electrolytic plating using the third metal layer 29 as the seed electrodes, a mono-layered film of Cu, Au or the like or a multi-layered film of Cu/Ni/Au or the like is laminated to form the second metal layer 26a and the second metal layer 26b on the third metal layer 29 in the opening 31a and the opening 31b of the second resist pattern 31. At this time, since electrolytic plating is performed using the third metal layer 29 as the seed electrodes, the second metal layer is not formed on the second resist pattern 31. Electrolytic plating is performed by immersing the wafer subjected to the second resist pattern forming step (S37) shown in FIG. 14A in a plating solution, using the third metal layer 29 as negative electrodes and passing a current between the negative electrode and a positive electrode (not shown) immersed in a plating solution.
(Second Resist Pattern Removing Step: S39)

As shown in FIG. 14B, when the second resist pattern 31 is removed, the second metal layer 26a and the second metal layer 26b appear as the metal bump 23 and the metal bump 24, respectively.
(Third Metal Layer (Metal Seed Layer) Removing Step: S40)

As shown in FIG. 14C, by etching using the metal bump 23 and the metal bump 24 as masks, the unnecessary third metal layer 29 is removed to form the nitride semiconductor light emitting element.
(Chip Dividing Step: S41)

Further, by dividing the nitride semiconductor light emitting elements arranged on the substrate (not shown) in a matrix into chips by dicing or the like, the nitride semiconductor light emitting elements in units of chips are completed.
<Fourth Embodiment>
[Nitride Semiconductor Light Emitting Element]

Figure 16A:
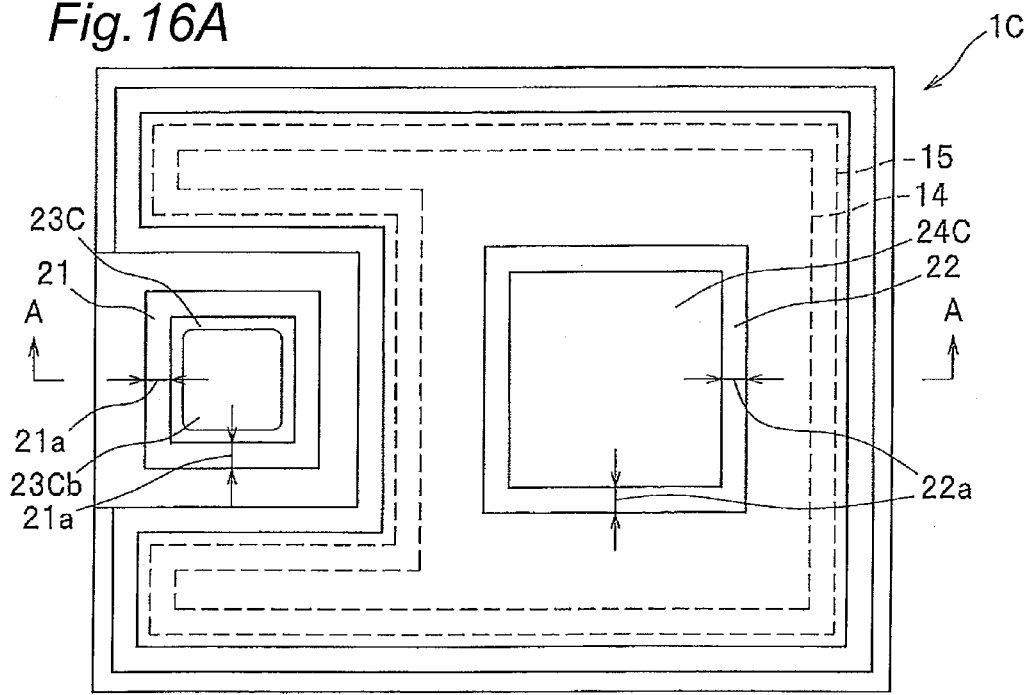
Figure 16B:
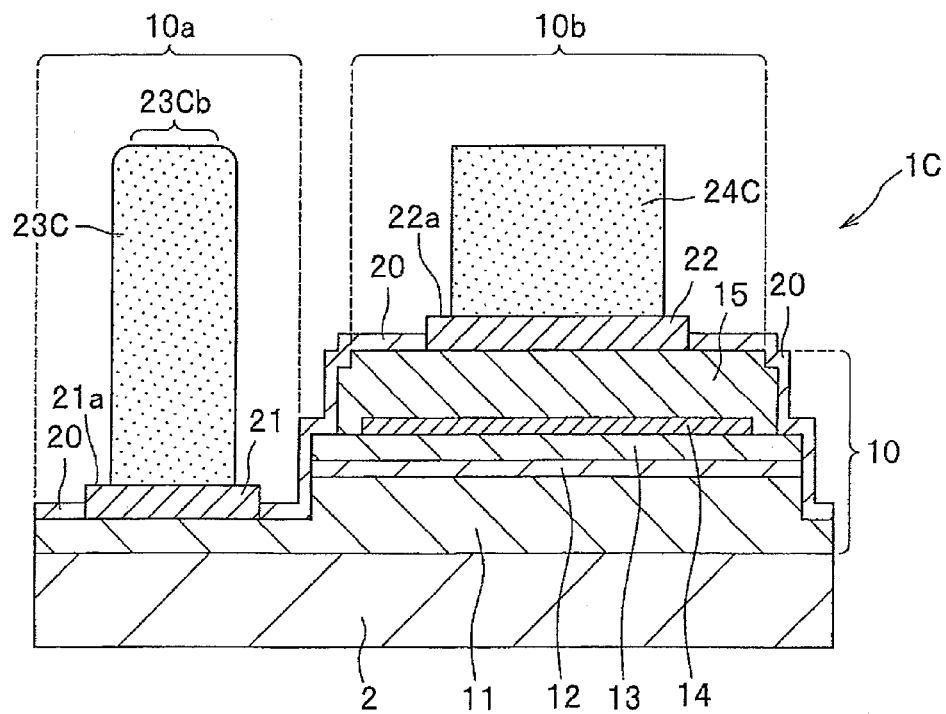

A structure of a nitride semiconductor light emitting element in the fourth embodiment of the present invention will be described with reference to FIG. 16. The nitride semiconductor light emitting element 1C in the present embodiment of the present invention is a flip-chip mounted LED. As shown in FIG. 16, the nitride semiconductor light emitting element 1C in the fourth embodiment includes the substrate 2, and the nitride semiconductor light emitting element structure 10, the protective layer 20, the n-side electrode 21, the p-side electrode 22, a metal bump 23 and a metal bump 24C, which are laminated on the substrate 2. The nitride semiconductor light emitting element 1C in the fourth embodiment is different from the nitride semiconductor light emitting element 1 in the first embodiment as shown in FIG. 1 in that the metal bump 23C and the metal bump 24C are provided in place of the metal bump 23 and the metal bump 24, respectively. The same constituents as those in nitride semiconductor light emitting element 1 in the first embodiment are given the same reference numerals, and description thereof is omitted.

The substrate 2, the nitride semiconductor light emitting element structure 10, and the n-type nitride semiconductor layer 11, the active layer 12, the p-type nitride semiconductor layer 13, the full surface electrode 14, the cover electrode 15 and the protective layer 20 as constituents of the nitride semiconductor light emitting element structure 10 are the same as those in nitride semiconductor light emitting element 1 in the first embodiment and thus, description thereof is omitted. Further, the n-side electrode 21 and the p-side electrode 22 are the same as those in the nitride semiconductor light emitting element 1 in the first embodiment and thus, description thereof is omitted.
(Metal Bump)

The metal bump 23C and the metal bump 24C are provided on the upper surfaces of the n-side electrode 21 and the A-side electrode 22 and are in contact with the respective electrodes. These metal bumps are different from the metal bump 23 and the metal bump 24 in the first embodiment in that a height from the upper surface of the substrate 2 to an upper surface of the metal bump 23C is almost same as a height from the upper surface of the substrate 2 to an upper surface of the metal bump 24C.

An outer edge of an upper end of the metal bump 23C provided on the n-side electrode 21 is rounded, and an area of an upper surface 23Cb is smaller than an area of a cross section of a central part of the metal bump 23C, which is parallel to the upper surface of the substrate 2. That is, the upper surface 23Cb of the metal bump 23C is flat and corners of its upper end are rounded. On the other hand, an outer edge of an upper end of the metal bump 24C provided on the p-side electrode 22 remains pointed, and the shape of an upper surface of the metal bump 24C is the same as the shape of a cross section of a central part of the metal bump 24C, which is parallel to the upper surface of the substrate 2.

In the same manner as in the metal bump 23 and the metal bump 24 in the first embodiment, the metal bump 23C and the metal bump 24C are formed by electrolytic plating, and such roundness of the outer edge of the upper surface of the metal bump 23C is formed since the upper end as a growth end is rounded in the electrolytic plating process. Although the outer edge of the upper surface of the metal bump 24C is rounded, in the step of adjusting the upper surface of the metal bump 24C so as to have the same height as the upper surface of the metal bump 23C after electrolytic plating, the rounded upper end of the metal bump 24C is removed by polishing, cutting or the like. Therefore, the outer edge of the upper surface of the metal bump 24C is not rounded.

The height of the metal bumps 23C, 24C can be adjusted by removing the upper portion of the metal bump 24C by polishing using CMP method or the like (Chemical Mechanical Polishing) or cutting using a knife or the like.

In the example shown in FIG. 16, the metal bump 23C provided on the n-side electrode 21 keeps its shape formed by electrolytic plating and the outer edge of the upper surface is rounded. However, in the same manner as the metal bump 24C, the rounded upper portion of the metal bump 23C may be removed. The height of the metal bump 23C can be matched with the height of the metal bump 24C by removing the upper portion of the metal bump 23C, which is rounded by electrolytic plating.

In flip-chip mounting, in order to achieve highly-reliable mounting with less faulty connection, it is preferred that the metal bumps 23C, 24C each have a thickness of 10 μm or more.

The metal bump 23C and the metal bump 24C are electrode connection layers for electrically connecting the n-side electrode 21 and the p-side electrode 22 of the nitride semiconductor light emitting element 1C to the wiring electrodes on the mounting substrate (not shown). That is, in flip-chip mounting the nitride semiconductor light emitting element 1C to the mounting substrate (not shown), the n-side electrode 21 and the p-side electrode 22 are placed as opposed to the wiring electrodes (not shown) on the mounting substrate, and the metal bump 23C and the metal bump 24C are pressed in contact with the wiring electrodes to electrically connect the n-side electrode 21 and the p-side electrode 22 to the wiring electrodes on the mounting substrate (not shown).

At this time, in the fourth embodiment, since the height from the upper surface of the substrate 2 to the upper surface of the metal bump 23C is almost same as the height from the upper surface of the substrate 2 to the upper surface of the metal bump 24C, a pressing force is equally applied to both the metal bumps 23C, 24C from the side of the substrate 2. If the height of the upper surface of the metal bump 24C is higher than the height of the upper surface of the metal bump 23C, to satisfactorily connect the lower metal bump 23C to the wiring electrode on the mounting substrate (not shown), the higher metal bump 24C receives a larger pressing force than the metal bump 23C, that is, a pressing force than required for connection. In the fourth embodiment, since the height from the upper surface of the substrate 2 to the upper surface of the metal bump 23C is almost same as the height from the upper surface of the substrate 2 to the upper surface of the metal bump 24C, the n-side electrode 21, the p-side electrode 22, the cover electrode 15 and full surface electrode 14, which are located at lower positions, can be prevented from having damage due to the pressing force than required.

Since the outer edge of the upper surface of the metal bump 23C is rounded and the area of the upper surface 23Cb is small, when the metal bump 23C is squeezed by the pressing force, the upper end of the metal bump 23C can be prevented from being horizontally extended than required. Further, since the outer edge of the upper surface of the metal bump 24C is not rounded and is larger as compared to the case where the contact area between the upper surface of the metal bump 24C and the wiring electrodes on the mounting substrate (not shown) is rounded, when the metal bump 23C is squeezed by the pressing force, it can be prevented that the pressing force than required is applied to the dice (the nitride semiconductor element 1C) via the metal bump 24C, thereby reducing damage exerted in the p-side electrode 22 in the lower layer.

[Operation of Nitride Semiconductor Light Emitting Element]

The operation of the nitride semiconductor light emitting element 1C in the fourth embodiment of the present invention as shown in FIG. 16 is the same as that of the nitride semiconductor light emitting element 1 in the first embodiment as shown in FIG. 1, and thus description thereof is omitted.

[Manufacturing Method of Nitride Semiconductor Light Emitting Element]

A manufacturing method of the nitride semiconductor light emitting element in the fourth embodiment of the present invention will be described with reference to the accompanying drawings.

Figure 19:
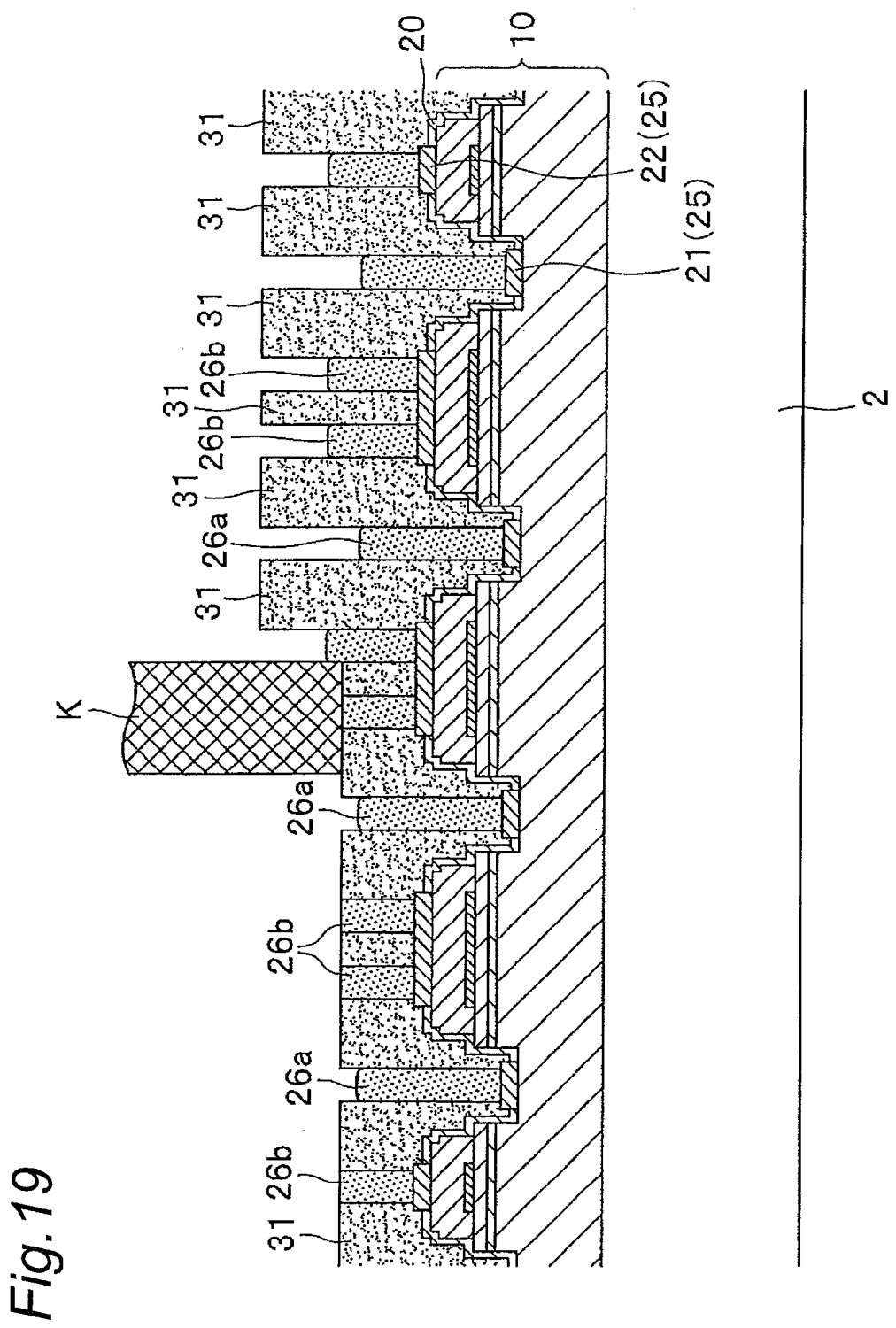
FIG. 19 is a schematic sectional view for describing a state where height adjustment of the metal bump layer is performed in a manufacturing process of the nitride semiconductor light emitting element in the fourth embodiment of the present invention.

As shown in FIG. 19, the manufacturing method of the nitride semiconductor light emitting element in the fourth embodiment includes nitride semiconductor light emitting element structure forming step (S50), a protective layer forming step (S51), a first resist pattern forming step (S52), a protective layer etching step (S53), a first metal layer forming step (S54), a second resist pattern forming step (S55), a second metal layer forming step (S56), a second metal layer height adjusting step (S57), a second resist pattern removing step (S58), a first resist pattern removing step (S59) and a chip dividing step (S60).

According to the manufacturing method in the first embodiment as shown in FIG. 2, the second resist pattern removing step (S17) is performed after the second metal layer forming step (S16), while according to the manufacturing method in the fourth embodiment, the second metal layer height adjusting step (S57) is performed between the second metal layer forming step (S56) and the second resist pattern removing step (S58). Each of the steps will be described in detail with reference to FIG. 18 (refer to FIG. 16 and FIG. 17, as appropriate).

Herein, since the nitride semiconductor light emitting element structure forming step (S50), the protective layer forming step (S51), the first resist pattern forming step (S52), the protective layer etching step (S53), the first metal layer forming step (S54), the second resist pattern forming step (S55) and the second metal layer forming step (S56) are the same as the nitride semiconductor light emitting element structure forming step (S10), the protective layer forming step (S11), the first resist pattern forming step (S12), the protective layer etching step (S13), the first metal layer forming step (S14), the second resist pattern forming step (S15) and the second metal layer forming step (S16) in the first embodiment shown in FIG. 2, and thus description thereof is omitted (for the state of each step, refer to FIG. 3A to FIG. 3C, FIG. 4A to FIG. 4C and FIG. 5A).

In the second metal layer forming step (S56), the second metal layer 26*a* and the second metal layer 26*b* are formed so as to have the almost same thickness by electrolytic plating using the electrically-conducting first metal layer 25 as the seed electrode (refer to FIG. 5A). Outer edges of the upper surfaces of second metal layer 26*a*, 26*b* are rounded. In FIG. 5 and FIG. 18, the rounded shape is not shown. The shape is the same as that in the first embodiment.

(Second Metal Layer (Metal Bump Layer) Height Adjusting Step: S57)

Figure 18A:
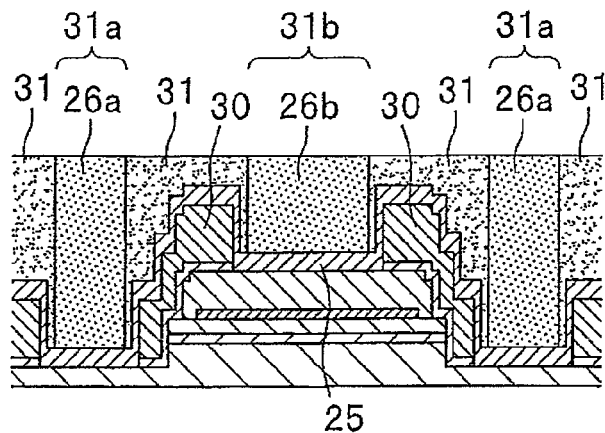

Following the second metal layer forming step (S56), as shown in FIG. 18A, un upper portion of the second metal layer 26*b* together with the second resist pattern 31 is removed up to the height of the upper surface of the second metal layer 26*a* formed in the opening 31*a* of the second resist pattern 31 by polishing, cutting or the like. Although it is preferred that the height of the second metal layer 26*b* that becomes the metal bump 24C is the same as the height of the upper surface of the second metal layer 26*a* that becomes the metal bump 23C, it is not necessarily the same as each other accurately. By getting the height of the upper surface of the second metal layer 26*b* closer to the height of the upper surface of the second metal layer 26*a*, in flip-chip mounting the finally formed nitride semiconductor light emitting element 1C, the pressing force can be equally applied to the metal bump 23C and the metal bump 24C, thereby improving the reliability of flip-chip mounting.

When the upper portion of the second metal layer 26*b* is removed up to a position that is higher than the upper surface of the second metal layer 26*a* by polishing, cutting or the like, that is, even when the adjusted height of the upper surface of the second metal layer 26*b* is higher than the upper surface of the second metal layer 26*a*, in the case where one element includes the plurality of metal bumps 24C as in a below-mentioned nitride semiconductor light emitting element 1C' (refer to FIG. 21 and FIG. 22), the heights of the metal bumps 24C are adjusted to be same in the second metal layer height adjusting step (S57). Thus, there is no variation in the height of the upper surface of the second metal layer 26*b* formed by electrolytic plating. Therefore, in flip-chip mounting, the pressing force is equally to each metal bump 24C and therefore, each metal bump 24C can be satisfactorily connected to the wiring electrodes on the mounting substrate (not shown), thereby improving the reliability of flip-chip mounting.

In the second metal layer height adjusting step (S57), the second resist pattern 31 that surrounds the second metal layer 26*b* is left without being removed, and an upper portion of the second metal layer 26*b* is removed together with the second resist pattern 31 by polishing, cutting or the like. Therefore, in height adjustment by polishing, cutting or the like, the second metal layer 26*b* can be prevented from peeling from the first metal layer 25 by a force applied to the second metal layer 26*b*.

Herein, referring to FIG. 19, height adjustment of the second metal layer 26*a* and the second metal layer 26*b* will be described. FIG. 19 shows a state where a polishing machine K that moves from left to right removes the upper portion of the second metal layer 26*b* together with the second resist pattern 31. In FIG. 19, the first resist pattern 30 and the first metal layer 25 formed on the upper surface of the first resist pattern 30 are not shown.

In the example shown in FIG. 19, the polishing machine K removes the upper portion of the second metal layer 26b so as not to remove the rounded upper portion of the lower second metal layer 26a. Thus, roundness of the outer edge of the upper surface of the metal bump 23C (refer to FIG. 16) is maintained. The outer edge of the upper surface of the metal bump 24C (refer to FIG. 16) is not rounded and made flat up to the side surface.

Alternatively, by keeping the height of the upper surface of the lower second metal layer 26a and adjusting only the height of the upper surface of the higher second metal layer 26b, the amount of removed second metal layer can be reduced to decrease the excessive material.

(Second Resist Pattern Removing Step (Resist Pattern Removing Step): S58)

Figure 18B:
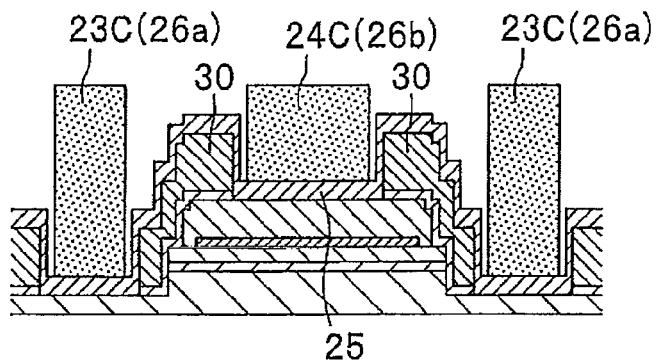

Returning to FIG. 18, next, as shown in FIG. 18B, when the second resist pattern 31 is removed, the second metal layer 26a and the second metal layer 26b appear as the metal bump 23C and the metal bump 24C, respectively. Except that the upper portion of the second resist pattern 31 is removed in the second metal layer height adjusting step (S57), this step is the same as the second resist pattern removing step (S17) in the manufacturing process in the first embodiment.

(First Resist Pattern Removing Step (Resist Pattern Removing Step): S59)

Figure 18C:
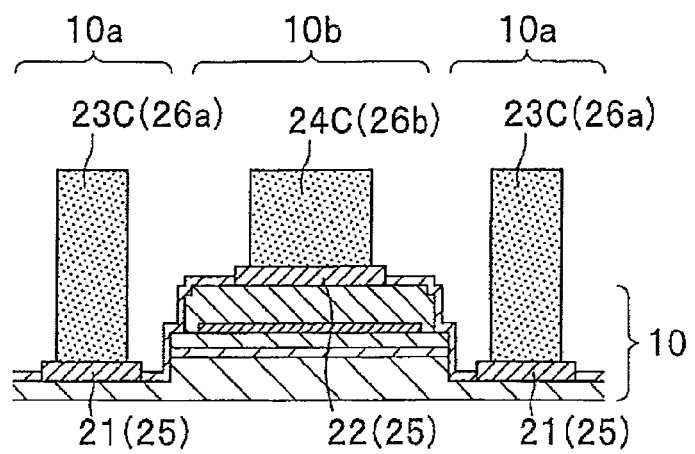

Subsequently, as shown in FIG. 18C, when the first resist pattern 30 is removed, the first resist pattern 30 and the first metal layers 25 formed on the first resist pattern 30 are removed (lift-off). Thereby, plural elements arranged in a matrix are formed on the substrate 2. The first resist pattern removing step (S59) is the same as the first resist pattern removing step (S17) in the manufacturing process in the first embodiment.

Although the step of removing the second resist pattern 31 and the step of removing the first resist pattern 30 are sequentially performed in the present embodiment, preferably, by using a same material or at least a material that can be removed by a same solution for a photoresist for forming the first resist pattern 30 and a photoresist for forming the second resist pattern 31, the second resist pattern removing step (S58) and the first resist pattern removing step (S59) can be performed in one step. This can further shorten the manufacturing process.

(Chip Dividing Step: S19)

Further, as in the chip dividing step (S19, refer to FIG. 2) in the first embodiment, by dividing the plurality of elements arranged on the substrate 2 in a matrix into chips, the nitride semiconductor light emitting elements 1C (refer to FIG. 16) in units of chips are completed.

As described above, according to the manufacturing method of the nitride semiconductor light emitting element in the fourth embodiment of the present invention, by adding the second metal layer height adjusting step (S57) to the manufacturing method of the nitride semiconductor light emitting element in the first embodiment, the nitride semiconductor light emitting element with improved reliability of flip-chip mounting can be manufactured.

<Another Example of Second Metal Layer Height Adjusting Step>

Next, referring to FIG. 20, another example of the second metal layer height adjusting step will be described. According to the second metal layer height adjusting step (S57) in the present Example, in removing an upper portion of the second metal layer 26b by polishing, cutting or the like, the rounded upper end of the lower second metal layer 26a is removed.

Figure 20:
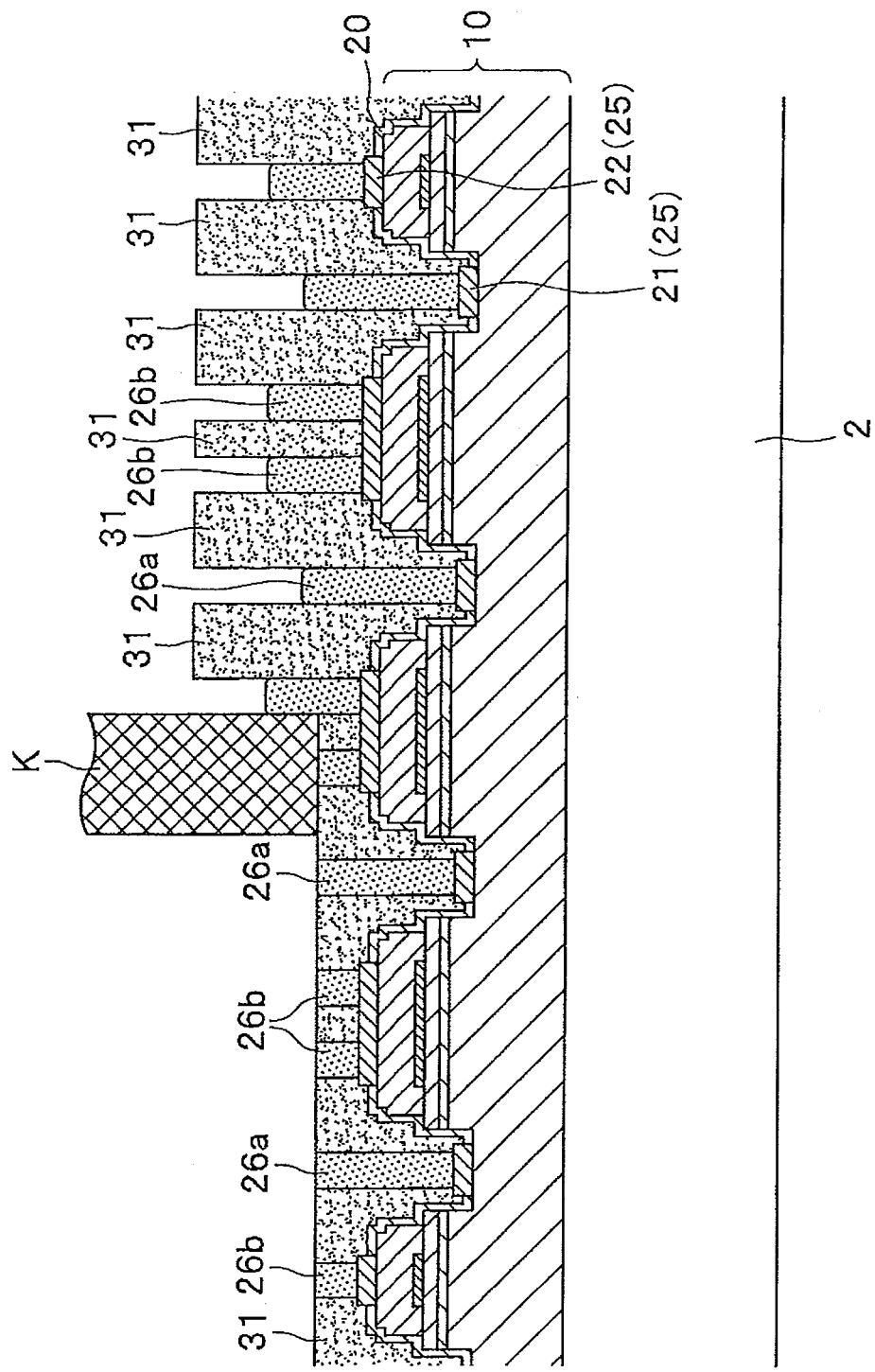
FIG. 20 is a schematic sectional view for describing another state where height adjustment of the metal bump layer is performed in the manufacturing process of the nitride semiconductor light emitting element in the fourth embodiment of the present invention.

FIG. 20 shows a state where the polishing machine K that moves from left to right removes upper portions of the second metal layers 26a, 26b together with the second resist pattern 31.

As in FIG. 19, in FIG. 20, the first metal layer 25 (refer to FIG. 18A) formed on the first resist pattern 30 (refer to FIG. 18A) and the first resist pattern 30 are not shown.

In the example shown in FIG. 20, the polishing machine K removes the rounded upper portion of the lower second metal layer 26a. Therefore, although the outer edge of the upper surface of the metal bump 23C (refer to FIG. 16) is not rounded, the heights of the upper surfaces of the metal bump 23C and the metal bump 24C (refer to FIG. 16) can be adjusted to be accurately same.

Thus, in flip-chip mounting the nitride semiconductor light emitting element 1C (refer to FIG. 16), a pressing force is equally applied to the metal bump 23C and the metal bump 24C. Therefore, the metal bumps can be connected to the wiring electrodes on the mounting substrate (not shown) more reliably, which improves the reliability of flip-chip mounting. The second metal layer height adjusting step (S57) in the example shown in FIG. 20 is especially effective for manufacturing of the nitride semiconductor light emitting element in which one element includes a lot of metal bumps, such as a below-mentioned nitride semiconductor element 1C' (refer to FIG. 21 and FIG. 22).

<Modification of Fourth Embodiment>

Figure 21:
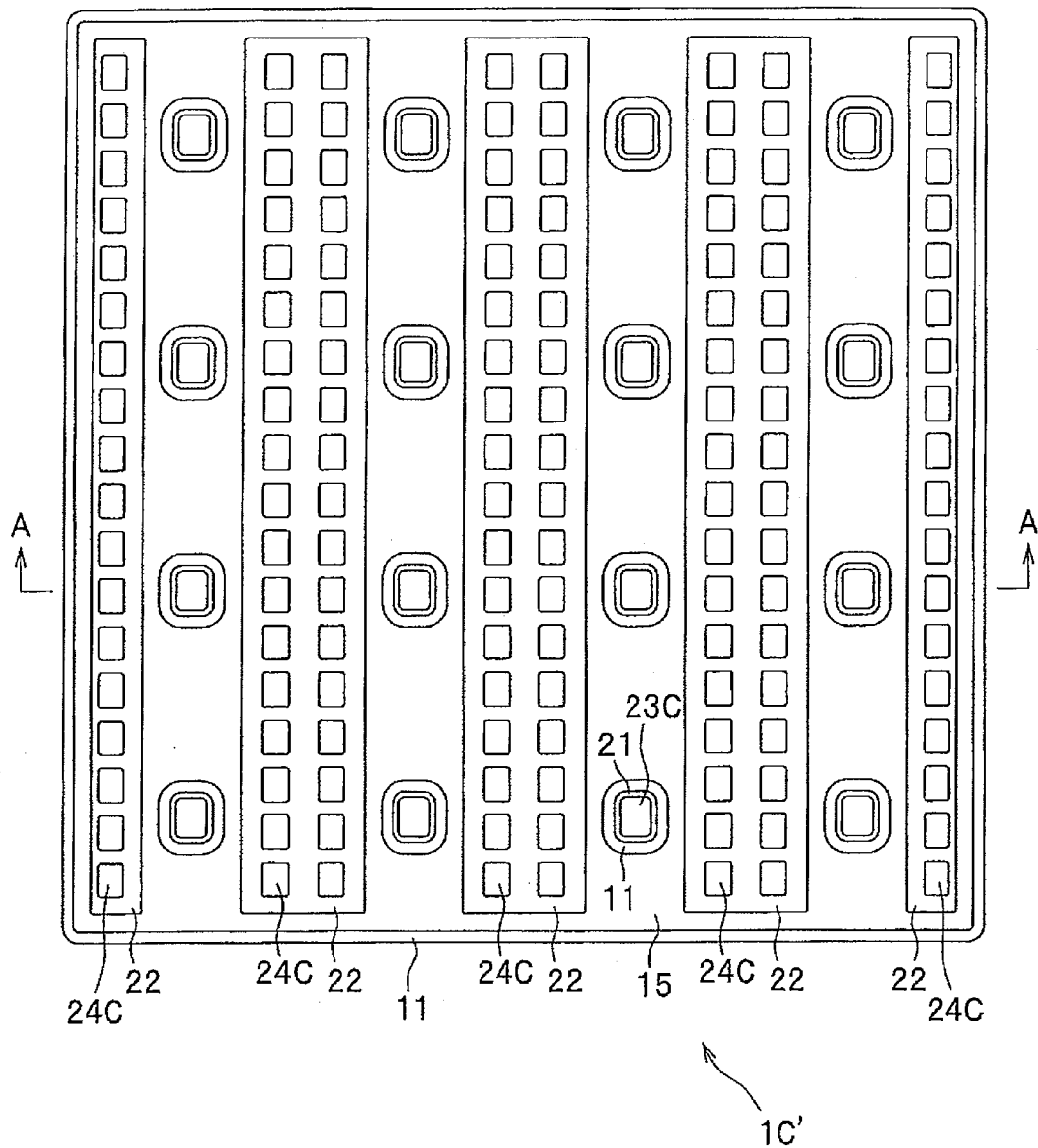
FIG. 21 is a schematic plan view showing a structure of a nitride semiconductor light emitting element in a modification of the fourth embodiment of the present invention.
Figure 22:
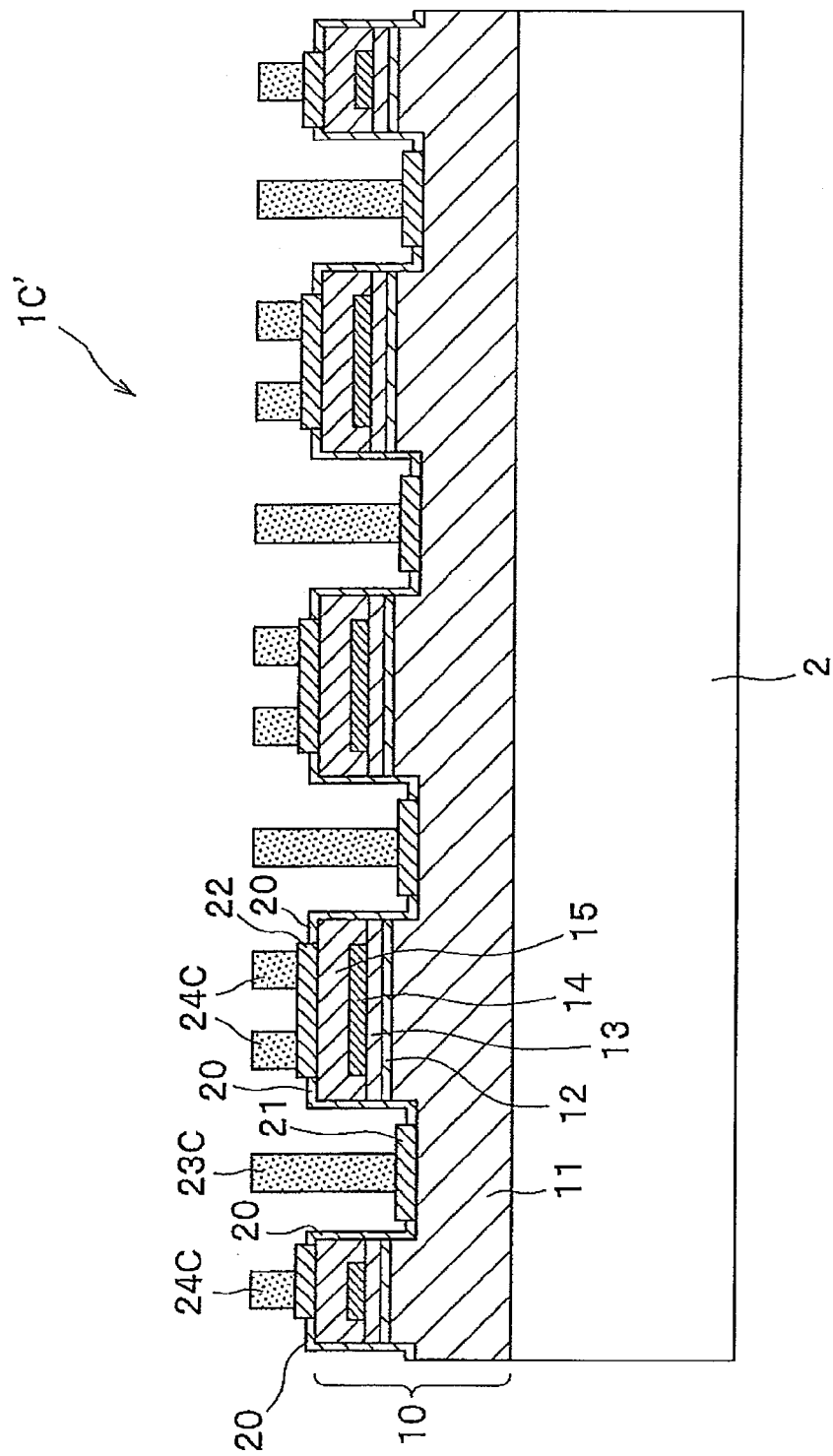
FIG. 22 is a schematic view taken along lines A-A in FIG. 21, showing a structure of a nitride semiconductor light emitting element in a modification of the fourth embodiment of the present invention.

Next, referring to FIG. 21 and FIG. 22, a nitride semiconductor light emitting element in a modification of the fourth embodiment will be described. As shown in FIG. 21 and FIG. 22, the nitride semiconductor light emitting element 1C' in the present modification is different from the nitride semiconductor light emitting element 1C shown in FIG. 16 in that one nitride semiconductor light emitting element 1C' includes a plurality of n-side electrodes 21, p-side electrodes 22, metal bumps 23C and metal bumps 24C. The same constituents of the nitride semiconductor light emitting element 1C shown in FIG. 16 are given the same reference numerals, and detailed description thereof is omitted. The protective layer 20 is not shown in the plan view of FIG. 21.

In nitride semiconductor light emitting element 1C' in the present modification, as shown in FIG. 21, the n-side electrodes 21 are provided in a 4×4 matrix in a region having a substantially square outer shape in a plan view, and each n-side electrode 21 is provided with one metal bump 23C. The metal bumps 24C in a 1×18 or 2×18 matrix are provided on the five p-side electrodes 22 that are vertically long in a plan view. As shown in FIG. 22, the height of upper surfaces of all of the metal bumps 23C and the metal bumps 24C is uniform in a sectional view. However, as described above, it is no needed to match the height of the upper surface of the metal bump 23C with the height of the upper surface of the metal bump 24C, and upper portions of the metal bumps 23C may be rounded.

Further, in the present modification, as shown in FIG. 22, the full surface electrode 14 and the cover electrode 15 are provided only on the p-type nitride semiconductor layer 13. However, the full surface electrode and the cover electrode may be also provided on the n-type nitride semiconductor layer 11.

The structure in which one nitride semiconductor light emitting element is provided with a lot of metal bumps as shown in FIG. 21 and FIG. 22 can be also applied to the nitride semiconductor light emitting elements in above-mentioned the first embodiment, the second embodiment, the third embodiment and below-mentioned the fifth embodiment and the sixth embodiment.

The operation of the nitride semiconductor light emitting element 1C' in the present modification is the same as that of the nitride semiconductor light emitting element 1C in the fourth embodiment and thus, description thereof is omitted.

Figure 17:
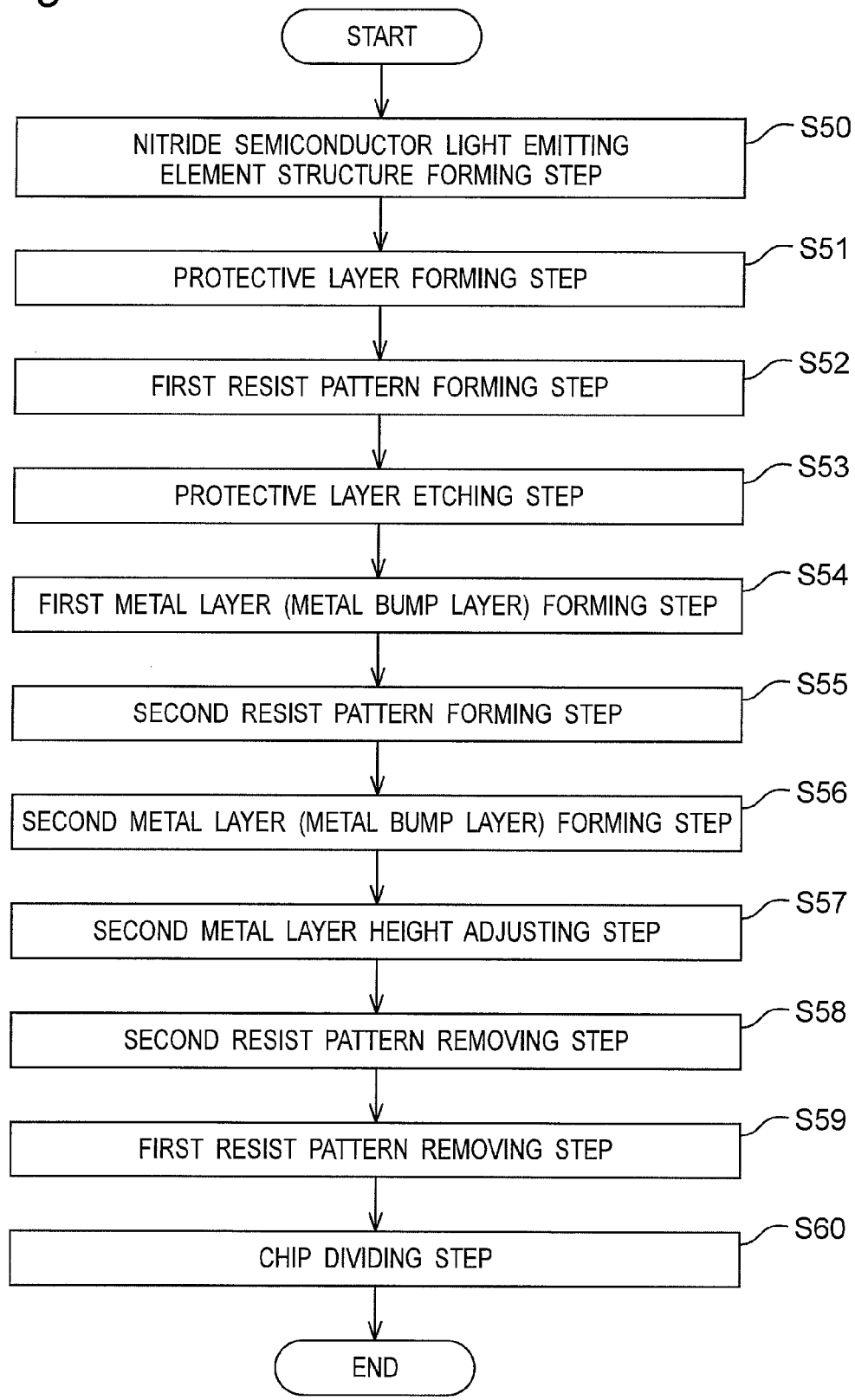
FIG. 17 is a flow chart showing a flow of a manufacturing method of the nitride semiconductor light emitting element in the fourth embodiment of the present invention.

Since the manufacturing method of the nitride semiconductor light emitting element 1C' in the present modification is similar except that in the first resist pattern forming step (S52) and the second resist pattern forming step (S55) in FIG. 17, the first resist pattern 31 and the second resist pattern 32 corresponding to the plurality of n-side electrodes 21, p-side electrodes 22, metal bumps 23C and metal bumps 24C are formed and thus, description thereof is omitted. In the case where one nitride semiconductor light emitting element 1C' is formed on one substrate 2, the chip dividing step (S60) is unnecessary.

<Fifth Embodiment>
[Nitride Semiconductor Light Emitting Element]

Figure 23:
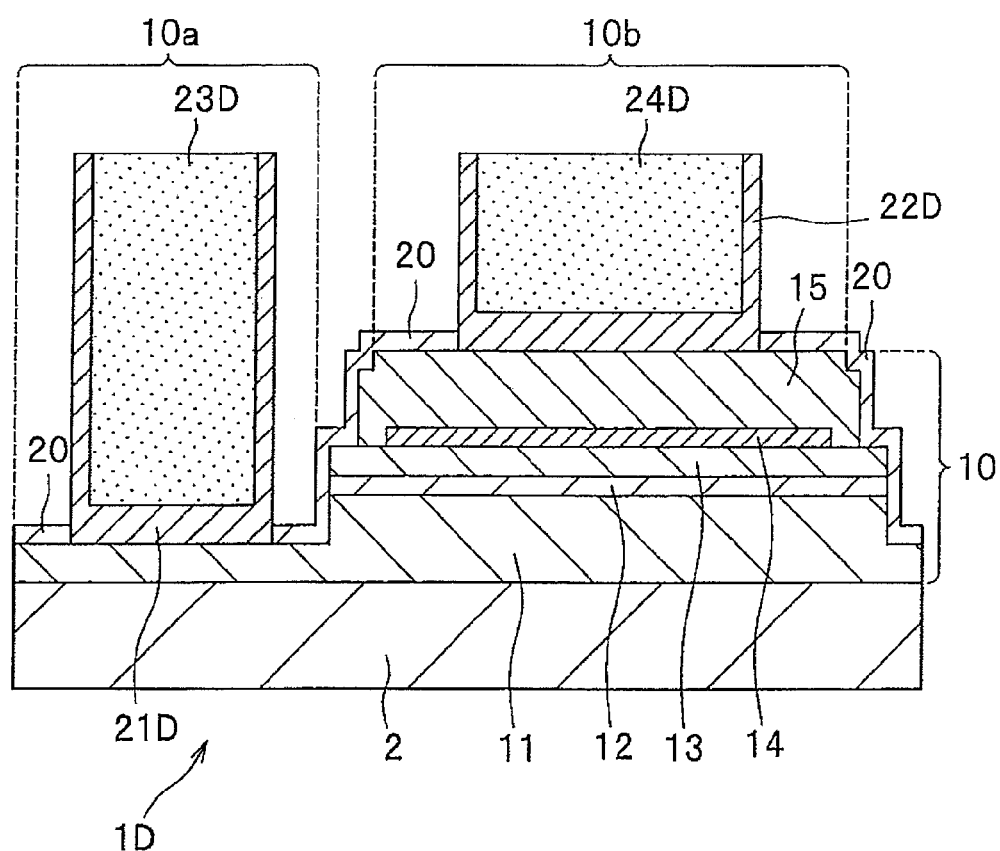
FIG. 23 is a schematic sectional view showing a structure of a nitride semiconductor light emitting element in the fifth embodiment of the present invention.

A structure of a nitride semiconductor light emitting element in the fifth embodiment of the present invention will be described with reference to FIG. 23. The nitride semiconductor light emitting element 1D in the present embodiment of the present invention is a flip-chip mounted LED. As shown in FIG. 23, the nitride semiconductor light emitting element 1D in the fifth embodiment includes the substrate 2, and the nitride semiconductor light emitting element structure 10, the protective layer 20, an n-side electrode 21D, a p-side electrode 22D, a metal bump 23D and a metal bump 24D, which are laminated on the substrate 2. The nitride semiconductor light emitting element 1D in the fifth embodiment is different from the nitride semiconductor light emitting element 1A in the second embodiment as shown in FIG. 6 in that the n-side electrode 21D, the p-side electrode 22D, the metal bump 23D and the metal bump 24D are provided in place of the n-side electrode 21A, the p-side electrode 22A, the metal bump 23A and the metal bump 24A, respectively. The same constituents as those in nitride semiconductor light emitting element 1A in the second embodiment are given the same reference numerals, and description thereof is omitted.

The substrate 2, the nitride semiconductor light emitting element structure 10, and the n-type nitride semiconductor layer 11, the active layer 12, the p-type nitride semiconductor layer 13, the full surface electrode 14, the cover electrode 15 and the protective layer 20 as constituents of the nitride semiconductor light emitting element structure 10 are the same as those in the nitride semiconductor light emitting element 1A in the second embodiment and thus, description thereof is omitted. The n-side electrode 21D and the p-side electrode 22D are the same as the n-side electrode 21A and the p-side electrode 22A in the nitride semiconductor light emitting element 1A in the second embodiment except that the portions that coat the side surfaces of the metal bump 23D and the metal bump 24D are lowered so as to correspond to the height of the metal bump 23D and the metal bump 24D, and thus description thereof is omitted.

(Metal Bump)

The metal bump 23D and the metal bump 24D are provided on the upper surfaces of the n-side electrode 21D and the p-side electrode 22D, respectively, and are in contact with the respective electrodes. Further, side surfaces of the metal bump 23D and the metal bump 24D are coated with the n-side electrode 21D and the p-side electrode 22D, respectively. These metal bumps are different from the metal bump 23A and the metal bump 24A in the second embodiment in that a height from the upper surface of the substrate 2 to an upper surface of the metal bump 23D is almost same as a height from the upper surface of the substrate 2 to an upper surface of the metal bump 24D.

In the same manner as the metal bump 23A and the metal bump 24A in the second embodiment, the metal bump 23D and the metal bump 24D are formed by electrolytic plating using the first metal layer 27 that becomes the n-side electrode 21D and the p-side electrode 22D (refer to FIG. 9B) as the seed electrodes. However, upper portions of the metal bump 23D and the metal bump 24D are removed by polishing, cutting or the like after electrolytic plating, and the height from the upper surface of the substrate 2 to the upper surface of the metal bump 23D and the height from the upper surface of the substrate 2 to the upper surface of the metal bump 24D are adjusted so as to be substantially same. Therefore, the upper surfaces of the metal bump 23D and the metal bump 24D are formed flat up to their side surfaces.

Since the height of the upper surface of the metal bump 23D is almost same as the height of the upper surface of the metal bump 24D in the fifth embodiment as described above, in case of flip-chip mounting, a pressing force is equally to both the metal bump 23D, 24D from the side of the substrate 2, similarly to the metal bump 23C and the metal bump 24C in the fourth embodiment. Therefore, the metal bumps 23D, 24 do not receive the pressing force than required for mounting, preventing damage exerted on the n-side electrode 21D, the p-side electrode 22D, the cover electrode 15 and the full surface electrode 14 in the lower layers.

In the example shown in FIG. 23, although the height of the upper surface of the metal bump 23D is almost same as the height of the upper surface of the metal bump 24D, the present invention is not limited thereto. As described with respect to the metal bump 23C and the metal bump 24C in the fourth embodiment, the same height is preferable, but it is no needed to form the metal bumps having the accurate same height. Further, as described in the fourth embodiment, when the second metal layer 28a that becomes the metal bump 23D is formed by electrolytic plating (refer to FIG. 9B), the outer edge of the upper surface of the metal bump is rounded (in FIG. 9B, roundness is not shown), and the rounded shape may be maintained.

The metal bump 23D and the metal bump 24D are electrode connection layers for electrically connecting the n-side electrode 21D and the p-side electrode 22D of the nitride semiconductor light emitting element 1D to the wiring electrodes on the mounting substrate (not shown). That is, in flip-chip mounting the nitride semiconductor light emitting element 1D to the mounting substrate (not shown), the n-side electrode 21D and the p-side electrode 22D are placed as opposed to the wiring electrodes (not shown) on the mounting substrate, and the metal bump 23D and the metal bump 24D are pressed in contact with the wiring electrode to electrically connect the n-side electrode 21D and the p-side electrode 22D to the wiring electrodes on the mounting substrate (not shown).

Effects of the structures in which the outer edge of the upper surface of the metal bump 2DE is rounded and the height of the upper surface of the metal bump 24D is the same as the height of the upper surface of the metal bump 23D are the same as those described with respect to the metal bump 23C and the metal bump 24C in the fourth embodiment and thus, description thereof is omitted.

In flip-chip mounting, in order to achieve highly-reliable mounting with less faulty connection, it is preferred that the metal bumps 23D, 24D each have a thickness of 10 µm or more.

[Operation of Nitride Semiconductor Light Emitting Element]

The operation of the nitride semiconductor light emitting element 1D in the fifth embodiment of the present invention as shown in FIG. 23 is the same as the nitride semiconductor light emitting element 1A in the second embodiment as shown in FIG. 6 and thus, description thereof is omitted.

[Manufacturing Method of Nitride Semiconductor Light Emitting Element]

A manufacturing method of the nitride semiconductor light emitting element in the fifth embodiment of the present invention will be described with reference to the accompanying drawings.

Figure 24:
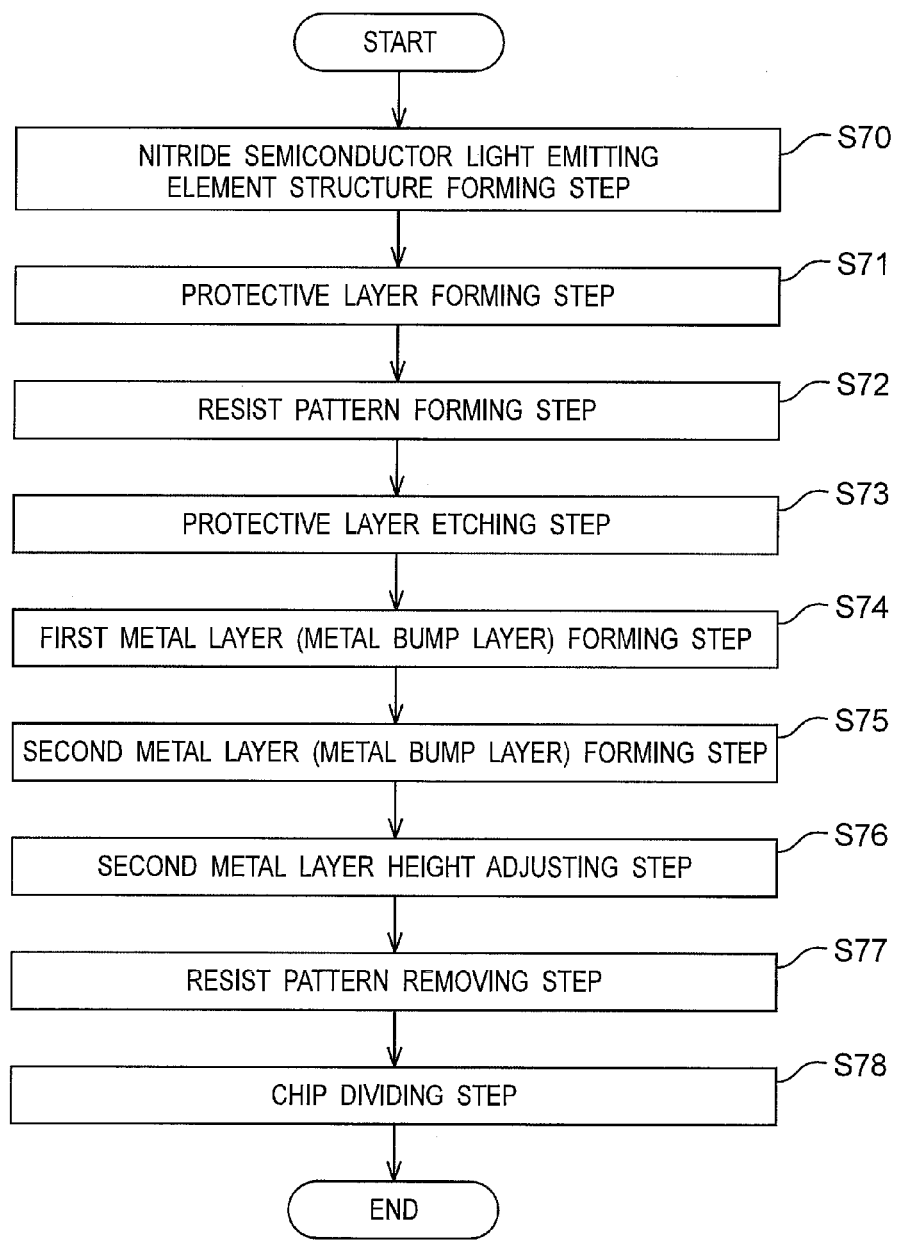
FIG. 24 is a flow chart showing a flow of a manufacturing method of the nitride semiconductor light emitting element in the fifth embodiment of the present invention.

As shown in FIG. 24, the manufacturing method of the nitride semiconductor light emitting element in the fifth embodiment includes a nitride semiconductor light emitting element structure forming step (S70), a protective layer forming step (S71), a resist pattern forming step (S72), a protective layer etching step (S73), a first metal layer forming step (S74), a second metal layer forming step (S75), a second metal layer height adjusting step (S76), a resist pattern removing step (S77) and a chip dividing step (S78).

According to the manufacturing method in the second embodiment as shown in FIG. 7, the resist pattern removing step (S26) is performed after the second metal layer forming step (S25), while according to the manufacturing method in the fifth embodiment, the second metal layer height adjusting step (S76) is performed between the second metal layer forming step (S75) and the resist pattern (S77). Each of the steps will be described in detail with reference to FIG. 25 (refer to FIG. 23 and FIG. 24, as appropriate).

Herein, since the nitride semiconductor light emitting element structure forming step (S70), the protective layer forming step (S71), the resist pattern forming step (S72), the protective layer etching step (S73), the first metal layer forming step (S74) and the second metal layer forming step (S75) are the same as the nitride semiconductor light emitting element structure forming step (S20), the protective layer forming step (S21), the resist pattern forming step (S22), the protective layer etching step (S23), the first metal layer forming step (S24) and the second metal layer forming step (S25) in the second embodiment as shown in FIG. 7, respectively, and thus, description thereof is omitted (for the state of each step, refer to FIG. 8A to FIG. 8D, FIG. 9A and FIG. 9B).

In the second metal layer forming step (S75), the second metal layer 28a and the second metal layer 28b are formed so as to have an almost same thickness by electrolytic plating using the electrically-conducting first metal layer 27 as a seed electrode (refer to FIG. 9B). Outer edge of the upper surfaces of the second metal layers 28a, 28b are rounded. In FIG. 9 and FIG. 25, the rounded shape is not shown. The shape is the same as that in the fourth embodiment.

(Second Metal Layer (Metal Bump Layer) Height Adjusting Step: S76)

Figure 25A:
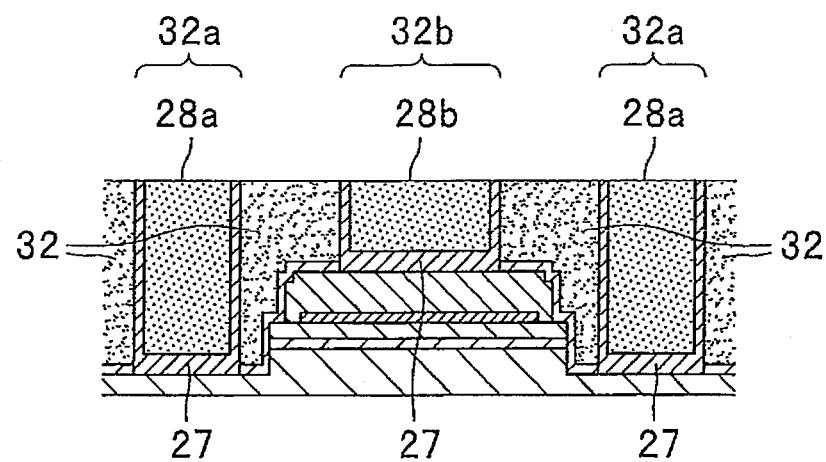

Following the second metal layer forming step (S75) (refer to FIG. 9B), as shown in FIG. 25A, upper portions of the second metal layer 28a and the second metal layer 28b together with the second metal layer 28c (refer to FIG. 9B), an upper portion of the first metal layer 27 and the resist pattern 32 are removed by polishing, cutting or the like to adjust so that a height of the upper surface of the second metal layer 28a becomes the same as the height of the upper surface of the second metal layer 28b. This height adjustment can be performed in the same manner as in the height adjustment shown in FIG. 20.

As in the height adjustment shown in FIG. 19, the upper portion of the second metal layer 28b that becomes the metal bump 24D is removed up to a position that is equal to or slightly higher than the upper surface of the second metal layer 28a that becomes the metal bump 23D, and the rounded outer edge of the upper surface of the second metal layer 28a may be kept.

Although it is preferred that the height of the second metal layer 28b that becomes the metal bump 24D is the same as the height of the upper surface of the second metal layer 28a that becomes the metal bump 23D, the height is not necessarily same as each other accurately. By getting the height of the upper surface of the second metal layer 28b closer to the height of the upper surface of the second metal layer 28a, in flip-chip mounting the finally formed nitride semiconductor light emitting element 1D, the pressing force can be equally applied to the metal bump 23D and the metal bump 24D, thereby improving the reliability of flip-chip mounting.

By keeping the height of the upper surface of the lower second metal layer 28a and adjusting only the height of the upper surface of the higher second metal layer 28b, the amount of removed second metal layer can be reduced, thereby decreasing the excessive material.

In the second metal layer height adjusting step (S76), the resist pattern 32 that surrounds side surfaces of the second metal layers 28a, 28b without being removed, and upper portions of the second metal layers 28a, 28b together with the resist pattern 32 are removed by polishing, cutting or the like. Thus, in height adjustment by polishing, cutting or the like, the second metal layers 28a, 28b can be prevented from being peeled from the first metal layer 27 by a force applied to the second metal layers 28a, 28b.

When the upper portion of the second metal layer 28b is removed by polishing, cutting or the like to a position that is higher than the upper surface of the second metal layer 28a, that is, even when the adjusted height of the upper surface of the second metal layer 28b is higher than the height of the upper surface of the second metal layer 28a, in the case where one element includes the plurality of metal bumps 24D as in the nitride semiconductor light emitting element 1C' (refer to FIG. 21 and FIG. 22), the heights of the metal bumps 24D are adjusted to be same in the second metal layer height adjusting step (S76). Thus, there is no variation in height of the upper surface of the second metal layer 28b formed by electrolytic plating. Therefore, a pressing force is equally applied to each metal bump 24D in flip-chip mounting and each metal bump 24D can be satisfactorily connected to the wiring electrode on the mounting substrate (not shown), which improves the reliability of flip-chip mounting.

(Resist Pattern Removing Step: S77)

Figure 25B:
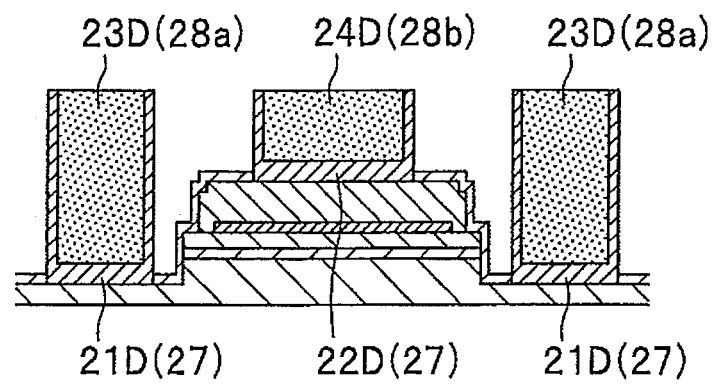

Next, as shown in FIG. 25B, when the resist pattern 32 is removed, the second metal layer 28a and the second metal layer 28b appear as the metal bump 23D and the metal bump 24D, respectively. Thereby, a plurality of elements arranged in a matrix are formed on the substrate 2. Except that the second metal layer 28c (refer to FIG. 9B), the upper portion of the first metal layer 27 and the upper portion of the resist pattern 32 are removed in the second metal layer height adjusting step (S76), this step is the same as the resist pattern removing step (S26) in the manufacturing process in the second embodiment.

(Chip Dividing Step: S78)

Further, as in the chip dividing step (S19, refer to FIG. 2) in the manufacturing method in the first embodiment, by dividing the plurality of elements arranged on the substrate 2 in a matrix into chips, the nitride semiconductor light emitting elements 1D in units of chips (refer to FIG. 23) are completed.

As described above, according to the manufacturing method of the nitride semiconductor light emitting element in the fifth embodiment of the present invention, by adding the second metal layer height adjusting step (S76) to the manufacturing method of the nitride semiconductor light emitting element in the second embodiment, the nitride semiconductor light emitting element with improved reliability of flip-chip mounting can be manufactured.

<Sixth Embodiment>
[Nitride Semiconductor Light Emitting Element]

Figure 26:
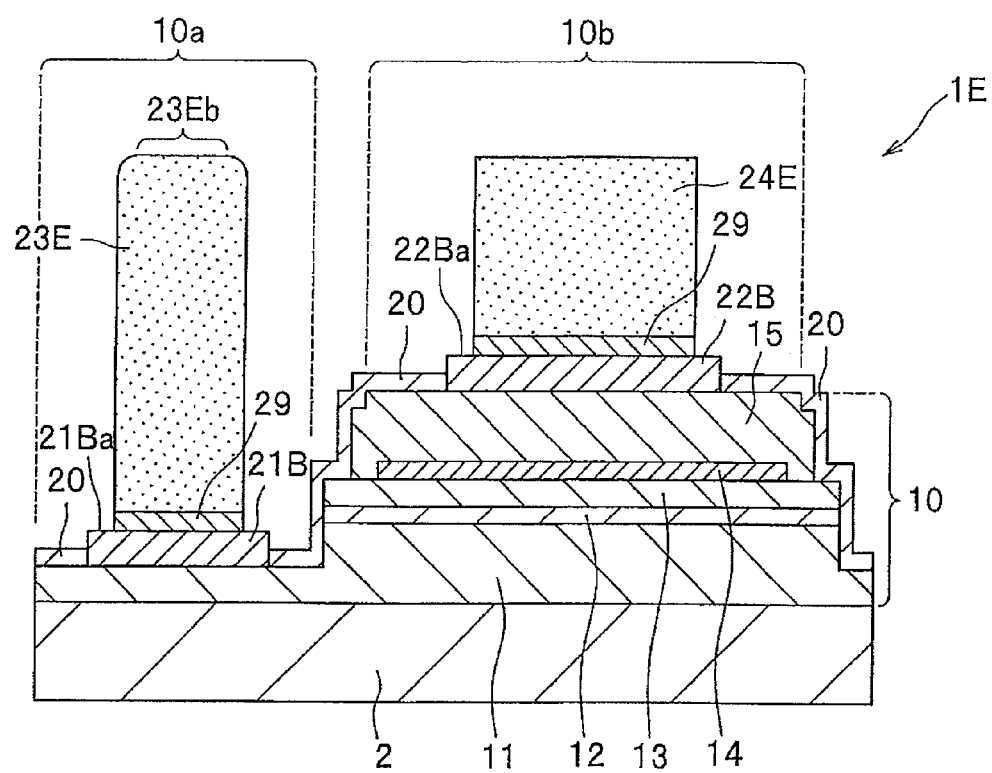
FIG. 26 is a schematic sectional view showing a structure of a nitride semiconductor light emitting element in the sixth embodiment of the present invention.

A structure of a nitride semiconductor light emitting element in the sixth embodiment of the present invention will be described with reference to FIG. 26. The nitride semiconductor light emitting element 1E in the present embodiment of the present invention is a flip-chip mounted LED. As shown in FIG. 26, the nitride semiconductor light emitting element 1E in the sixth embodiment includes the substrate 2, and the nitride semiconductor light emitting element structure 10, the protective layer 20, n-side electrode 21B, the p-side electrode 22B, a metal bump 23E, a metal bump 24E and the third metal layer 29, which are laminated on the substrate 2.

The nitride semiconductor light emitting element 1E in the sixth embodiment is different from the nitride semiconductor light emitting element 1B in the third embodiment as shown in FIG. 10, the metal bump 23E and the metal bump 24E are provided in place of the metal bump 23B and the metal bump 24B, respectively. The same constituents as those in the nitride semiconductor light emitting element 1B in the third embodiment are given the same reference numerals, and description thereof is omitted.

The substrate 2, the nitride semiconductor light emitting element structure 10, and the n-type nitride semiconductor layer 11, the active layer 12, the p-type nitride semiconductor layer 13, the full surface electrode 14, the cover electrode 15 and the protective layer 20, the n-side electrode 21B, the p-side electrode 22B and the third metal layer 29 as constituents of the nitride semiconductor light emitting element structure 10 are the same as those in the nitride semiconductor light emitting element 1B in the third embodiment and thus, description thereof is omitted.

(Metal Bump)

The metal bump 23E and the metal bump 24E are provided on the n-side electrode 21B and the p-side electrode 22B, respectively, via the third metal layer 29. These metal bumps are different from the metal bump 23B and the metal bump 24B in the third embodiment in that a height from the upper surface of the substrate 2 to an upper surface of the metal bump 23E is almost same as a height from the upper surface of the substrate 2 to an upper surface of the metal bump 24E.

Similarly to the metal bump 23C in the fourth embodiment shown in FIG. 16, an outer edge of an upper end of the metal bump 23E provided above the n-side electrode 21B via the third metal layer 29 is rounded, and an area of an upper surface 23Eb is smaller than an area of a cross section of a central part of the metal bump 23E, which is parallel to the upper surface of the substrate 2. That is, the upper surface 23Eb of the metal bump 23E is flat and corners of its upper end are rounded. On the other hand, an outer edge of an upper end of the metal bump 24E provided above the p-side electrode 22B via the third metal layer 29 are not rounded, and the shape of an upper surface of the metal bump 24E is the same as the shape of a cross section of a central part of the metal bump 24C, which is parallel to the upper surface of the substrate 2, and is made flat up to the side surface.

Similarly to the metal bump 23B and the metal bump 24B in the third embodiment, the metal bump 23E and the metal bump 24E are formed by electrolytic plating using the third metal layer 29 as the seed electrode. As described above with respect to the metal bump 23C in the fourth embodiment, such roundness of the outer edge of the upper surface of the metal bump 23E is formed since the upper end as a growth end is rounded in the electrolytic plating process. Although the outer edge of the upper surface of the metal bump 24E is rounded, in the step of adjusting the upper surface of the metal bump 24E so as to have the same height as the upper surface of the metal bump 23E after electrolytic plating, the rounded upper end of the metal bump 24E is removed by polishing, cutting or the like. Therefore, the outer edge of the upper surface of the metal bump 24E is not rounded.

The metal bump 23E and the metal bump 24E are electrode connection layers for electrically connecting the n-side electrode 21B and the p-side electrode 22B of the nitride semiconductor light emitting element 1E to the wiring electrodes on the mounting substrate (not shown), respectively. That is, in flip-chip mounting the nitride semiconductor light emitting element 1E on the mounting substrate (not shown), by allowing the n-side electrode 21B and the p-side electrode 22B to be opposed to the wiring electrodes (not shown) on the mounting substrate and pressing the metal bump 23E and the metal bump 24E in contact with the wiring electrode, the n-side electrode 21B and the p-side electrode 22B are electrically connected to the wiring electrodes on the mounting substrate (not shown) via the third metal layers 29.

Effects of the structures in which the outer edge of the upper surface of the metal bump 23E is rounded and the height of the upper surface of the metal bump 24E is the same as the height of the upper surface of the metal bump 23E are the same as those described with respect to the metal bump 23C and the metal bump 24C in the fourth embodiment and thus, description thereof is omitted.

In flip-chip mounting, in order to achieve highly-reliable mounting with less faulty connection, it is preferred that the metal bumps 23E, 24E each have a thickness of 10 μm or more.

[Operation of Nitride Semiconductor Light Emitting Element]

The operation of the nitride semiconductor light emitting element 1E in the sixth embodiment of the present invention as shown in FIG. 26 is the same as that of the nitride semiconductor light emitting element 1B in the third embodiment as shown in FIG. 10 and thus, description thereof is omitted.

[Manufacturing Method of Nitride Semiconductor Light Emitting Element]

A manufacturing method of the nitride semiconductor light emitting element in the sixth embodiment of the present invention will be described with reference to the accompanying drawings.

Figure 27:
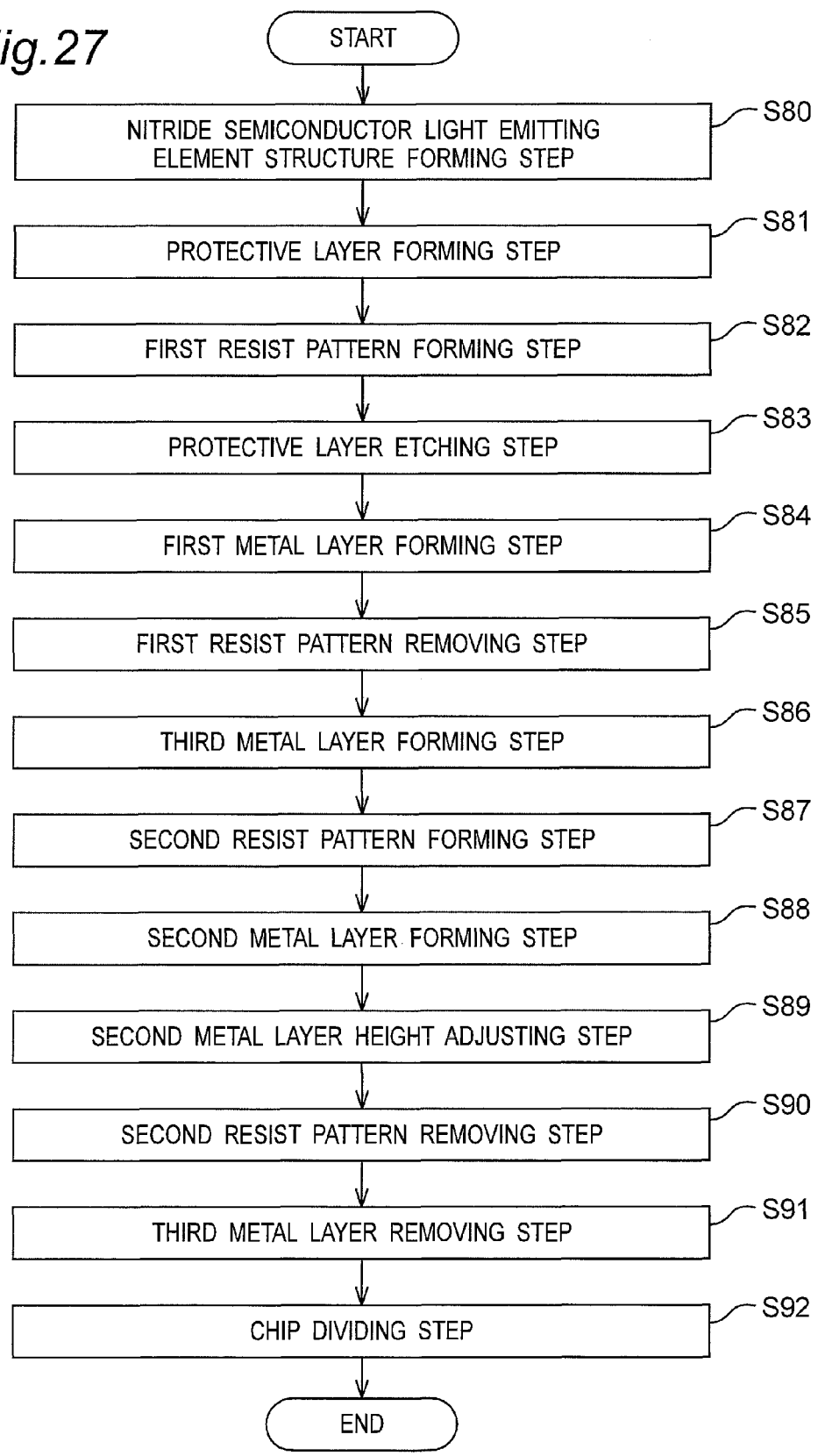
FIG. 27 is a flow chart showing a flow of a manufacturing method of the nitride semiconductor light emitting element in the sixth embodiment of the present invention.

As shown in FIG. 27, the manufacturing method of the nitride semiconductor light emitting element in the sixth embodiment of the present invention includes a nitride semiconductor light emitting element structure forming step (S80), a protective layer forming step (S81), a first resist pattern forming step (S82), a protective layer etching step (S83), a first metal layer forming step (S84), a first resist pattern removing step (S85), a third metal layer forming step (S86), a second resist pattern forming step (S87), a second metal layer forming step (S88), a second metal layer height adjusting step (S89), a second resist pattern removing step (S90), a third metal layer removing step (S91) and a chip dividing step (S92).

According to the manufacturing method in the third embodiment as shown in FIG. 11, the second resist pattern removing step (S39) is performed after the second metal layer forming step (S38), while according to the manufacturing method in the sixth embodiment, the second metal layer height adjusting step (S89) is performed between the second metal layer forming step (S88) and the second resist pattern removing step (S90). Each of the steps will be described in detail with reference to FIG. 28 (refer to FIG. 26 and FIG. 27, as appropriate).

Herein, the nitride semiconductor light emitting element structure forming step (S80), the protective layer forming step (S81), the first resist pattern forming step (S82), the protective layer etching step (S83), the first metal layer forming step (S84), the first resist pattern removing step (S85), the third metal layer forming step (S86), the second resist pattern forming step (S87) and the second metal layer forming step (S88) are the same as the nitride semiconductor light emitting element structure forming step (S30), the protective layer forming step (S31), the first resist pattern forming step (S32), the protective layer etching step (S33), the first metal layer forming step (S34), the first resist pattern removing step (S35), the third metal layer forming step (S36), the second resist pattern forming step (S37) and the second metal layer forming step (S38) in the third embodiment shown in FIG. 11, respectively, and thus description thereof is omitted (for the state of each step, refer to FIG. 12A to FIG. 12D, FIG. 13A to FIG. 13D and FIG. 14A).

In the second metal layer forming step (S88), the second metal layer 26a and the second metal layer 26b are formed so as to have the almost same thickness by electrolytic plating using the electrically conducting third metal layer 29 as the seed electrode (refer to FIG. 14A). Outer edge of the upper surfaces of the second metal layers 26a, 26b are rounded. In FIG. 14 and FIG. 28, the rounded shape is not shown. The shape is the same as that in the third embodiment.

(Second Metal Layer (Metal Bump Layer) Height Adjusting Step: S89)

Figure 28A:
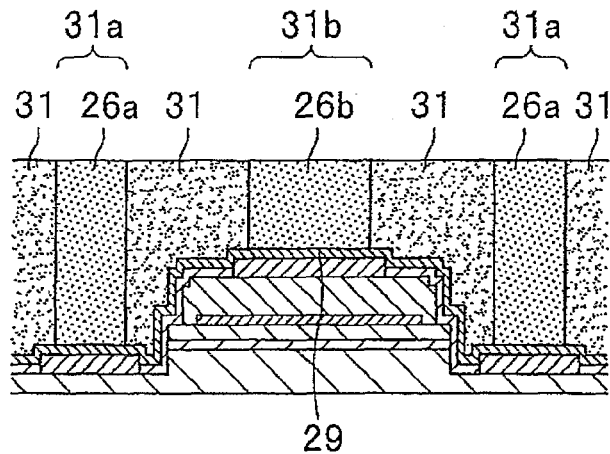

Following the second metal layer forming step (S88), as shown in FIG. 28A, an upper portion of the second metal layer 26b together with the second resist pattern 31 is removed by polishing, cutting or the like up to the height of the upper surface of the second metal layer 26a in the opening 31a of the second resist pattern 31.

The second metal layer height adjusting step (S89) in the sixth embodiment is the same as the second metal layer height adjusting step (S57, refer to FIG. 17) in the fourth embodiment and thus, detailed description thereof is omitted. According to the manufacturing method in the fourth embodiment, the method described as another example of the second metal layer height adjusting step (refer to FIG. 20) can be applied to the sixth embodiment.

Effects of the structures in which the outer edge of the upper surface of the metal bump 23E is rounded and the height of the upper surface of the metal bump 24E is the same as the height of the upper surface of the metal bump 23E are the same as those described with respect to the metal bump 23C and the metal bump 24C in the fourth embodiment and thus, description thereof is omitted.

(Second Resist Pattern Removing Step: S90)

Figure 28B:
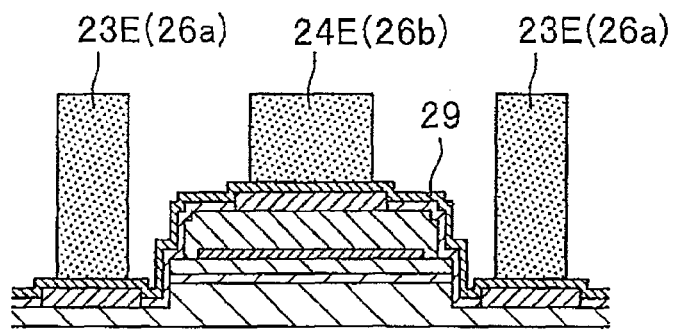

As shown in FIG. 28B, when the second resist pattern 31 is removed, the second metal layer 26a and the second metal layer 26b appear as the metal bump 23C and the metal bump 24C, respectively. This step is the same as the second resist pattern removing step (S39, refer to FIG. 11) in the third embodiment except that the upper portion of the second resist pattern 31 is removed in the second metal layer height adjusting step (S89).

(Third Metal Layer (Metal Seed Layer) Removing Step: S91)

Figure 28C:
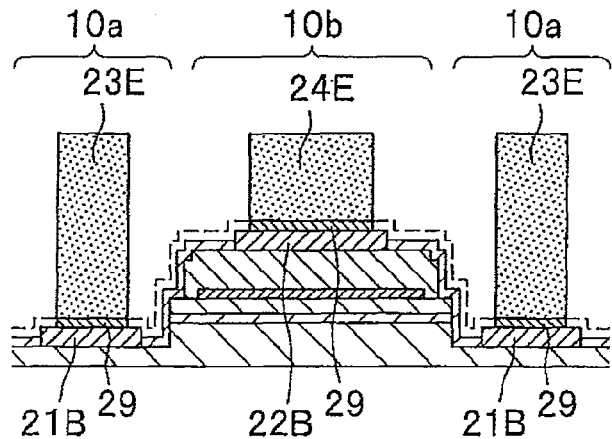

As shown in FIG. 28C, by etching using the metal bump 23E and the metal bump 24E masks, the unnecessary third metal layers 29 are removed to form the nitride semiconductor light emitting element.

(Chip Dividing Step: S92)

Further, by dividing the nitride semiconductor light emitting elements arranged on the substrate (not shown) in a matrix into chips by dicing or the like, the nitride semiconductor light emitting elements 1E (refer to FIG. 26) in units of chips are completed.

As described above, according to the manufacturing method of the nitride semiconductor light emitting element in the sixth embodiment of the present invention, by adding the second metal layer height adjusting step (S89) to the manufacturing method of the nitride semiconductor light emitting element in the third embodiment, the nitride semiconductor light emitting element with improved reliability of flip-chip mounting can be manufactured.

This application claims the benefit of and priority to Japan Application No: 2011-098851, filed Apr. 27, 2011 and Japan Application No: 2011-110838, filed May 17, 2011, all of which are incorporated herein by reference.

Brief Description of Reference Numerals 1, 1A, 1B Nitride semiconductor light emitting element
1C, 1C', 1D, 1E Nitride semiconductor light emitting element
2 Substrate
10 Nitride semiconductor light emitting element structure
10a n-side electrode connection surface
10b p-side electrode connection surface
11 n-type nitride semiconductor layer
12 Active layer
13 p-type nitride semiconductor layer
14 Overall electrode
15 Cover electrode
20 Protective layer
21, 21A, 21B n-side electrode
22, 22A, 22B p-side electrode
23, 23A, 23B, 24, 24A, 24B Metal bump
23C, 23D, 23E, 24C, 24D, 24E Metal bump
25 First metal layer
26a, 26b Second metal layer
27 First metal layer
28a, 28b, 28c Second metal layer
29 Third metal layer
30 First resist pattern
30a, 30b Opening
32 Resist pattern
32a, 32b Opening

What is claimed is:

1. A method of manufacturing a flip-chip nitride semiconductor light emitting element, the method comprising:
   a step of providing a nitride semiconductor light emitting element structure having an n-type nitride semiconductor layer and a p-type nitride semiconductor layer, which are laminated on a substrate, wherein an n-side electrode connecting surface of the n-type nitride semiconductor layer and a p-side electrode connecting surface of the p-type nitride semiconductor layer are on the same side of the substrate;
   a protective layer forming step of forming an insulating protective layer on the nitride semiconductor light emitting element structure;
   a first resist pattern forming step of forming a first resist pattern having openings above the n-side electrode connecting surface and the p-side electrode connecting surface;
   a protective layer etching step of etching the protective layer to expose the n-side electrode connecting surface and the p-side electrode connecting surface using the first resist pattern as a mask;

a first metal layer forming step of forming a first metal layer that becomes an n-side electrode and a p-side electrode, the first metal layer being formed as a continuous layer disposed on the n-side electrode connecting surface, the p-side electrode connecting surface and the first resist pattern;

a second resist pattern forming step of forming a second resist pattern having openings above the openings of the first resist pattern, a second metal layer forming step of forming a second metal layer that becomes metal bumps formed on the n-side electrode and the p-side electrode by electrolytic plating using the first metal layer as an electrode for the electrolytic plating; and a resist pattern removing step of, after the second metal layer forming step, removing the first resist pattern, the second resist pattern, and the first metal layer formed on the first resist pattern.

2. The method according to claim 1, further comprising a second metal layer height adjusting step of adjusting a height from the upper surface of the substrate to the upper surface of the second metal layer formed on the n-side electrode so as to be same as a height from the upper surface of the substrate to the upper surface of the second metal layer formed on the p-side electrode after the second metal layer forming step.

3. The method according to claim 1, wherein the steps are performed sequentially in the order recited in claim 1.

4. The method according to claim 1, wherein the protective layer is formed by sputtering.

5. The method according to claim 1, wherein the protective layer is formed of $SiO_2$.

6. The method according to claim 1, wherein the first metal layer is a mono-layered film.

7. The method according to claim 1, wherein the first metal layer is a multi-layered.

8. The method according to claim 1, wherein a thickness of the second resist pattern is larger than thicknesses of the metal bumps.

9. The method according to claim 1, wherein widths of the openings of the second resist pattern are smaller than widths of the openings of the first resist pattern.

10. The method according to claim 1, wherein widths of the openings of the second resist patter are equal to or larger than widths of the openings of the first resist pattern.

11. The method according to claim 1, wherein no metal layer is interposed between the n-side electrode and the metal bump formed thereon, and no metal layer is interposed between the p-side electrode and the metal bump formed thereon.

12. The method according to claim 1, wherein the first resist pattern and the second resist pattern are removed sequentially.

13. The method according to claim 1, wherein the first resist pattern and the second resist pattern are removed simultaneously.

14. A method of manufacturing a flip-chip nitride semiconductor light emitting element, the method comprising:

a step of providing a nitride semiconductor light emitting element structure having an n-type nitride semiconductor layer and a p-type nitride semiconductor layer, which are laminated on a substrate, wherein an n-side electrode connecting surface of the n-type nitride semiconductor layer and up-side electrode connecting surface of the p-type nitride semiconductor layer are on the same side of the substrate;

a protective layer forming step of forming an insulating protective layer on the nitride semiconductor light emitting element structure;

a resist pattern forming step of forming a resist pattern having openings above the n-side electrode connecting surface and the p-side electrode connecting surface;

a protective layer etching step of etching the protective layer to expose the n-side electrode connecting surface and the p-side electrode connecting surface using the resist pattern as a mask;

a first metal layer forming step of forming a first metal layer that becomes n-side electrode and up-side electrode, the first metal layer being formed as a continuous layer disposed on the n-side electrode connecting surface, the p-side electrode connecting surface and the resist pattern;

a second metal layer forming step of forming a second metal layer that becomes metal bumps by electrolytic plating using the first metal layer as an electrode for the electrolytic plating; and a resist pattern removing step of, after the second metal layer forming step, removing the resist pattern and the first metal layer formed on the resist pattern.

15. The method according to claim 14, further comprising a second metal layer height adjusting step of adjusting a height from the upper surface of the substrate to the upper surface of the second metal layer formed on the n-side electrode so as to be same as a height from the upper surface of the substrate to the upper surface of the second metal layer formed on the p-side electrode after the second metal layer forming step.

16. The method according to claim 14, wherein the steps are performed sequentially in the order recited in claim 14.

17. The method according to claim 14, wherein the protective layer is formed by sputtering.

18. The method according to claim 14, wherein the protective layer is formed of $SiO_2$.

19. The method according to claim 14, wherein the first metal layer is a mono-layered.

20. The method according to claim 14, wherein the first metal layer is a multi-layered.

21. The method according to claim 14, wherein a thickness of the second resist pattern is larger than thicknesses of the metal bumps.

22. The method according to claim 14, wherein no metal layer is interposed between the n-side electrode and the metal bump formed thereon, and no metal layer is interposed between the p-side electrode and the metal bump formed thereon.

23. The method according to claim 14, wherein the resist pattern removing step is performed such that side surfaces of the metal bumps are coated with the first metal layer that was formed on side surfaces of the resist pattern during the first metal layer forming step.

24. A method of manufacturing a flip-chip nitride semiconductor light emitting element, the method comprising:

a step of providing a nitride semiconductor light emitting element structure having an n-type nitride semiconductor layer and a p-type nitride semiconductor layer, which are laminated on a substrate, wherein an n-side electrode connecting surface of the n-type nitride semiconductor layer and a p-side electrode connecting surface of the p-type nitride semiconductor layer are on the same side of the substrate;

a protective layer forming step of forming an insulating protective layer on the nitride semiconductor light emitting element structure;

a first resist pattern forming step of forming a first resist pattern having openings above the n-side electrode connecting surface and the p-side electrode connecting surface;

a protective layer etching step of etching the protective layer to expose the n-side electrode connecting surface and the p-side electrode connecting surface using the first resist pattern as a mask;

a first metal layer forming step of forming a first metal layer that becomes an n-side electrode and a p-side electrode, the first metal layer being formed as a continuous layer disposed on the n-side electrode connecting surface, the p-side electrode connecting surface and the first resist pattern;

a second resist pattern forming step of forming a second resist pattern having openings above the openings of the first resist pattern;

a second metal layer forming step of forming a second metal layer that becomes metal bumps formed on the n-side electrode and the p-side electrode by electrolytic plating using the first metal layer as an electrode for the electrolytic plating; and a resist pattern removing step of removing the first resist pattern and the second resist pattern, wherein the steps are performed sequentially in the order recited.

25. The method according to claim 24, wherein no metal layer is interposed between the n-side electrode and the metal bump formed thereon, and no metal layer is interposed between the p-side electrode and the metal bump formed thereon.

26. A method of manufacturing a flip-chip nitride semiconductor light emitting element, the method comprising:

a step of providing a nitride semiconductor light emitting element structure having an n-type nitride semiconductor layer and a p-type nitride semiconductor layer, which are laminated on a substrate, wherein an n-side electrode connecting surface of the n-type nitride semiconductor layer and a p-side electrode connecting surface of the p-type nitride semiconductor layer are on the same side of the substrate;

a protective layer forming step of forming an insulating protective layer on the nitride semiconductor light emitting element structure;

a resist pattern forming step of forming a first resist pattern having openings above the n-side electrode connecting surface and the p-side electrode connecting surface;

a protective layer etching step of etching the protective layer to expose the n-side electrode connecting surface and the p-side electrode connecting surface using the first resist pattern as a mask;

a first metal layer forming step of forming a first metal layer that becomes an n-side electrode and a p-side electrode, the first metal layer being formed as a continuous layer disposed on the n-side electrode connecting surface, the p-side electrode connecting surface and the resist pattern;

a second metal layer forming step of forming a second metal layer that becomes metal bumps by electrolytic plating using the first metal layer as an electrode for the electrolytic plating; and a resist pattern removing step of removing the resist pattern, wherein the steps are performed sequentially in the order recited.

27. The method according to claim 26, wherein no metal layer is interposed between the n-side electrode and the metal bump formed thereon, and no metal layer is interposed between the p-side electrode and the metal bump formed thereon.

* * * * *